United States Patent [19]
Sakurai et al.

[11] Patent Number: 5,490,119
[45] Date of Patent: Feb. 6, 1996

[54] SEMICONDUCTOR DEVICE INCLUDING SIGNAL GENERATING CIRCUIT WITH LEVEL CONVERTING FUNCTION AND WITH REDUCED AREA OF OCCUPATION

[75] Inventors: Mikio Sakurai; Kenji Tokami; Kazuhiro Sakemi; Yutaka Ikeda; Yoshinori Inoue; Takeshi Kajimoto, all of Hyogo, Japan

[73] Assignees: Mitsubishi Denki Kabushiki Kaisha; Mitsubishi Electric Engineering Co., Ltd., both of Tokyo, Japan

[21] Appl. No.: 229,274

[22] Filed: Apr. 18, 1994

[30] Foreign Application Priority Data

Apr. 19, 1993 [JP] Japan ..................... 5-091419
Mar. 30, 1994 [JP] Japan ..................... 6-060820

[51] Int. Cl.$^6$ ..................................... G11C 8/00
[52] U.S. Cl. ..................... 365/230.08; 365/189.11; 365/230.06; 326/106; 326/108; 326/121
[58] Field of Search ............. 365/189.09, 189.11, 365/230.06, 230.08; 307/449, 451; 326/106, 108, 112, 121, 81

[56] References Cited

U.S. PATENT DOCUMENTS

| | | | |
|---|---|---|---|
| 4,506,164 | 3/1985 | Higuchi | 326/81 |
| 4,782,247 | 11/1988 | Yoshida | 326/81 |
| 4,926,070 | 5/1990 | Tanaka | 307/451 X |
| 4,958,091 | 9/1990 | Roberts | 326/81 |
| 5,039,882 | 8/1991 | Arakawa | 307/449 |
| 5,051,959 | 9/1991 | Nakano | 365/230.06 |
| 5,136,541 | 8/1992 | Arakawa | 365/230.06 X |
| 5,214,606 | 5/1993 | Hashimoto | 365/230.06 X |
| 5,289,417 | 2/1994 | Ooshi | 365/230.06 |
| 5,351,217 | 9/1994 | Jeon | 365/230.06 |

*Primary Examiner*—David C. Nelms
*Assistant Examiner*—Son Mai
*Attorney, Agent, or Firm*—Lowe, Price, LeBlanc & Becker

[57] ABSTRACT

A semiconductor memory device includes a pull up circuit (811) for pulling up a potential of a first node (812), a pull down circuit (813) for pulling down the potential of the first node, an inverter circuit (814b) having its input connected to a first input node (814a) connected to the first node (812) and its output connected to a first output node (814c) and operating with a boosted potential Vpp, and a p channel MOS transistor (814d) connected between a boosted potential node (50c) and the first input node (814a), with its gate electrode connected to the first output node (814c). The memory device provides a signal having a higher level than the supply potential with smaller area of layout.

20 Claims, 38 Drawing Sheets

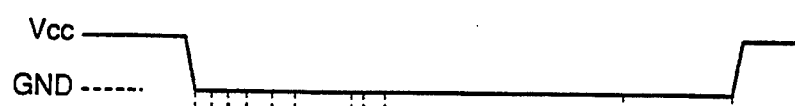
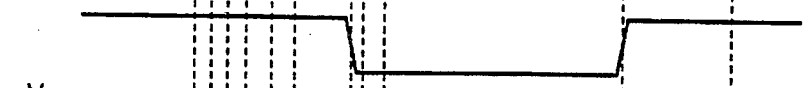
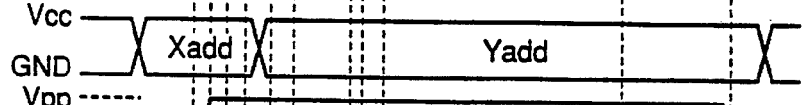
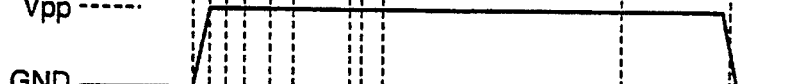
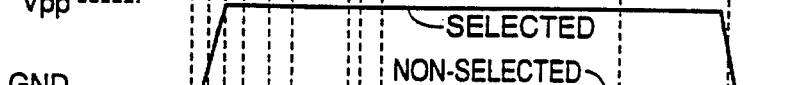
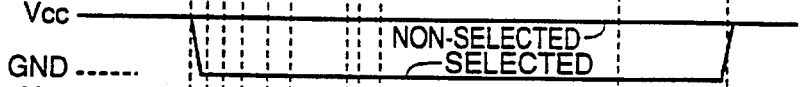
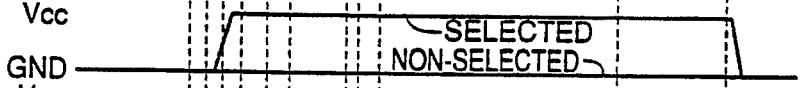
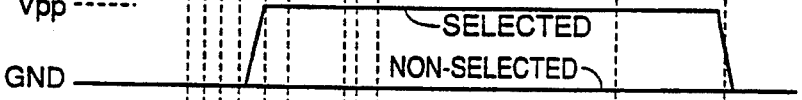
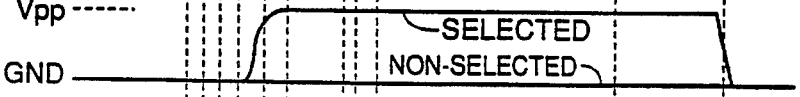
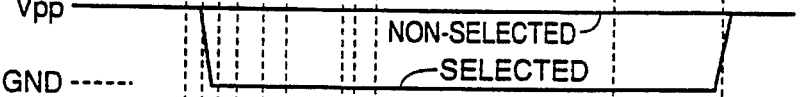
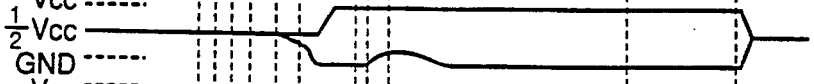
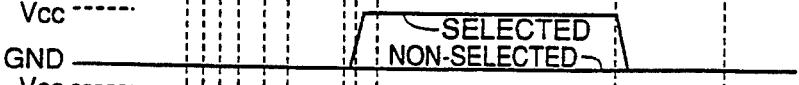
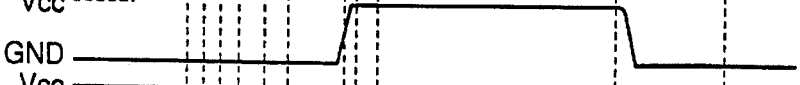
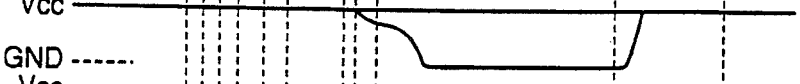
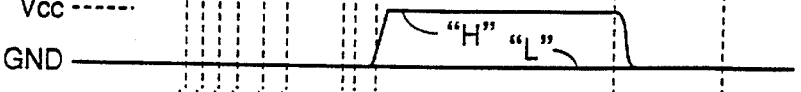

SEMICONDUCTOR DEVICE INCLUDING SIGNAL GENERATING CIRCUIT WITH LEVEL CONVERTING FUNCTION AND WITH REDUCED AREA OF OCCUPATION

BACKGROUND OF THE INVENTION

1. Field of the Invention

The present invention relates to a semiconductor device and, more particularly, to a selecting circuit for selecting a memory cell based on an address signal in a semiconductor memory device.

2. Description of the Background Art

When a memory cell is selected in a semiconductor memory device, for example in a DRAM (Dynamic Random Access Memory), a word line designated by an external address signal is set to a potential higher than the supply potential Vcc. This is because a potential lower than the supply potential Vcc by the threshold voltage Vth is transmitted to a source electrode connected to a memory cell capacitor, if the potentials of a drain electrode connected to a bit line and of a gate electrode connected to the word line of an n channel MOS transistor included in the memory cell are both at the supply potential Vcc. When the supply potential Vcc at the drain electrode is to be transmitted to the source electrode, the potential at the gate electrode must be boosted at least to Vcc+Vth. Recently, a method has been employed in which a boosted potential Vpp higher than the supply potential Vcc is generated by a charge pump or the like based on the supply potential Vcc, the generated boosted voltage is stored in a capacitor and the capacitor is used as a power supply for such a circuit for boosting the word line, as a word line drive signal generating circuit providing a word line drive signal.

FIG. 33 is a block diagram showing a conventional DRAM (Dynamic Random Access Memory). Referring to FIG. 33, row selecting circuitry of the DRAM includes an RAS buffer 1, a row address buffer 2, and a predecoder 3 receiving an output from the row address buffer 2. RAS buffer 1 receives an external row address strobe signal ext/RAS and provides a row address strobe signal /RAS having the same logic as the external row address strobe signal ext/RAS. Row address buffer 2 receives the row address strobe signal /RAS from RAS buffer 1 and external address signals $A_0$ to $A_5$, latches the address signals $A_0$ to $A_5$ as a row address when the row address strobe signal /RAS is activated (when it attains to L level), and provides row address signals $RA_0$, /$RA_0$ to $RA_5$, /$RA_5$ having the same and complementary logics as to the address signals $A_0$ to $A_5$.

Predecoder 3 includes partial decoders 4, 5 and 6 each receiving 2 bits (complementarily 4 bits) of address signals from row address buffer 2. Partial decoder 4 receives row address signals $RA_0$, /$RA_0$, $RA_1$, /$RA_1$ from row address buffer 2 and the row address strobe signal /RAS from RAS buffer 1, and provides row predecode signals $X_0$, $X_1$, $X_2$ and $X_3$ one of which attains to H level at the supply potential Vcc while the remaining three attain to the L level based on the logics of the row address signals $RA_0$, /$RA_0$ and $RA_1$, /$RA_1$ when the row address strobe signal /RAS is at the L level, and all of which attain to the L level when the row address strobe signal /RAS is at the H level. Partial decoder 5 receives row address signals $RA_2$, /$RA_2$ and $RA_3$, /$RA_3$ from row address buffer 2 and provides row predecode signals $X_4$, $X_5$, $X_6$ and $X_7$, one of which attains to the H level at the supply potential Vcc while the remaining three attain to L level, based on the logics of row address signals $RA_2$, /$RA_2$ and $RA_3$, /$RA_3$. Partial decoder 6 receives row address signals $RA_4$, /$RA_4$ and $RA_5$, /$RA_5$ from the row address buffer 2 and provides row predecode signals $X_8$, $X_9$, $X_{10}$ and $X_{11}$, one of which attains to the H level at the supply potential Vcc while the remaining three attain to the L level based on the logics of the row address signals $RA_4$, /$RA_4$ and $RA_5$, /$RA_5$.

The row selecting circuitry further includes a boosted potential generating circuit 7 generating a prescribed high potential, and a row decoder group 9 receiving the boosted potential from the boosted potential generating circuit 7 and an output from predecoder 3.

Boosted potential generating circuit 7 operates, receiving the supply potential Vcc of, for example, 3 V, and provides a boosted potential Vpp of, for example, 5 V, which is higher than the supply potential Vcc by about twice the threshold voltage Vth of the n channel MOS transistor used in the memory cell, to a boosted potential node 8. Row decoder group 9 includes 64 row decoders 10. Each row decoder 10 operates receiving the boosted potential Vpp from boosted potential generating circuit 7, receives one of the predecode signals $X_0$, $X_1$, $X_2$ and $X_3$ from partial decoder 4, one of $X_4$, $X_5$, $X_6$ and $X_7$, and one of $X_8$, $X_9$, $X_{10}$ and $X_{11}$, that is, a total of three row predecode signals and provides a row decode signal RD and a row decode signal /RD which attain to the boosted potential Vpp and the ground potential, respectively, when all these three signals attain to the H level at the supply potential Vcc.

Word line drive signal generating circuit 11 operates receiving the boosted potential Vpp from boosted potential generating circuit 7, receives the row address strobe signal /RAS having the swing of the supply potential Vcc from RAS buffer 1, and provides a word line drive signal RX which attains from the ground potential to the boosted potential Vpp after a prescribed time from the change of the row address strobe signal /RAS from the H level to the L level.

Word driver group 12 includes 64 word drivers 13 provided corresponding to respective word lines in memory cell array 32. Word driver 13 receives row decode signals RD and /RD from row decoder 10 and word line drive signal RX from word line drive signal generating circuit 11. When row decode signal RD attains to the H level at the boosted potential Vpp, /RD attains to the L level and word line drive signal RX attains to the boosted potential Vpp, it raises the potential WL of the corresponding word line 14 to the boosted potential Vpp.

The column selecting circuitry of the DRAM includes a CAS buffer 15, a column address buffer 16 and a column predecoder 17 receiving an output from column address buffer 16. CAS buffer 15 receives an external column address strobe signal ext/CAS and provides a column address strobe signal /CAS having the same logic as the column address strobe signal ext /CAS. Column address buffer 16 receives column address strobe signal /CAS from CAS buffer 15 and external address signals $A_0$ to $A_5$, latches the address signals $A_0$ to $A_5$ as a column address when the column address strobe signal /CAS is activated (when it attains to the L level), and provides column address signals $CA_0$, /$CA_0$ to $CA_5$, /$CA_5$ having the same and complementary logics as to the address signals $A_0$ to $A_5$.

Column predecoder 17 includes three partial decoders 18, 19 and 20.

Partial decoder 18 receives column address signals $CA_0$, /$CA_0$ and $CA_1$, /$CA_1$ from column address buffer 16 and provides column predecode signals $Y_0$, $Y_1$, $Y_2$ and $Y_3$, one of which attains to the H level at the supply potential Vcc and remaining three of which attain to the L level based on the logics of the column address signals $CA_0$, $/CA_0$ and $CA_1$, $/CA_1$. Partial decoder 19 receives column address signals $CA_2$, $/CA_2$, and $CA_3$, $/CA_3$ from column address buffer 16 and provides column predecode signals $Y_4$, $Y_5$, $Y_6$ and $Y_7$, one of which attains to the H level of the supply potential Vcc and remaining three of which attain to the L level based on the logics of the column address signals $CA_2$, $/CA_2$ and $CA_3$, $/CA_3$.

Partial decoder 20 receives column address signals $CA_4$, $/CA_4$ and $CA_5$, $/CA_5$ from column address buffer 16 and provides column predecode signals $Y_8$, $Y_9$, $Y_{10}$ and $Y_{11}$, one of which attains to the H level at the supply potential Vcc and remaining three of which attain to the L level based on the logics of the column address signals $CA_4$, $/CA_4$ and $CA_5$, $/CA_5$.

Column selecting circuitry further includes a column decoder group 21 receiving an output from column predecoder 17 and 64 I/O gate circuits 30 receiving an output from column decoder group 21. Column decoder group 21 includes 64 column decoders 22 each receiving one of the column predecode signals $Y_0$, $Y_1$, $Y_2$ and $Y_3$ from column predecoder 17, one of $Y_4$, $Y_5$, $Y_6$ and $Y_7$, and one of $Y_8$, $Y_9$, $Y_{10}$ and $Y_{11}$, that is, a total of three column predecode signals, and provides a column selecting signal CSL which attains to the supply potential Vcc when all received three predecode signals attain to the H level at the supply potential Vcc.

I/O gate circuit 30 includes n channel MOS transistors 24 and 25, receives a column selecting signal CSL from column decoder group 21. When the column selecting signal CSL is at H level, it connects bit line 26 to I/O line 27 and bit line 28 to I/O line 29. I/O gate circuit 30 is included in an I/O control circuit 23, which I/O control circuit 23 includes a sense amplifier 31 connected between bit lines 26 and 28 in memory cell array 32 for detecting and amplifying the potential difference between the potential BL of bit line 26 and potential /BL of bit line 28. In memory cell array 32, memory cells 33 provided at crossings between word line 14 and bit lines 26 and 28 are arranged in a matrix.

FIG. 34 is a specific circuit diagram of row decoder 10 and word driver 13 of FIG. 33. Row decoder 10 includes a p channel MOS transistor 10a connected between a supply potential node 34 to which supply potential Vcc is applied and a first node 10b, and receiving one row predecode signal $X_A$ of row predecode signals $X_0$, $X_1$, $X_2$ and $X_3$ from partial decoder 4 at its gate electrode; an n channel MOS transistor 10c having its drain electrode connected to the first node 10b and receiving at its gate electrode the row predecode signal $X_A$; an n channel MOS transistor 10d having its drain electrode connected to the source electrode of n channel MOS transistor 10c and receiving at its gate electrode one row predecode signal $X_B$ out of row predecode signals $X_4$, $X_5$, $X_6$ and $X_7$ from partial decoder 5; and an n channel MOS transistor 10e connected between the source electrode of n channel MOS transistor 10d and a ground potential node 35 to which the ground potential is applied, and receiving at its gate electrode one row predecode signal $X_C$ of row predecode signals $X_8$, $X_9$, $X_{10}$ and $X_{11}$ from partial decoder 6. Combinations of row predecode signals $X_A$, $X_B$ and $X_C$ differ from row decoder to row decoder, and there are 64 different combinations of predecode signals.

Row decoder 10 further includes a p channel MOS transistor 10f connected between supply potential node 34 and first node 10b, and an inverter 10g receiving a signal from the first node 10b and provides an inverted signal thereof. Inverter 10g includes a p channel MOS transistor 10ga having its source electrode connected to supply potential node 34 and its gate electrode connected to the first node 10b, and an n channel MOS transistor 10gb connected between the drain electrode of p channel MOS transistor 10ga and ground potential node 35 and having its gate electrode connected to the first node 10b.

Row decoder 10 further includes a level converting circuit 10h for converting the signal level of H level. The level converting circuit 10h operates receiving the boosted potential Vpp from boosted potential node 8, receives a signal having the amplitude of supply potential Vcc from the first node 10b and from inverter 10g, and provides a row decode signal RD of the amplitude of the boosted potential Vpp. Level converting circuit 10h includes a p channel MOS transistor 10hc connected between boosted potential node 8 and output node 10ha and having its gate electrode connected to a complementary output node 10hb; a p channel MOS transistor 10hd connected between boosted potential node 8 and complementary output node 10hb and its gate electrode connected to output node 10ha; an n channel MOS transistor 10he connected between output node 10ha and ground potential node 35 and having its gate electrode connected to the first node 10b; and an n channel MOS transistor 10hf connected between complementary output node 10hb and ground potential node 35 and receiving at its gate electrode a signal from inverter 10g.

Word driver 13 includes an n channel MOS transistor 13a connected between word line drive signal generating circuit 11 (signal RX) and word line 14; an n channel MOS transistor 13b connected between word line 14 and ground potential node 35 and having its gate electrode connected to the first node 10b of row decoder 10; and an n channel MOS transistor 13c connected between output node 10ha of row decoder 10 and the gate electrode of n channel MOS transistor 13a and having its gate electrode connected to boosted potential node 8.

The operation for selecting a memory cell of the DRAM having the above structure will be described with reference to the timing chart of FIG. 35. First, as shown in FIG. 35 (c), address signals $A_0$ to $A_5$ are externally applied, and when external row address strobe signal ext/RAS falls from the supply potential Vcc to the ground potential at time $t_0$ as shown in FIG. 35(a), RAS buffer 1 receives external row address strobe signal ext/RAS and provides a row address strobe signal /RAS which falls from the supply potential Vcc to the ground potential in synchronization with the row address strobe signal ext/RAS. Row address buffer 2 receiving the row address strobe signal /RAS latches the address signals $A_0$ to $A_5$ as a row address and provides row address signals $RA_0$ to $RA_5$ and row address signals $/RA_0$ to $/RA_5$ having the same and complementary logics as to address signals $A_0$ to $A_5$ and having the amplitude of supply potential Vcc.

Partial decoder 4 in row predecoder 3 receives row address signals $RA_0$, $/RA_0$, $RA_1$, and $/RA_1$ from row address buffer 2 and provides row predecode signals $X_0$, $X_1$, $X_2$ and $X_3$ of the amplitude of the supply potential Vcc. Based on the logics of row address signals $RA_0$, $/RA_0$, $RA_1$ and $/RA_1$, one of the four row predecode signals $X_0$, $X_1$, $X_2$ and $X_3$ is set to the H level and the remaining three are set to the L level. Partial decoders 5 and 6 receive row address signals $RA_2$, $/RA_2$, $RA_3$, $/RA_3$ and $RA_4$, $/RA_4$, $RA_5$, $/RA_5$ from row address buffer 2 in the similar manner, and provide row predecode signals $X_4$, $X_5$, $X_6$, $X_7$ and $X_8$, $X_9$, $X_{10}$ based on the logics of these signals, respectively.

64 row decoders 10 in row decoder group 9 each receives one signal $X_A$ of row predecode signals $X_0$, $X_1$, $X_2$ and $X_3$ from partial decoder 4, one signal $X_B$ of row predecode signals $X_4$, $X_5$, $X_6$ and $X_7$ from partial decoder 5 and one signal $X_C$ of row predecode signals $X_8$, $X_9$, $X_{10}$ and $X_{11}$ from partial decoder 6. Only one of 64 row decoders 10 receives row predecode signals $X_A$, $X_B$ and $X_C$ which are all at the H level, and remaining 63 row decoders 10 receive row predecode signals $X_A$, $X_B$ and $X_C$, at least one of which is at the L level.

In row decoder 10 receiving row predecode signals $X_A$, $X_B$ and $X_C$ all at the H level, p channel MOS transistor 10*a* receiving at its gate electrode the row predecode signal $X_A$ is rendered non-conductive, and n channel MOS transistor 10*c* is rendered conductive. Similarly, n channel MOS transistor 10*d* receiving at its gate electrode the row predecode signal $X_B$ is rendered conductive, and n channel MOS transistor 10*e* receiving at its gate electrode the row predecode signal $X_C$ is rendered conductive. Accordingly, the first node 10*b* is coupled to ground potential node 35, and the potential /RD of the first node 10*b* attains to the ground potential. As a result, n channel MOS transistor 10*he* in signal level converting circuit 10*h* receiving the potential /RD at the gate electrode and n channel MOS transistor 13*b* in word driver 13 are rendered non-conductive.

Inverter 10*g* receives the potential /RD of the first node 10*b* which is at the ground potential, and provides a signal at the supply potential Vcc. In signal level converting circuit 10*h*, n channel MOS transistor 10*hf* receiving at its gate electrode the output of inverter 10*g* is rendered conductive, complementary output node 10*hb* and ground potential node 35 are coupled, and the potential of complementary output node 10*hb* attains to the ground potential. The p channel MOS transistor 10*hc* receiving at its gate electrode the potential of complementary output node 10*hb* is rendered conductive, and thus boosted potential node 8 is coupled to output node 10*ha*. The potential RD of output node 10*ha* attains to the boosted potential Vpp at time $t_1$ as shown in FIG. 35(*b*), and p channel MOS transistor 10*hd* receiving at its gate the potential RD is rendered non-conductive.

The potential at the gate electrode of n channel MOS transistor 13*a* in word driver 13 rises as it receives the row decode signal RD at the boosted potential Vpp from output node 10*ha*, and when the potential at the gate electrode attains to a potential lower than the boosted potential Vpp by the threshold potential Vth of n channel MOS transistor 13*c*, the n channel MOS transistor 13*c* is rendered non-conductive, since the voltage between the gate and the source becomes lower than the threshold voltage Vth. Word line drive signal generating circuit 11 receives the row address strobe signal /RAS which has been fallen to the L level at time $t_0$ from RAS buffer 1 and provides a word line drive signal RX which rises from the ground potential to the boosted potential Vpp at time $t_2$ after a prescribed time period. In word driver 13, n channel MOS transistor 13*a* receives the word line drive signal RX. By capacitive coupling of the gate capacitance, the potential at the gate electrode of n channel MOS transistor 13*a* rises and boosted higher than the boosted potential Vpp by at least the threshold voltage Vth of n channel MOS transistor 13*a*. The word line drive signal RX is transmitted to word line 14, and the potential WL of word line 14 attains to the boosted potential Vpp at time $t_3$ as shown in FIG. 35(*f*).

In row decoder 10 in which at least one of the row predecode signals $X_A$, $X_B$ and $X_C$ is at the L level, before time $t_0$ at which row address strobe signal /RAS falls to the L level, row predecode signal $X_A$ is at the L level, p channel MOS transistor 10*a* is conductive and n channel MOS transistor 10*c* is non-conductive. Therefore, the potential /RD of the first node 10*b* is at the supply potential Vcc level. After that time, since at least one of row predecode signals $X_A$, $X_B$ and $X_C$ is at the L level, one of the n channel MOS transistors 10*c*, 10*d* and 10*e* is at the non-conductive state, and the potential /RD of the first node 10*b* is kept at the supply potential Vcc. The n channel MOS transistor 10*he* receiving at its gate the potential /RD and the n channel MOS transistor 13*b* are rendered conductive, output node 10*ha* is coupled to the ground potential node 35, word line 14 is coupled to the ground potential node 35, and the potential RD of output node 10*ha* and the potential WL of the word line attain to the ground potential.

Inverter 10*g* receives the potential of the first node 10*b* and provides a signal at the ground potential. The n channel MOS transistor 10*hf* receiving at its gate the output signal of inverter 10*g* is rendered non-conductive, while the p channel MOS transistor 10*hb* receiving at its gate the potential RD of the output node 10*ha* at the ground potential is rendered conductive. Boosted potential node 8 is coupled to complementary output node 10*hb*, the potential of the complementary output node 10*hb* attains to the boosted potential Vpp, and p channel MOS transistor 10*hc* receiving this potential at its gate electrode is rendered non-conductive. In word driver 13, n channel MOS transistor 13*a* receives at its gate electrode the row decode signal RD at the ground potential from output node 10*ha*, and is rendered non-conductive. As a result, even when a word line drive signal RX which rises from the ground potential to the boosted potential Vpp at time $t_2$ is input from word line drive signal generating circuit 11, the potential WL at word line 14 is kept at the ground potential.

The data which has been stored is output from memory cell 33 connected to word line 14 which has a potential risen to the boosted potential Vpp to bit line 26 or 28. The potentials BL and /BL of bit lines 26 an 28 are set to the intermediate potential (½) Vcc between the supply potential Vcc and the ground potential in advance at the standby state. Assume that the data which has been stored in memory cell 33 is provided to bit line 26. If the data is at the H level, charges flow from memory cell 33 to bit line 26, and the potential BL of bit line 26 slightly rises from the intermediate potential (½) Vcc. If the data is at the L level, charges flow in from bit line 26 to memory cell 33, and the potential BL of bit line 26 slightly lowers from the intermediate potential (½) Vcc.

Sense amplifier 31 (see FIG. 33) connected between bit lines 26 and 28 amplifies the potential difference between the potential BL of the bit line 26 which has changed slightly from the intermediate potential (½) Vcc and the potential /BL of the bit line 28 which is kept at the intermediate potential (½) Vcc. If the potential difference is negative, the potential BL of the bit line 26 is lowered to the ground potential and the potential /BL of the bit line is raised to the supply potential Vcc. If the potential difference is positive, the potential BL of the bit line 26 is raised to the supply potential Vcc and the potential /BL of bit line 28 is lowered to the ground potential.

When address signals $A_0$ to $A_5$ are externally applied and the external column address strobe signal ext/CAS falls from the H level at the supply potential Vcc to the L level as shown in FIG. 35(*b*) at time $t_4$, CAS buffer 15 receives the external column address strobe signal ext/CAS and provides a column address strobe signal /CAS which falls from the H level at the supply potential Vcc to the L level, in synchronization therewith. In accordance with the column address strobe signal /CAS, column address buffer 16 latches address signals $A_0$ to $A_5$ as a column address, and provides column address signals $CA_0$ to $CA_5$ of the amplitude of the supply potential Vcc (H level or L level) of the same logic as the address signals $A_0$ to $A_5$ and column address signals /$CA_0$ to /$CA_5$ of the complementary logics (L level or H level).

Partial decoder 18 in column predecoder 17 receives column address signals $CA_0$, /$CA_0$, $CA_1$, /$CA_1$ from column address buffer 16 and provides column predecode signals $Y_0$, $Y_1$, $Y_2$ and $Y_3$ of the amplitude of the supply potential Vcc. Based on the logics of column address signals $CA_0$, /$CA_0$, $CA_1$, /$CA_1$, only one of the four column predecode signals $Y_0$, $Y_1$, $Y_2$ and $Y_3$ is set to the H level and the remaining three are set to the L level. Partial decoders 19 and 20 similarly receive column address signals $CA_2$, /$CA_2$, $CA_3$, /$CA_3$ and $CA_4$, /$CA_4$, $CA_5$, /$CA_5$ from column address buffer 16, respectively, and provide column predecode signals $Y_4$, $Y_5$, $Y_6$ and $Y_7$ and $Y_8$, $Y_9$, $Y_{10}$ and $Y_{11}$ based on the logics of these signals, respectively.

Each of 64 column decoders 22 in column decoder group 21 receives one signal $Y_A$ out of column predecode signals $Y_0$, $Y_1$, $Y_2$ and $Y_3$ from partial decoder 18, one signal $Y_B$ out of column predecode signals $Y_4$, $Y_5$, $Y_6$ and $Y_7$ from partial decoder 19 and one signal $Y_C$ out of column predecode signals $Y_8$, $Y_9$, $Y_{10}$ and $Y_{11}$ from partial decoder 20. Only one decoder 22 of 64 column decoders 22 receives three column predecode signals $Y_A$, $Y_B$ and $Y_C$ which are all at the H level. At least one of the column predecode signals $Y_A$, $Y_B$ and $Y_C$ received by the remaining 63 column decoder 22 is at the L level. The column decoder 22 in which three column predecode signals $Y_A$, $Y_B$ and $Y_C$ are all at the H level provides a column selection signal CSL which attains to the H level at the supply potential Vcc at time $t_5$ as shown in FIG. 35(g), and remaining 63 column decoders 22 provide column selecting signal CSL at the L level.

The n channel MOS transistors 24 and 25 in I/O gate circuit 30 receiving the column selecting signal CSL at the H level from the column decoder 22 are rendered conductive, while n channel MOS transistors 24 and 25 in I/O gate circuit 30 receiving the column selecting signal CSL of the L level from column decoder 22 are kept non-conductive. Bit lines 26 and 28 connected to the n channel MOS transistors 24 and 25 which are rendered conductive are coupled to I/O lines 27 and 29, and hence data of memory cell 33 is provided to the I/O line.

In the conventional DRAM described above, the potential WL of word line 14 is raised to a boosted potential Vpp (≈Vcc+2Vth) which is higher than the supply potential Vcc by about twice the threshold voltage Vth of the n channel MOS transistor constituting memory cell 33. Word line drive signal RX from word line drive signal generating circuit 11 is boosted from the ground potential to the boosted potential Vpp, and by utilizing the fact that the potential of the gate electrode of n channel MOS transistor 13a in word driver 13 becomes higher than the boosted potential Vpp by the threshold voltage Vth of n channel MOS transistor 13a due to capacitive coupling, the boosted potential Vpp is transmitted to word line 14 (self boosting operation). In order to quickly boost the potential at the gate electrode of n channel MOS transistor 13a to be higher than Vpp+ Vth so as to quickly raise the potential WL of word line 14 to the boosted potential Vpp, the row decode signal RD at the boosted potential Vpp is input to word driver 13 and the potential at the gate electrode of n channel MOS transistor 13a is set not at the supply potential Vcc but a potential Vpp–Vth (≈Vcc+ Vth) which is higher than the supply potential Vcc and lower than the boosted potential Vpp by the threshold voltage Vth of n channel MOS transistor 13c.

In order to provide a row decode signal RD having the amplitude of the boosted potential Vpp, a signal level converting circuit 10h is necessary for row decoder 10 to convert a signal having the amplitude of supply potential Vcc to a signal having the amplitude of the boosted potential Vpp. However, in the conventional DRAM described above, signal level converting circuit 10h is provided for each row decoder 10, which results in large layout area of the row decoder group 9.

FIG. 36 shows a schematic layout of row decoder 10 and word driver 13 of the conventional of the DRAM. The reference numeral 40 denotes an area in which memory cell array 32 is formed, 41 denotes an area in which word drivers 13 are formed, and 42 and 43 denote areas in which row decoders 10 are formed. More specifically, 42 denotes an area in which a level converting circuit 10h which operates with the boosted potential Vpp is formed, and 43 denotes an area in which other circuits 10a to 10g are formed. As shown in FIG. 36, the area 42 in which level converting circuit 10h is to be formed occupies about one third of the whole area in which circuits (row decoder 10 and word driver 13) for selecting the word line are to be formed. As a result, though the word line can be quickly raised to the boosted potential Vpp, the existence of level converting circuit 10h increased the chip area.

SUMMARY OF THE INVENTION

An object of the present invention is to provide a DRAM having a word line selecting circuit with reduced layout area.

Another object of the present invention is to provide a semiconductor device including a signal generating circuit with small area of occupation.

A specific object of the present invention is to reduce layout area of a row decoder group, by eliminating the signal level converting circuit 10h from row decoder 10.

The semiconductor device in accordance with the present invention includes, as basic components, pull up means connected between a prescribed potential node to which a prescribed potential higher than the supply potential is applied and a first node, receiving a pull up control signal for conducting the prescribed potential to the first node in response to the pull up control signal; pull down means connected between the first node and a ground potential node to which the ground potential is applied, receiving an input signal having a binary level of the supply potential and the ground potential, for coupling the first node to the ground potential node in response to the input signal; and signal generating means operating with first potential higher than the supply potential and having inverter means having its input node connected to a first input node which in turn is connected to a first node and its output node connected to a first output node, and output holding means consisting of a p channel MOS transistor connected between a first potential node to which the first potential is applied and the first input node and having its gate electrode connected to the first output node.

In the present invention, when a path between the prescribed potential node and the first node is rendered non-conductive by the pull up means and the first node and the ground potential node are coupled through the pull down means, the potential of the first node attains to the ground potential. The inverter means in the output holding means receiving the potential of the first node through the first input node provides at the first output node, a signal at the first potential level which is higher than the supply potential, and the p channel MOS transistor receiving at its gate the potential of the first output node is rendered non-conductive. When the prescribed potential node is coupled to the first node through the pull up means and the first node and the ground potential node are coupled by the pull down means, the potential at the first node attains to the H level, and the inverter means in the output holding means receiving the H level signal potential from the first input node provides, at the first output node, a signal at the L level (ground potential). The p channel MOS transistor receiving at its gate the potential of the first output node is rendered non-conductive, and the first input node attains to the first potential which is higher than the supply potential. When a path between the prescribed potential node and the first node, and a path between the first nod and the ground potential node are both disconnected through the pull up means and the pull down means while the signal at the ground potential level is being output from the first output node, the p channel MOS transistor receiving at its gate the output from the first output node is kept conductive while the first input node is kept at the first potential, and the inverter means receives the potential of the first input node and holds the output to the first output node at the ground potential.

In this manner, the signal output to the first output node which corresponds to an input signal having a binary level, that is, one of the supply potential and the ground potential can be converted to a signal having a binary level, that is, one of the first potential and the ground potential, without providing a level converting circuit for converting the signal to a signal having a binary level of one of the ground potential and the first potential which is higher than the supply potential. Therefore, a semiconductor device having signal generating means with small layout area can be obtained.

By applying the signal generating means to a word line selecting signal generating portion, a DRAM including a row decoder group with reduced layout area can be realized.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 13($a$) to 13 ($r$) are timing charts showing the operation of Embodiment 1 of the present invention.

DESCRIPTION OF THE PREFERRED EMBODIMENTS

Embodiment 1

Figure 1A:
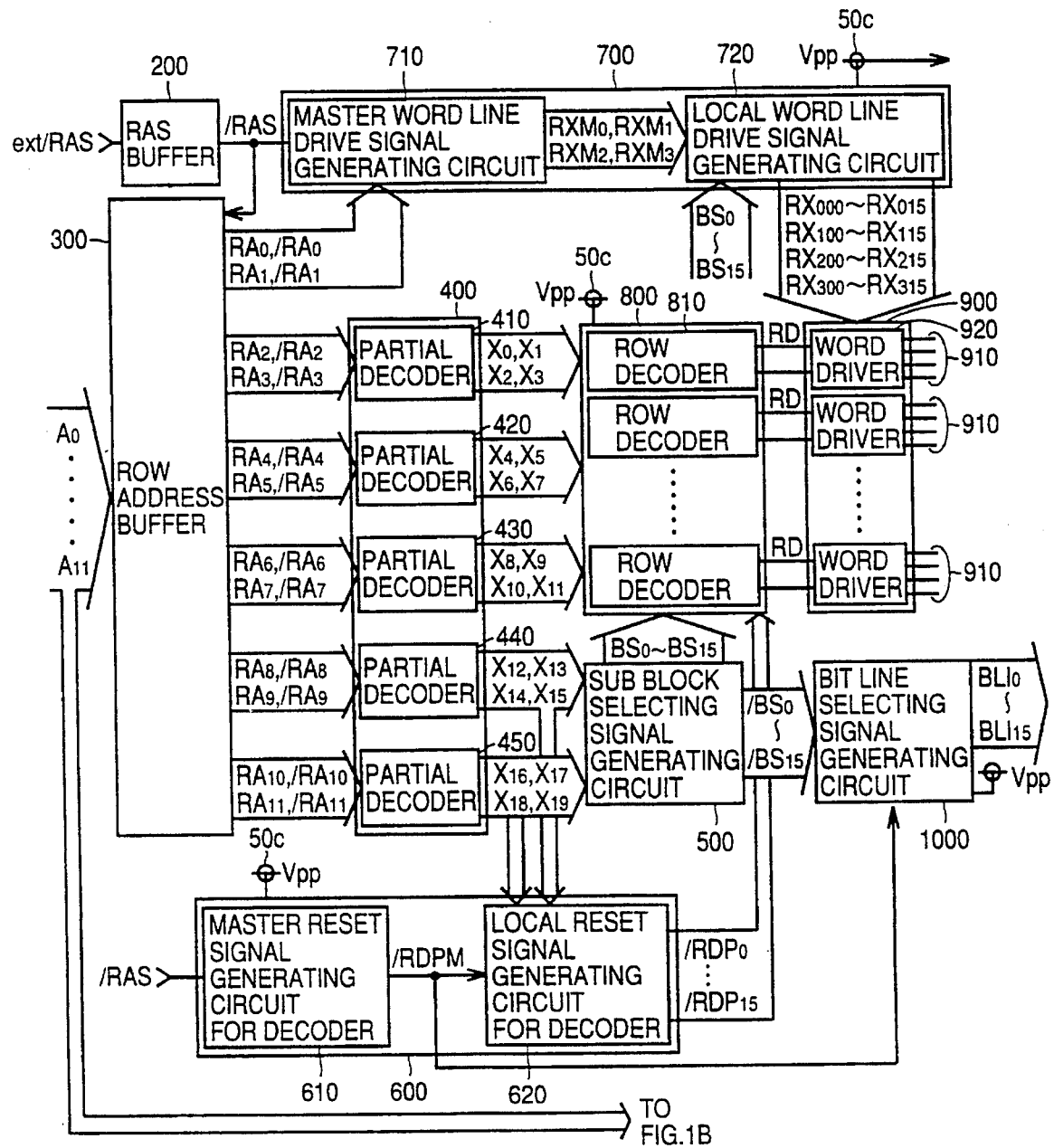
FIGS. 1A and 1B are block diagrams showing Embodiment 1 of the present invention.
Figure 1B:
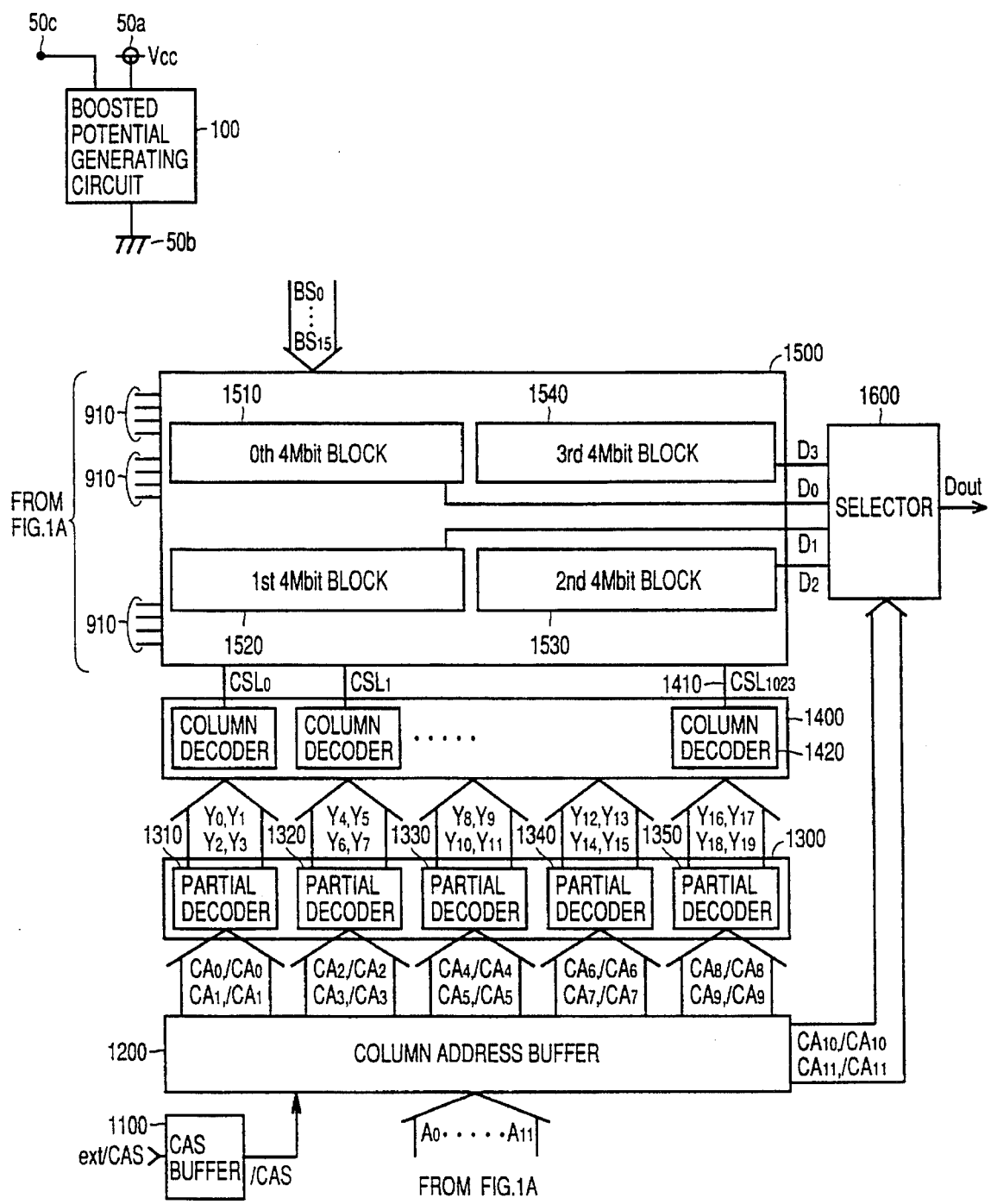

A semiconductor memory device of Embodiment 1 of the present invention will be described with reference to FIGS. 1 to 14. FIGS. 1A and 1B are block diagrams showing a 16 Mbit DRAM. Referring to FIGS. 1A and 1B, a boosted potential generating circuit 100 receives a supply potential Vcc from a supply potential node 50a to which a supply potential Vcc of, for example, 3 V is applied, and provides at a boosted potential node 50c a boosted potential Vpp of about 5 V, which is higher than the supply potential Vcc by about twice the threshold voltage Vth of an n channel MOS transistor used in the memory cell (see FIG. 2).

An RAS buffer 200 receives an external row address strobe signal ext/RAS, and provides a row address strobe signal /RAS having the same logic as the external row address strobe signal ext/RAS and having the (swing) amplitude of the supply potential Vcc. A row address buffer 300 receives a row address strobe signal /RAS from RAS buffer 200 and external address signals $A_0$ to $A_{11}$, latches the address signals $A_0$ to $A_{11}$ as a row address when the row address strobe signal /RAS falls from the H level to the L level, and provides row address signals $RA_0$, /$RA_0$ to $RA_{11}$, /$RA_{11}$ which have the same and complementary logics as for the address signals $A_0$ to $A_{11}$ and having the (swing) amplitude of the supply potential Vcc.

Figure 3:
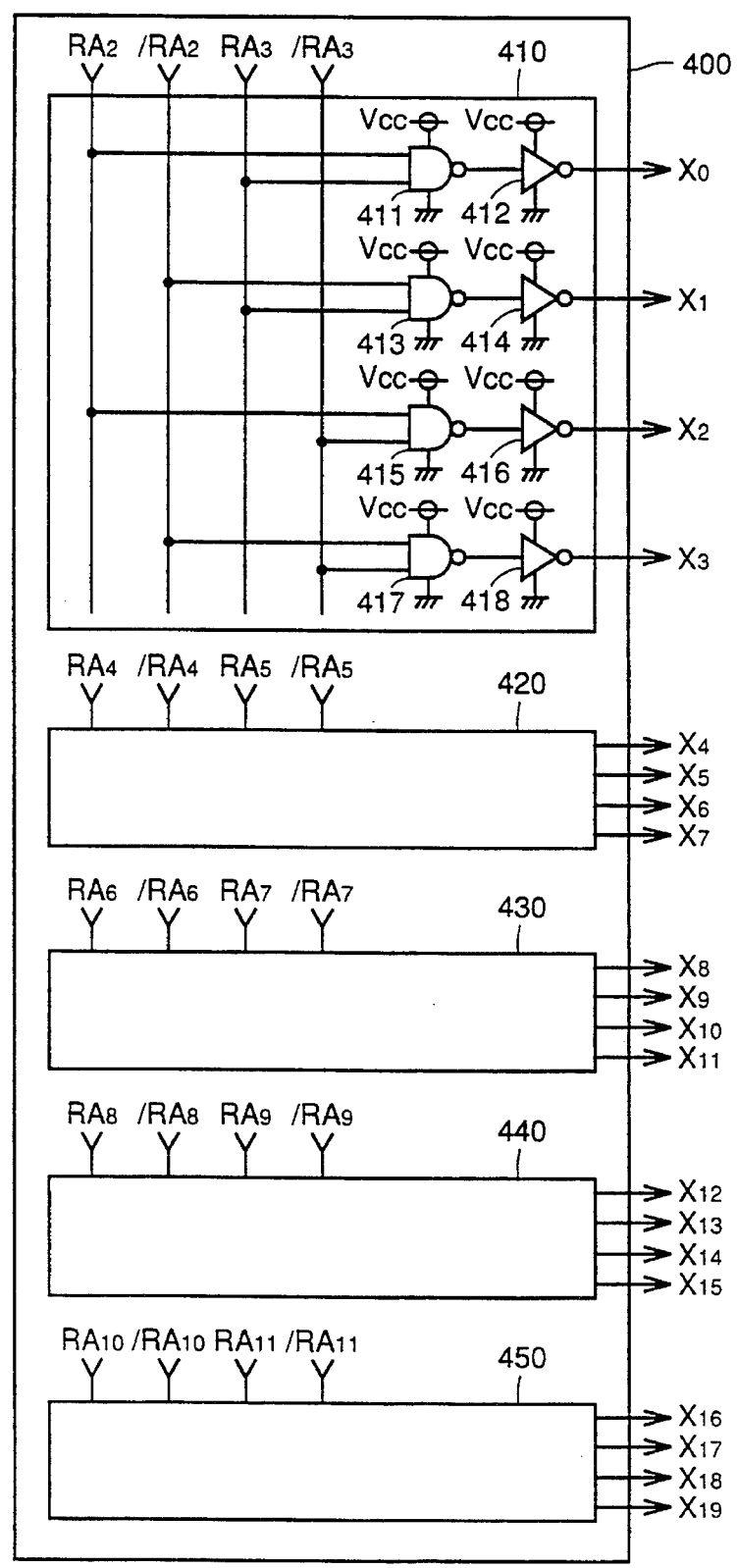
FIG. 3 is a schematic diagram of a row predecoder in Embodiment 1 of the present invention.

A row predecoder 400 includes five partial decoders 410, 420, 430, 440, and 450 (see FIG. 3). Partial decoder 410 receives row address signals $RA_2$, /$RA_2$ and $RA_3$, /$RA_3$ from row address buffer 300 and provides row predecode signals $X_0$, $X_1$, $X_2$ and $X_3$ of the amplitude of the supply potential Vcc, one of which attains to the H level and the remaining three of which attain to the L level based on the logics of the row address signals $RA_2$, /$RA_2$ and $RA_3$, /$RA_3$.

Partial decoder 420 receives row address signals $RA_4$, $RA_4$ and $RA_5$, /$RA_5$ from row address buffer 300 and provides row predecode signals $X_4$, $X_5$, $X_6$ and $X_7$ of the amplitude of the supply potential Vcc, one of which attains to the H level and the remaining three of which attain to the L level based on the logics of the row address signals $RA_4$, /$RA_4$ and $RA_5$, /$RA_5$. Partial decoder 430 receives row address signals $RA_6$, /$RA_6$ and $RA_7$, /$RA_7$ from row address buffer 300 and provides row predecode signals $X_8$, $X_9$, $X_{10}$ and $X_{11}$ of the amplitude of the supply potential Vcc, one of which attains to the H level and the remaining three of which attain to the L level based on the logics of the row address signals $RA_6$, /$RA_6$ and $RA_7$, /$RA_7$.

Partial decoder 440 receives row address signals $RA_8$, /$RA_8$ and $RA_9$, /$RA_9$ from row address buffer 300 and provides row predecode signals $X_{12}$, $X_{13}$, $X_{14}$ and $X_{15}$ of the amplitude of the supply potential Vcc, one of which attains to the H level and the remaining three of which attain to the L level based on the logics of the row address signals $RA_8$, /$RA_8$ and $RA_9$, /$RA_9$. Partial decoder 450 receives row address signals $RA_{10}$, /$RA_{10}$ and $RA_{11}$, /$RA_{11}$ from row address buffer 300, and provides row predecode signals $X_{16}$, $X_{17}$, $X_{18}$ and $X_{19}$ of the amplitude of the supply potential Vcc, one of which attains to the H level and the remaining three of which attain to the L level based on the logics of row address signals $RA_{10}$, /$RA_{10}$ and $RA_{11}$, /$RA_{11}$.

A sub block selecting signal generating circuit 500 receives row predecode signals $X_{12}$, $X_{13}$, $X_{14}$ and $X_{15}$ from partial decoder 440 and row predecode signals $X_{16}$, $X_{17}$, $X_{18}$ and $X_{19}$ from partial decoder 450 and provides 16 sub block selecting signals $BS_0$ to $BS_{15}$ of the amplitude of the supply potential Vcc, one of which attains to the H level and the remaining 15 attain to the L level based on the logics of row predecode signals $X_{12}$ to $X_{19}$, and also provides complementary sub block selecting signals /$BS_0$ to /$BS_{15}$.

Figure 5:
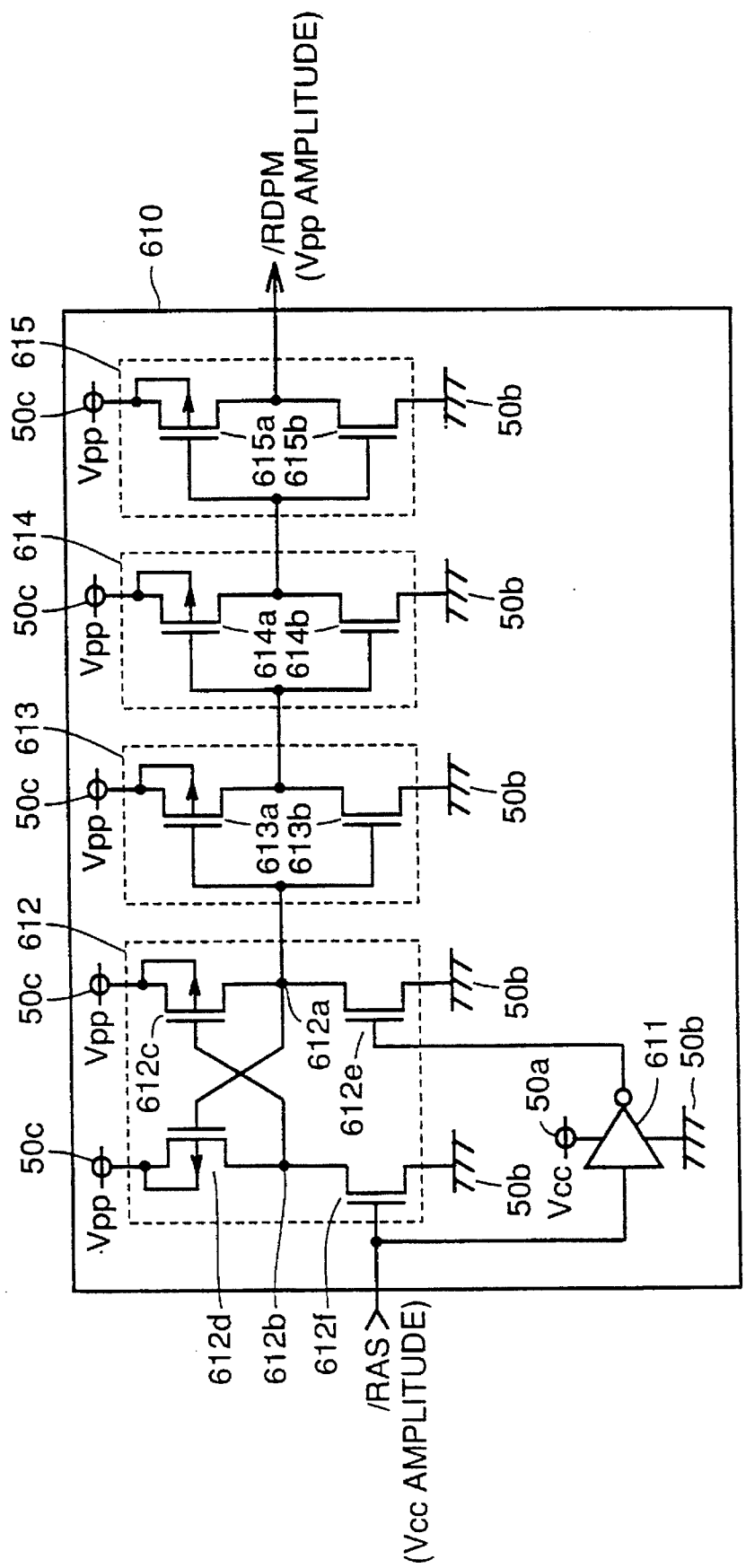
FIG. 5 is a schematic diagram of a master reset signal generating circuit for a decoder in Embodiment 1 of the present invention.
Figure 6:
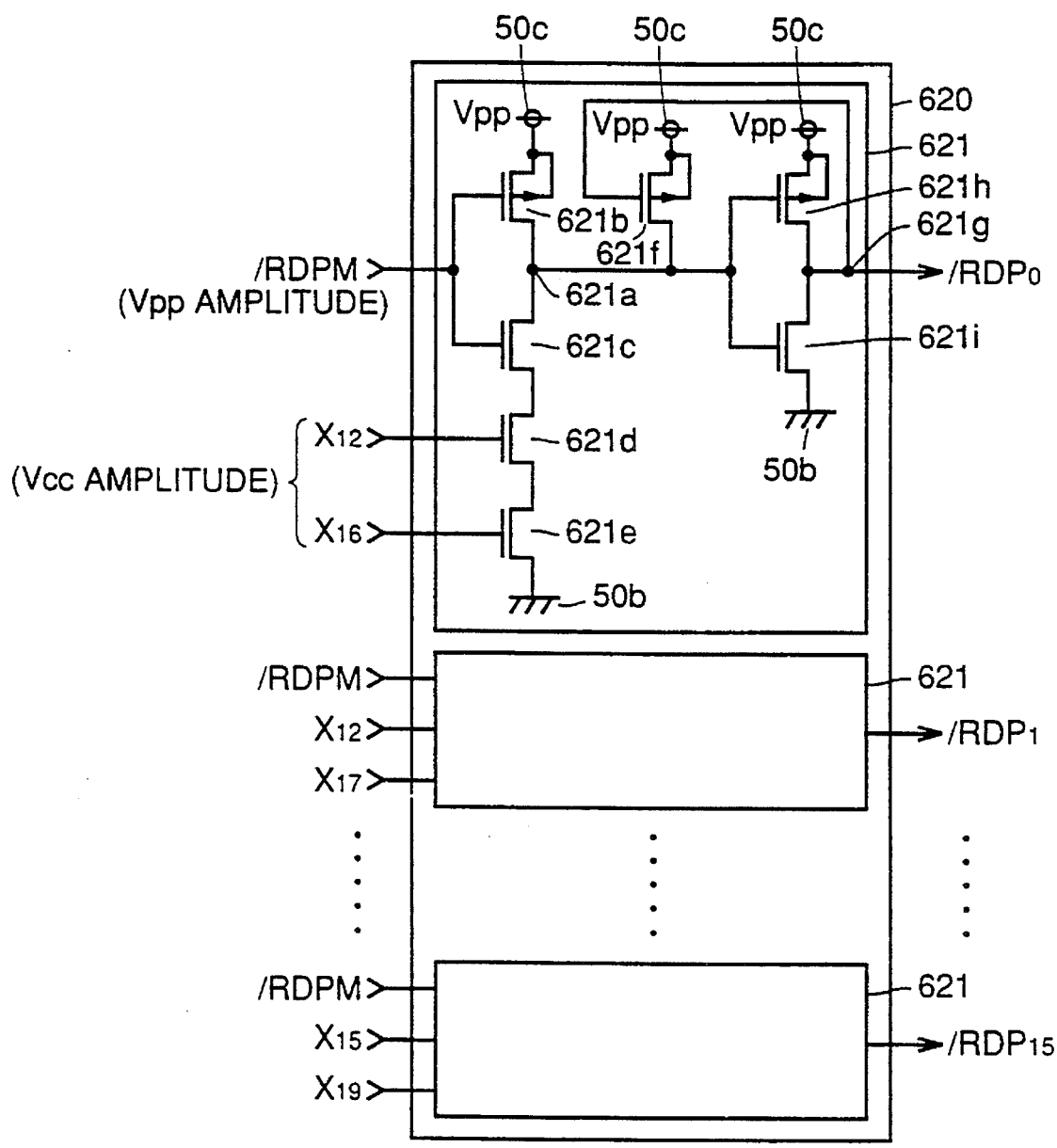
FIG. 6 is a schematic diagram of a local reset signal generating circuit for a decoder in Embodiment 1 of the present invention.

A reset signal generating circuit 600 includes two circuits 610 and 620, the details of which are shown in FIGS. 5 and 6. A master reset signal generating circuit 610 for a decoder operates receiving the boosted potential Vpp from boosted potential node 50c, receives a row address strobe signal /RAS of the amplitude of the supply potential Vcc from RAS buffer 200, and provides a master reset signal /RDPM for the decoder of the amplitude of the boosted potential Vpp, which attains to the ground potential if the row address strobe signal /RAS is at the H level and attains to the boosted potential Vpp when the row address strobe signal is at the L level.

A local reset signal generating circuit 620 for a decoder receives row predecode signals $X_{12}$ to $X_{19}$ from partial decoders 440 and 450 as well as master reset signal /RDPM from master reset signal generating circuit 610, and provides local reset signals /$RDP_0$ to /$RDP_{15}$ for the decoder of the amplitude of the boosted potential Vpp, which signals all attain to the ground potential if the master reset signal /RDPM is at the ground potential, and one of which attains to the boosted potential Vpp and the remaining 15 of which attain to the ground potential when the master reset signal /RDPM is at the boosted potential Vpp.

Figure 7:
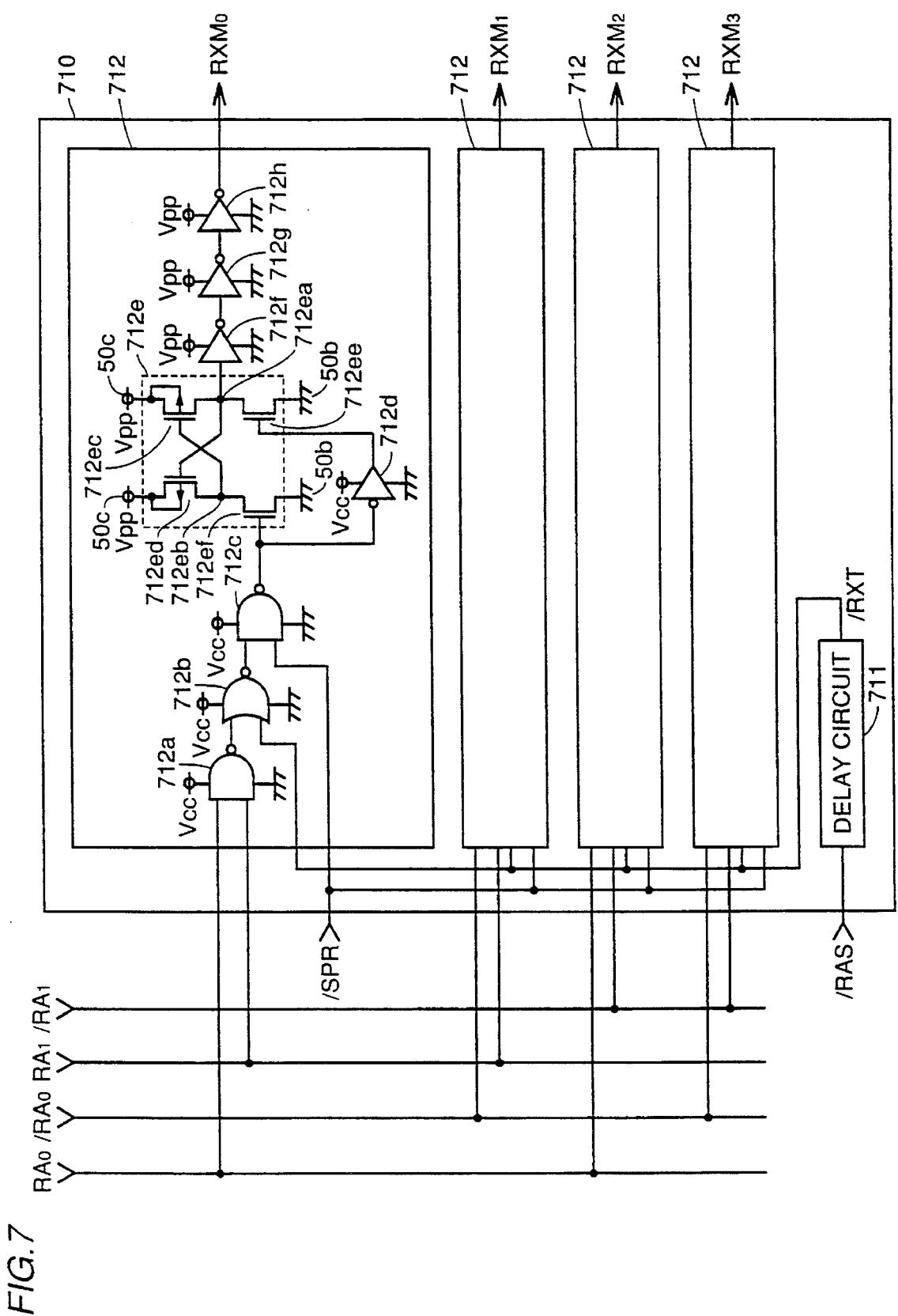
FIG. 7 is a schematic diagram of a master word line drive signal generating circuit in Embodiment 1 of the present invention.
Figure 8:
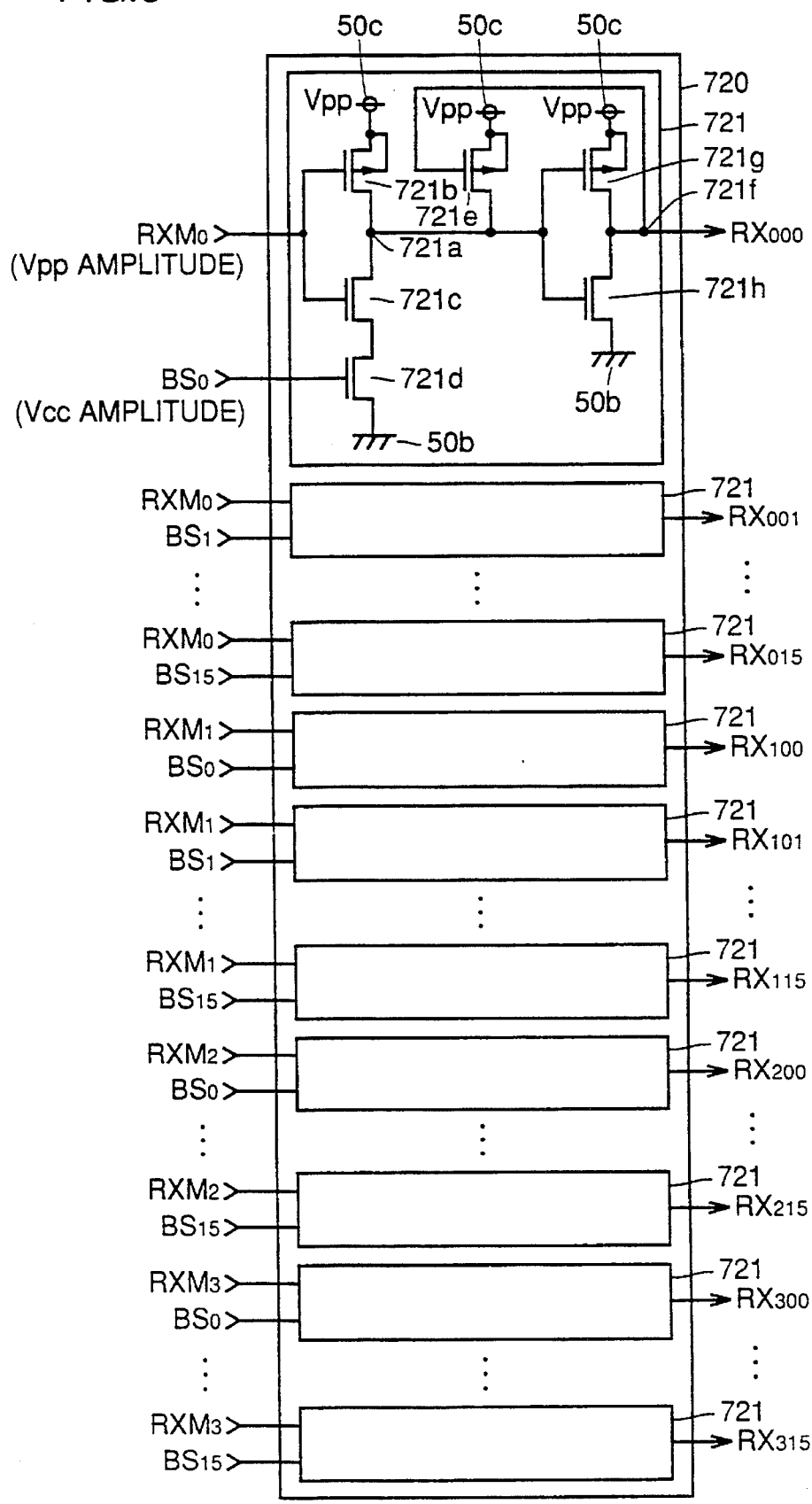
FIG. 8 is a schematic diagram of a local word line drive signal generating circuit in Embodiment 1 of the present invention.

A word line drive signal generating circuit 700 receiving signals /RAS and $RA_0$, /$RA_0$, /$RA_0$, $RA_1$, /$RA_1$ includes two circuits 710 and 720, the details of which are shown in FIGS. 7 and 8, respectively. Master word line drive signal generating circuit 710 operates receiving the boosted potential Vpp from boosted potential node 50c, receives row address strobe signal /RAS of the amplitude of supply potential Vcc from RAS buffer 200 and row address signals $RA_0$, /$RA_0$, $RA_1$, /$RA_1$ of the amplitude of the supply potential Vcc from row address buffer 300, and provides master word line drive signals $RXM_0$, $RXM_1$, $RXM_2$ and $RXM_3$, one of which attains to the boosted potential Vpp and the remaining three attain to the ground potential based on the logics of row address signals $RA_0$, /$RA_0$, $RA_1$, /$RA_1$, after a prescribed period from the fall of the row address strobe signal /RAS from the H level to the L level.

A local word line drive signal generating circuit 720 receives sub block selecting signals $BS_0$ to $BS_{15}$ from sub block selecting signal generating circuit 500 and master word line drive signals $RXM_0$, $RXM_1$, $RXM_2$ and $RXM_3$ from master word line drive signal generating circuit 710, and provides 64 local word line drive signals $RX_{000}$ to $RX_{015}$, $RX_{100}$ to $RX_{115}$, $RX_{200}$ to $RX_{215}$ and $RX_{300}$ to $RX_{315}$ of the amplitude of the boosted potential Vpp in accordance with the block selecting signals $BS_0$ to $BS_{15}$.

Figure 9:
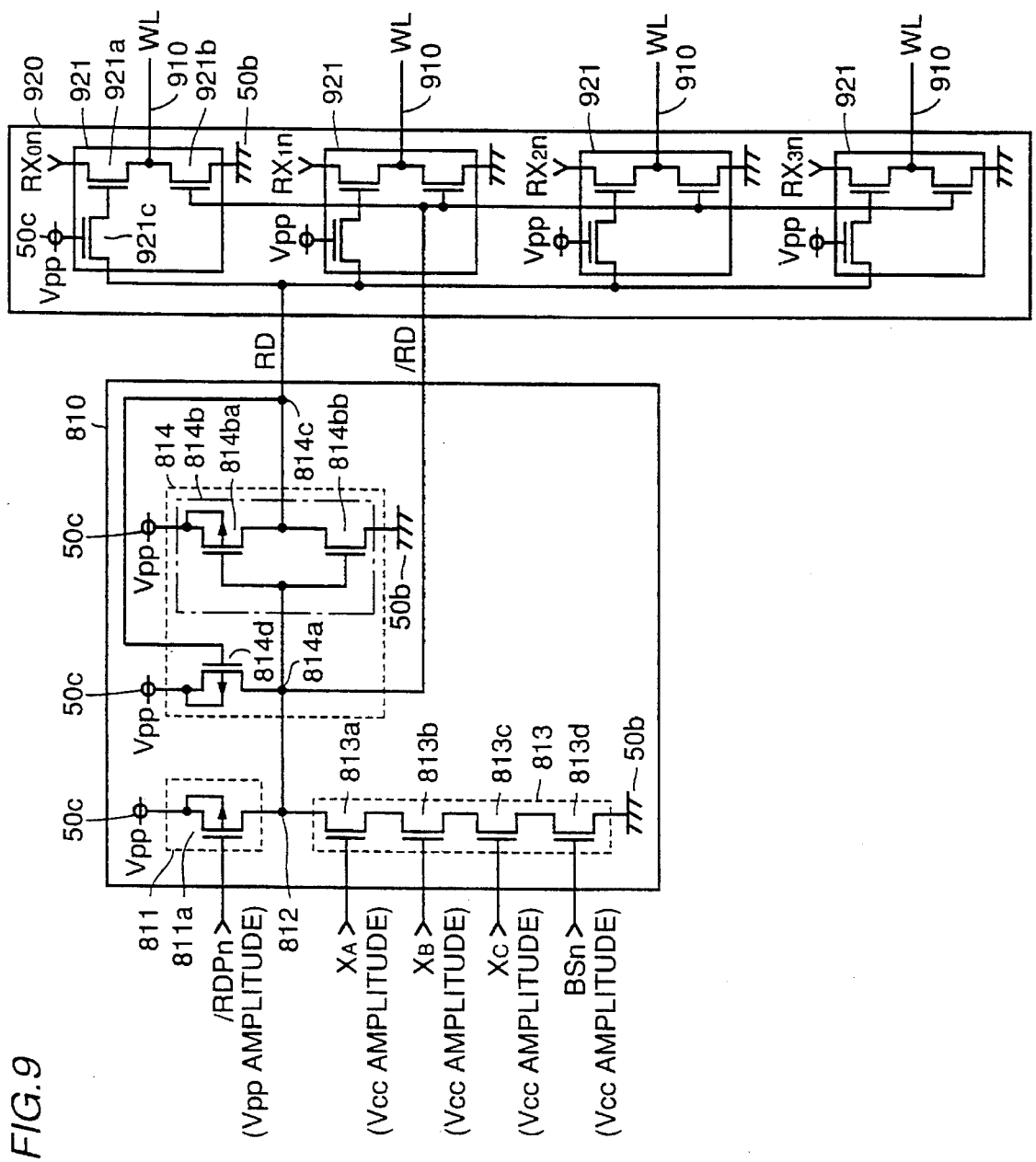
FIG. 9 is a schematic diagram of a row decoder and a word driver in Embodiment 1 of the present invention.

A row decoder group 800, the detailed structure of which is shown in FIG. 9, includes 1024 row decoders 810. Row decoder group 800 receives row predecode signals $X_0$ to $X_{11}$ from partial decoders 410, 420 and 430, sub block selecting signals $BS_0$ to $BS_{15}$ from sub block selecting signal generating circuit 500, and local reset signals /$RDP_0$ to /$RDP_{15}$ for the decoder from reset signal generating circuit 600. 64 row decoders 810 correspond to respective one of 16 sub block selecting signals $BS_0$ to $BS_{15}$. Row decoder 810 provides a row decode signal RD of the amplitude of the boosted potential Vpp and a row decode signal /RD of the amplitude of the boosted potential Vpp and having complementary logic to row decode signal RD based on row predecode signals $X_0$ to $X_{11}$.

A word driver group 900 receiving the output from row decoder group 800 receives row decode signals RD, /RD from row decoder 810 and word line drive signals $RX_{000}$ to $RX_{015}$, $RX_{100}$ $_{to\ RX}$ $115$, $RX_{200}$ to $RX_{215}$ and $RX_{300}$ to $RX_{315}$ from word line drive signal generating circuit 700, and elevates the word line 910 from the ground potential to the boosted potential Vpp based on these signals. Word driver group 900 includes word drivers 920 corresponding to the row decoder 810.

Figure 10:
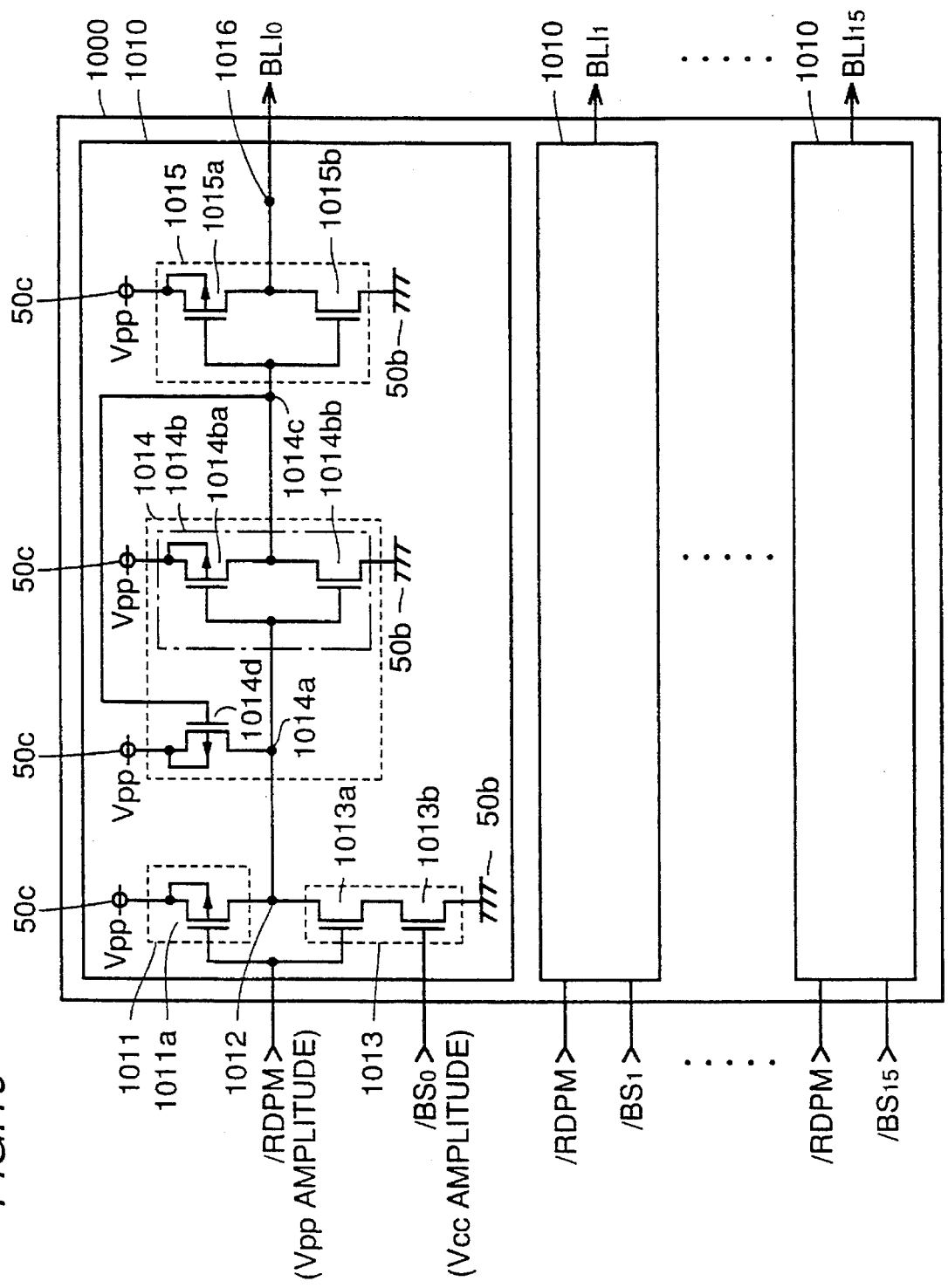
FIG. 10 is a schematic diagram of a bit line selecting signal generating circuit in Embodiment 1 of the present invention.

A bit line selecting signal generating circuit 1000, the detailed structure of which is shown in FIG. 10, operates receiving the boosted potential Vpp. It receives the master reset signal RDPM for the decoder of the amplitude of the boosted potential Vpp from master reset signal generating circuit 610 and sub block selecting signals $/BS_0$ to $/BS_{15}$ of the amplitude of the supply potential Vcc from sub block selecting signal generating circuit 500, and provides bit line selecting signals $BLI_0$ to $BLI_{15}$ of the amplitude of the boosted potential Vpp having logics complementary to the logics of sub block selecting signals $/BS_0$ to $/BS_{15}$ (when the sub block selecting signal is at the H level, the bit line selecting signal attains to the ground potential, and if the sub block selecting signal is at the L level, it attains to the boosted potential Vpp).

Referring to FIG. 1B, CAS buffer 1100 receives an external column address strobe signal ext/CAS, and provides a column address strobe signal /CAS of the amplitude of the supply potential Vcc and having the same logic as the external column address strobe signal ext/CAS. A column address buffer 1200 receives the column address strobe signal /CAS from CAS buffer 1100 and external address signals $A_0$ to $A_{11}$, latches the address signals $A_0$ to $A_{11}$ as a column address when the column address strobe signal /CAS falls from the H level to the L level, and provides column address signals $CA_0$, $/CA_0$ to $CA_{11}$, $/CA_{11}$ of the amplitude of the supply potential Vcc having the same and complementary logics as for the address signals $A_0$ to $A_{11}$.

A predecoder 1300 predecoding the column address signals include five partial decoders 1310, 1320, 1330, 1340 and 1350. Partial decoder 1310 receives column address signals $CA_0$, $/CA_0$ and $CA_1$, $/CA_1$ from column address buffer 1200, and provides column predecode signals $Y_0$, $Y_1$, $Y_2$ and $Y_3$ having the amplitude of supply potential Vcc, one of which attains to the H level and the remaining three of which attain to the L level based on the logics of column address signals $CA_0$, $/CA_0$ and $CA_1$, $/CA_1$.

Partial decoder 1320 receives column address signals $CA_2$, $/CA_2$ and $CA_3$, $/CA_3$ from column address buffer 1200 and provides column predecode signals $Y_4$, $Y_5$, $Y_6$ and $Y_7$ of the amplitude of the supply potential Vcc, one of which attains to the H level and the remaining three of which attain to the L level based on the logics of column address signals $CA_2$, $/CA_2$ and $CA_3$, $/CA_3$. Partial decoder 1300 receives column address signals $CA_4$, $/CA_4$ and $CA_5$, $/CA_5$ from column address buffer 1200, and provides column predecode signals $Y_8$, $Y_9$, $Y_{10}$ and $Y_{11}$ of the amplitude of the supply potential Vcc, one of which attains to the H level and remaining three of which attain to the L level based on the logics of column address signals $CA_4$, $/CA_4$ and $CA_5$, $/CA_5$.

Partial decoder 1340 receives column address signals $CA_6$, $/CA_6$ and $CA_7$, $/CA_7$ from column address buffer 1200, and provides column predecode signals $Y_{12}$, $Y_{13}$, $Y_{14}$ and $Y_{15}$ of the amplitude of the supply potential Vcc, one of which attains to the H level and remaining three of which attain to the L level based on the logics of the address signals $CA_6$, $/CA_6$ and $CA_7$, $/CA_7$.

Partial decoder 1350 receives column address signals $CA_8$, $/CA_8$ and $CA_9$, $/CA_9$ from column address buffer 1200, and provides column predecode signals $Y_{16}$, $Y_{17}$, $Y_{18}$ and $Y_{19}$ of the amplitude of supply potential Vcc, one of which attains to the H level and remaining three of which attain to the L level based on the logics of column address signals $CA_8$, $/CA_8$ and $CA_9$, $/CA_9$.

Figure 11:
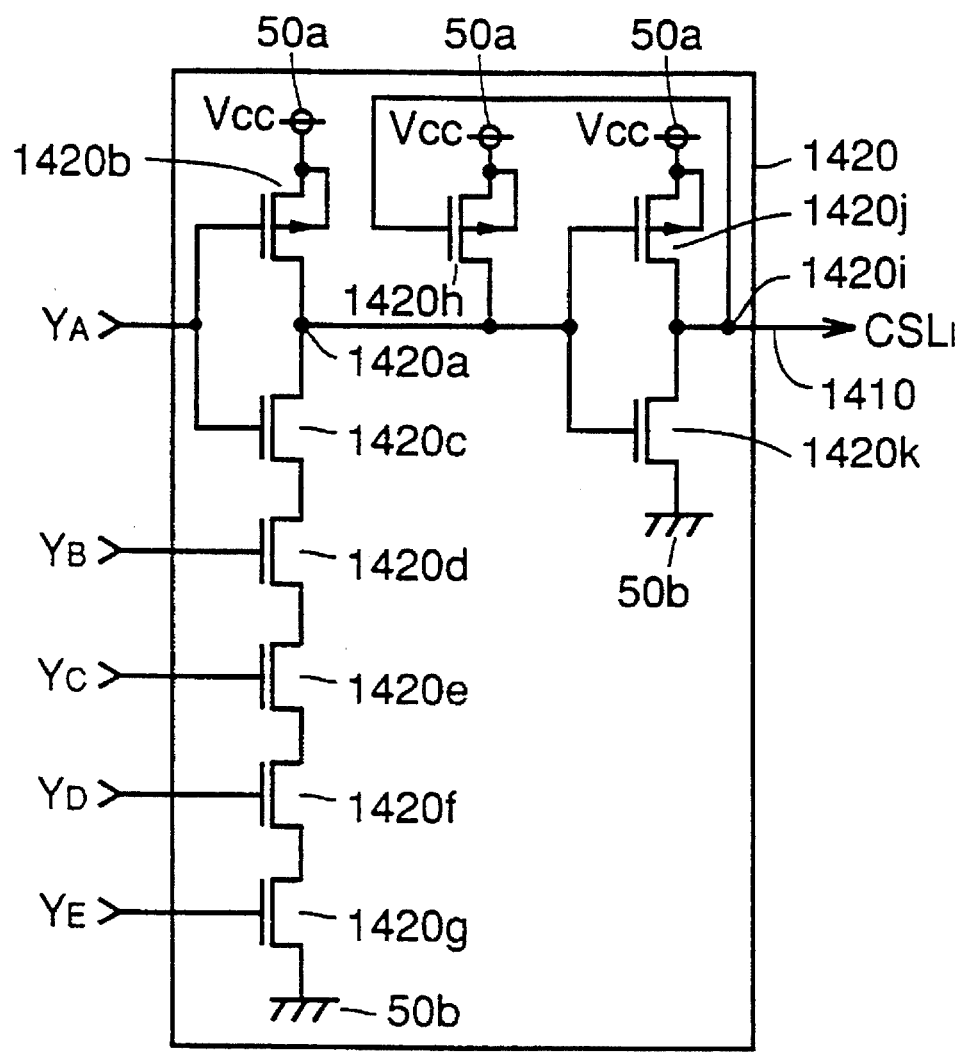
FIG. 11 is a schematic diagram of a column decoder in Embodiment 1 of the present invention.

A column decoder group 1400, the detailed structure of which is shown in FIG. 11, receives column predecode signals $Y_0$ to $Y_{19}$ from column predecoder 1300 and provides a column selecting signal CSL of the amplitude of the supply potential Vcc based on the logics of column predecode signals $Y_0$ to $Y_{19}$. Column decoder group 1400 includes 1024 column decoder 1420. One of 1024 column selecting signals $CSL_0$ to $CSL_{1023}$ attains to the H level and remaining 1023 signals attain to the L level.

A memory cell array 1500 includes 0th 4 Mbit block 1510 (FIG. 12), 1st 4 Mbit block 1520, 2nd 4 Mbit block 1530 and 3rd 4 Mbit block 1540, in each of which 4M memory cells are arranged in a matrix. A selector 1600 receives data $D_0$, $D_1$, $D_2$ and $D_3$ from 0th to 3rd 4 Mbit blocks 1510, 1520, 1530 and 1540 as well as column address signals $CA_{10}$, $/CA_{10}$, $CA_{11}$, $/CA_{11}$ from column address buffer 1200, and provides one of data $D_0$, $D_1$, $D_2$ and $D_3$ as data Dout based on the logics of column address signals $CA_{10}$, $/CA_{10}$, $CA_{11}$ and $/CA_{11}$.

Specific circuits in each block diagram will be described.

Figure 2:
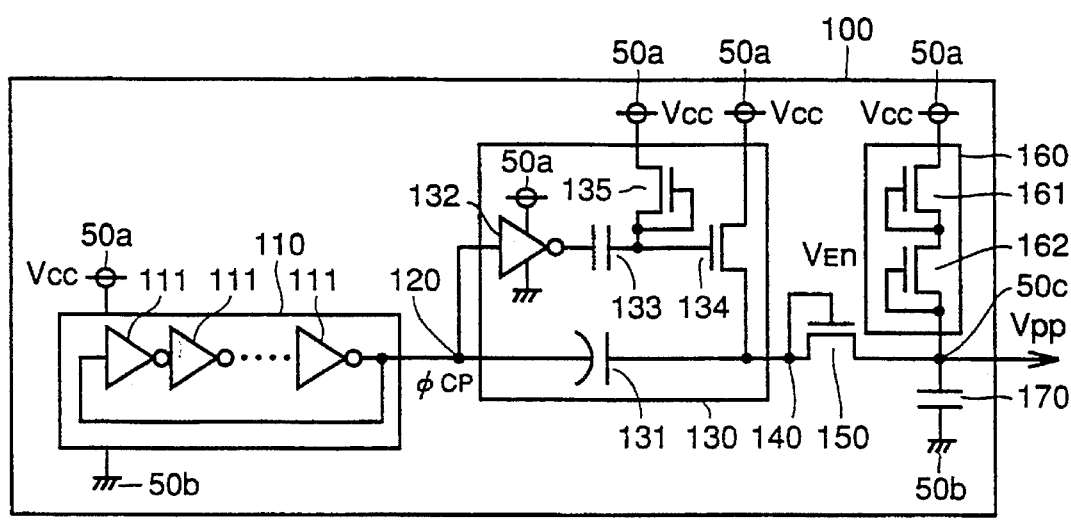
FIG. 2 is a schematic diagram of a boosted potential generating circuit in Embodiment 1 of the present invention.

FIG. 2 is a circuit diagram showing a specific example of boosted potential generating circuit 100 shown in FIG. 1. Referring to FIG. 2, boosted potential generating circuit 100 includes a clock signal generating circuit 110 including an odd number of stages of inverters 111 operating with the supply potential Vcc connected in a ring and providing a clock signal φcp at a clock output node 120, and a charge pump circuit 130 effecting charge pump operation based on the clock signal φcp.

Charge pump circuit 130 includes a capacitor 131 connected between clock output node 120 and a charge node 140; an inverter 132 having its input connected to clock output node 120; a capacitor 133 having one electrode connected to the output of inverter 132; an n channel MOS transistor 134 connected between supply potential node 50a and charge node 140 and having its gate electrode connected to the other electrode of capacitor 133; and an n channel MOS transistor 135 connected between supply potential node 50a and the gate electrode of n channel MOS transistor 134 and having its gate electrode connected also to the gate electrode of n channel MOS transistor 134.

Boosted potential generating circuit 100 further includes an n channel MOS transistor 150 connected between charge node 140 and boosted potential node 50c and having its gate connected to charge node 140; and a clamp circuit 160 including n channel MOS transistors 161 and 162 diode connected in series between supply potential node 50a and boosted potential node 50c. Clamp circuit 160 couples boosted potential node 50c to supply potential node 50a when the boosted potential Vpp becomes higher than the supply potential Vcc by at least the sum 2Vth of the threshold voltage Vth (for example, 1 V) of n channel MOS transistor 161 and the threshold voltage Vth of n channel MOS transistor 162, so that the boosted potential Vpp attains to Vcc+2Vth. A capacitor 170 connected between boosted potential node 50c and ground potential node 50d has a capacitance as large as 1000 pF or higher so that even when the circuit driven by the boosted potential Vpp operates and a current flows out through boosted potential node 50c, the boosted potential Vpp does not abruptly lower.

FIG. 3 is a specific circuit diagram of row predecoder 400 shown in FIG. 1. Referring to FIG. 3, partial decoder 410 includes an NAND circuit 411 which operates with supply potential Vcc, receives row address signals $RA_2$ and $RA_3$ of the amplitude of supply potential Vcc from row address buffer 300, and provides a signal at the L level when the row address signals $RA_2$ and $RA_3$ are both at the H level; an inverter 412 receiving an output from NAND circuit 411 and providing a row predecode signal $X_0$; an NAND circuit 413 which operates with supply potential Vcc, receives row address signals /$RA_2$ and $RA_3$ of the amplitude of supply potential Vcc from row address buffer 300, and provides a signal at the L level when row address signals /$RA_2$ and $RA_3$ are both at the H level; an inverter 414 receiving the output from NAND circuit 413 and providing a row predecode signal $X_1$; an NAND circuit 415 which operates with supply potential Vcc, receives row address signals $RA_2$ and /$RA_2$ of the amplitude of supply potential Vcc from row address buffer 300 and provides a signal at the L level when row address signals $RA_2$ and /$RA_3$ are both at the H level; an inverter 416 receiving the output from NAND circuit 415 and providing a row predecode signal $X_2$; an NAND circuit 417 which operates with supply potential Vcc, receives row address signals /$RA_2$ and /$RA_3$ of the amplitude of supply potential Vcc from row address buffer 300 and provides a signal at the L level when row address signals /$RA_2$ and /$RA_3$ are both at the H level; and an inverter 418 receiving the output from NAND circuit 417 and providing a row predecode signal $X_3$.

Partial predecoders 420, 430, 440, and 450 have the same circuit structure as partial decoder 410, and receive row address signals $RA_4$, /$RA_4$ to $RA_{11}$, /$RA_{11}$ of the amplitude of supply potential Vcc from row address buffer 300 and provide row predecode signals $X_4$ to $X_{19}$ of the amplitude of supply potential Vcc.

Figure 4:
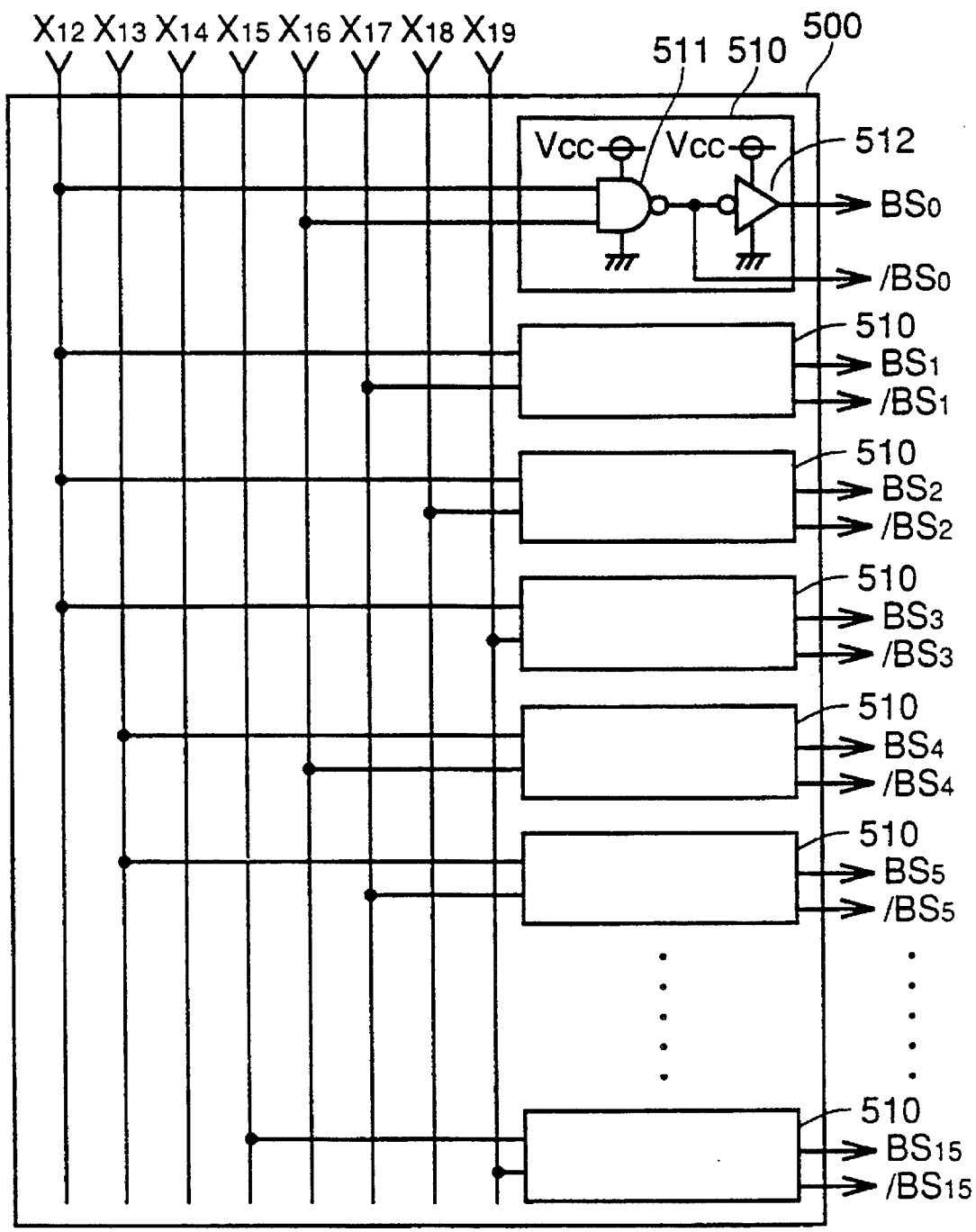
FIG. 4 is a schematic diagram of a sub block selecting signal generating circuit in Embodiment 1 of the present invention.

FIG. 4 is a schematic circuit diagram of sub block selecting signal generating circuit 500 shown in FIG. 1. Referring to FIG. 4, circuit 500 includes BS generating circuit 570 generating a block selecting signal. BS generating circuit 510 receives one signal $X_D$ of row predecode signals $X_{12}$, $X_{13}$, $X_{14}$ and $X_{15}$ from partial decoder 440 and one signal $X_E$ of row predecode signals $X_{16}$, $X_{17}$, $X_{18}$ and $X_{19}$ from partial decoder 450, and provides a block selecting signal BSn and its inverted signal /BSn (n=0, 1 . . . , 15). BS generating circuit 510 includes an NAND circuit 511 operating with supply potential Vcc, receiving row predecode signals $X_D$ and $X_E$ and providing a block selecting signal /BSn which attains to the L level when these row predecode signals are both at the H level, and an inverter 512 operating with supply potential Vcc, receiving block selecting signal /BSn from NAND circuit 511 and providing an inverted block selecting signal BSn (n=0, 1 . . . , 15). For example, BS generating circuit 510 receiving row predecode signals $X_{12}$ and $X_{16}$ provides block selecting signals $BS_0$ and /$BS_0$, while BS generating circuit 510 receiving row predecode signals $X_{12}$ and $X_{17}$ provides block selecting signals $BS_1$ and /$BS_1$. More specifically, 16 BS generating circuits 510 receive predecode signals $X_D$ and $X_E$ of mutually different combinations.

FIG. 5 is a schematic circuit diagram of master reset signal generating circuit 610 in reset signal generating circuit 600 for the decoder shown in FIG. 1. Referring to FIG. 5, circuit 610 includes an inverter 611 operating with supply potential Vcc, receiving row address strobe signal /RAS of the amplitude of supply potential Vcc from RAS buffer 200 and providing an inverted signal thereof; and a signal level converting circuit 612 receiving the row address strobe signal /RAS and the signal from inverter 611 for providing, at an output node 612a, a signal which attains to the boosted potential Vpp when the row address strobe signal /RAS is at the H level and which attains to the ground potential when the signal /RAS is at the L level.

Level converting circuit 612 includes a p channel MOS transistor 612c connected between boosted potential node 50c and output node 612a and having its gate electrode connected to a complementary output node 612b; a p channel MOS transistor 612d connected between boosted potential node 50c and complementary output node 612b and having its gate electrode connected to output node 612a; an n channel MOS transistor 612e connected between output node 612a and the ground potential node 50b and having its gate electrode connected to the output side of inverter 611; and an n channel MOS transistor 612f connected between complementary output node 612b and ground potential node 50b and receiving at its gate electrode the row address strobe signal /RAS.

Circuit 612 further includes three stages of cascade-connected inverters 613, 614 and 615. Inverter 613 includes a p channel MOS transistor 613a and an n channel MOS transistor 613b, and operates receiving the boosted potential Vpp. Inverter 614 includes a p channel MOS transistor 614a and an n channel MOS transistor 614b, and operates receiving the boosted potential Vpp. Inverter 615 includes a p channel MOS transistor 615a and an n channel MOS transistor 615b, and operates receiving the boosted potential Vpp.

The p channel MOS transistor 615a and the n channel MOS transistor 615b constituting inverter 615 have their channel width made wider than that of the MOS transistors constituting inverters 613 and 614 so that they have larger current drive-ability, in order to stably provide master reset signal /RDPM which is input to gate electrodes of a number of MOS transistors. Inverter 615 having large current drive-ability is not directly connected to signal level converting circuit 612 but through inverters 613 and 614, so that the current drive-ability gradually increases. When inverter 615 having large current drive-ability is directly connected to output node 612 of signal level converting circuit 612, the potential of output node 612a changes slowly because of large gate capacitance of MOS transistors 615a and 615b constituting the inverter 615, as these transistors have wide channel width, resulting in through-current flowing from boosted potential node 50c to ground potential node 50b. Two stages of inverters 613 and 614 are inserted to suppress this through-current.

For example, assume that the potential at output node 612a changes from the ground potential to the boosted potential Vpp. At this time, row address strobe signal /RAS is at the H level and n channel MOS transistor 612f is conductive. When the potential of output node 612a rises slowly, p channel MOS transistor 612d is not immediately rendered non-conductive, and therefore large through-current flows from boosted potential node 50c to the ground potential node 50b through p channel MOS transistor 612d and n channel MOS transistor 612f.

FIG. 6 is a schematic circuit diagram of local reset signal generating circuit 620 in reset signal generating circuit 600 shown in FIG. 1. Referring to FIG. 6, circuit 620 includes 16 /RDP generating circuits 621. Circuit 621 receives master reset signal /RDPM of the amplitude of boosted potential Vpp from master reset signal generating circuit 610, one signal $X_D$ of row predecode signals $X_{12}$, $X_{13}$, $X_{14}$ and $X_{15}$ from partial decoder 440 and one signal $X_E$ of row predecode signals $X_{16}$, $X_{17}$, $X_{18}$ and $X_{19}$ from partial decoder 450, and provides a local reset signal /RDPn (n=0, 1 . . . , 15).

/RDP generating circuit 621 includes a p channel MOS transistor 621b connected between boosted potential node 50c and node 621a and receiving at its gate electrode the master reset signals /RDPM; an n channel MOS transistor 621c having its drain electrode connected to node 621a and receiving at its gate electrode the master reset signal /RDPM; an n channel MOS transistor 621d having its drain electrode connected to the source electrode of n channel MOS transistor 621c and receiving at its gate electrode the row predecode signal $X_D$; an n channel MOS transistor 621e connected between the source electrode of n channel MOS transistor 621d and ground potential node 50b and receiving at its gate electrode the row predecode signal $X_E$; a p channel MOS transistor 621f connected between boosted potential node 50c and node 621a and having its gate electrode connected to output node 621g; a p channel MOS transistor 621h connected between boosted potential node 50c and output node 621g and having its gate electrode connected to node 621a; and an n channel MOS transistor 621i connected between output node 621g and the ground potential node 50b.

For example, /RDP generating circuit 621 receiving row predecode signals $X_{12}$ and $X_{16}$ provides a local reset signal /RDP$_0$, while /RDP generating circuit 621 receiving row predecode signals $X_{12}$ and $X_{17}$ provides a local reset signal /RDP$_1$. More specifically, 16 /RDP generating circuits 621 receive row predecode signals $X_D$ and $X_E$ of mutually different combinations. Now, one of the local reset signals /RDPn (n=0, 1 . . . , 15) attains to the boosted potential Vpp based on the row predecode signals $X_D$ and $X_E$, and therefore it may be possible to use the block selecting signals BSn one of which attains to the H level based on the row predecode signals $X_D$ and $X_E$ as a trigger signal for the local reset signal /RDPn. However, the row predecode signals $X_D$ and $X_E$ are decoded for the following purpose. Namely, as will be described with reference to the row decoder of FIG. 9, if the block selecting signal BSn is used as the trigger signal, the reset signal for the decoder changes after the change of the block selecting signal BSn, which results in increased power consumption of row decoder 810.

FIG. 7 is a schematic circuit diagram of a master word line drive signal generating circuit 710 in word line drive signal generating circuit 700 shown in FIG. 1. Referring to FIG. 7, circuit 710 includes four RXM generating circuits 712. A delay circuit 711 receives the row address strobe signal /RAS from RAS buffer 200 and provides a delay signal RXT of /RAS. Circuit 712 receives one of row address signals RA$_0$ and /RA$_0$ and one of RA$_1$ and /RA$_1$ from row address buffer 300, the delay signal /RXT from delay circuit 711 and a spare signal /SPR which is normally at the supply potential Vcc, and provides a master word line drive signal RXMm (m=0, 1, 2, 3).

RXM generating circuit 712 includes an NAND circuit 712a operating with the supply potential Vcc, receiving either the row address signal RA$_0$ or /RA$_0$ and RA$_1$ or /RA$_1$ and providing a signal at the L level when both of the received signals are at the H level; an NOR circuit 712b operating with supply potential Vcc, receiving the delay signal /RXT from delay circuit 711 and the output signal from NAND circuit 712a and providing a signal at the H level when both of the received signals are at the L level; an NAND circuit 712c operating with supply potential Vcc, receiving the output signal from NOR circuit 712b and a spare signal /SPR which is normally at the supply potential Vcc and outputting a signal at the L level when both of the received signals are both at the H level; and an inverter 712d operating with supply potential Vcc and having its input side connected to the output side of NAND circuit 712c.

RXM generating circuit 712 further includes a signal level converting circuit 712e for converting a signal having the amplitude of supply potential Vcc to a signal having the amplitude of Vpp. Level converting circuit 712e includes a p channel MOS transistor 712ec connected between boosted potential node 50c and output node 712ea and having its gate electrode connected to complementary output node 712eb; a p channel MOS transistor 712ed connected between boosted potential node 50c and complementary output node 712eb and having its gate electrode connected to output node 712ea; an n channel MOS transistor 712ee connected between output node 712ea and ground potential node 50b and having its gate electrode connected to the output of inverter 71d; and an n channel MOS transistor 712ef connected between complementary output node 712eb and the ground potential node 50b and having its gate electrode connected to the output side of NAND circuit 712c.

The RXM generating circuit 712 further includes an inverter 712f operating with boosted potential Vpp and having its input connected to output node 712ea in signal level converting circuit 712e; an inverter 712g operating with boosted potential Vpp and having its input connected to the output of inverter 712f; and an inverter 712h operating with boosted potential Vpp, having its input side connected to the output of inverter 712g and providing a master word line drive signal RXMm (m=0, 1, 2, 3).

Inverters 712f, 712g and 712h have channel widths of MOS transistors constituting the inverters made wider in this order, so that current drive-ability of the inverters is gradually increased. RXM generating circuit 712 receiving row address signals RA$_0$ and RA$_1$ provide master word line drive signal RXM$_0$; RXM generating circuit 712 receiving row address signal /RA$_0$ and RA$_1$ provides master word line drive signal RXM$_1$, RXM generating circuit 712 receiving row address signals RA$_0$ and /RA$_1$ provides master word line drive signal RXM$_2$; and RXM generating circuit 712 receiving row address signals /RA$_0$ and /RA$_1$ provides master word line drive signal RX$_3$.

FIG. 8 is a schematic circuit diagram of local word line drive signal generating circuit 720 in word line drive signal generating circuit 700 shown in FIG. 1. Referring to FIG. 8, circuit 720 includes 16 RX generating circuits 721. Circuit 721 receives master word line drive signal RXMm (m=0, 1, 2, 3) having the amplitude of boosted potential Vpp from master word line drive signal generating circuit 720 and a sub block selecting signal BSn (n=0, 1 . . . , 15) of the supply potential Vcc from sub block selecting signal generating circuit 50, and provides a local word line drive signal RXmn.

RX generating circuit 721 includes a p channel MOS transistor 721b connected between boosted potential node 50c and node 721a and receiving at its gate electrode the master word line drive signal RXMm (m=0, 1, 2, 3); an n channel MOS transistor 721c having its drain electrode connected to node 721a and receiving at its gate electrode the master word line drive signal RXMm (m=0, 1, 2, 3); an n channel MOS transistor 721d connected to the source electrode of n channel MOS transistor 721c and ground potential node 50b and receiving at its gate electrode the sub block selecting signal BSn (n=0, 1 ..., 15) having the amplitude of supply potential Vcc; a p channel MOS transistor 721e connected between boosted potential node 50c and node 721a and having its gate electrode connected to output node 721f; a p channel MOS transistor 721g connected between boosted potential node 50c and output node 721f and having its gate electrode connected to node 721a; and an n channel MOS transistor 721h connected between output node 721f and ground potential node 50b and having its gate electrode connected to node 721a.

FIG. 9 is a schematic circuit diagram of row decoder 810 and word driver 920 in row decoder group 800 and word driver group 900 of FIG. 1. Row decoder 810 includes a pull up circuit 811 for pulling up the potential at node 812 to the level of Vpp, and a pull down circuit 813 for pulling down the potential at node 812 to the ground potential.

Pull up circuit 811 is connected between boosted potential node 50c and first node 812, and receives a local reset signal /RDPn (i=0, 1 ..., 15) having a binary level, that is, one of the boosted potential Vpp and the ground potential, from reset signal generating circuit 600. When local reset signal /RDPn is at the boosted potential Vpp, boosted potential node 50c is not coupled to the first node 812. If local reset signal /RDPn is at the ground potential, pull up circuit 811 connects boosted potential node 50c with the first node 812, so that the potential at first node 812 is elevated to boosted potential Vpp. Pull up circuit 811 includes a pull up p channel MOS transistor 811a connected between boosted potential node 50c and first node 812 and receiving at its gate electrode the local reset signal /RDPn.

Pull down circuit 813 is connected between first node 812 and ground potential node 50b, receives one signal $X_A$ of row predecode signals $X_0$, $X_1$, $X_2$ and $X_3$ which change in accordance with row address signals $RA_2$, $/RA_2$ to $RA_7$, $/RA_7$, one signal $X_B$ of row predecode signals $X_4$, $X_5$, $X_6$ and $X_7$, one signal $X_C$ of row predecode signals $X_8$, $X_9$, $X_{10}$ and $X_{11}$ and a sub block selecting signal BSn which changes in accordance with row address signals $RA_8$, $/RA_8$ to $RA_{11}$ and $/RA_{11}$. Signals $X_A$, $X_B$, $X_C$ and BSn have binary levels of the ground potential and the supply potential. When the predecode signals $X_A$, $X_B$ and $X_C$ and the sub block selecting signal BSn all attain to the supply potential Vcc, first node 812 is coupled to ground potential node 50b, so that the potential at the first node 812 lowers to the ground potential. When at least one of the predecode signals $X_A$, $X_B$, $X_C$ and sub block selecting signal BSn is at the ground potential, the first node 812 is not coupled to ground potential node 50b.

Pull down circuit 813 includes an n channel MOS transistor 813a having its drain electrode connected to the first node 812 and receiving at its gate electrode the row predecode signal $X_A$; an n channel MOS transistor 813b having its drain electrode connected to the source electrode of n channel MOS transistor 813a and receiving at its gate electrode the row predecode signal $X_B$; an n channel MOS transistor 813c having its drain electrode connected to the source electrode of n channel MOS transistor 813b and receiving at its gate electrode the row predecode signal $X_C$; and an n channel MOS transistor 813d connected between the first node 812 and the ground potential node 50b through n channel MOS transistors 813a, 813b and 813c, and receiving at its gate electrode the sub block selecting signal BSn (n=0, 1 ..., 15).

As can be seen from the structure shown in FIG. 9, if sub block selecting signal BSn attains to the supply potential Vcc to render n channel MOS transistor 813d conductive, and if thereafter local reset signal /RDPn attains to the boosted potential Vpp to render p channel MOS transistor 811a non-conductive, since predecode signals $X_A$, $X_B$ and $X_C$ have already changed earlier than these two signals BSn and /RDPn (as these two signals BSn and /RDPn change based on the predecode signals $X_D$ and $X_E$) the signals $X_A$, $X_B$ and $X_C$ all attain to the H level in the selected decoder, a through-current flows undesirably from boosted potential node 50c to the ground potential node 50b through transistors 811a, 813a, 813b, 813c and 813d. In order to prevent this problem, as already described with reference to local reset signal generating circuit 620 of FIG. 6, sub block selecting signal BSn is not used as the trigger signal for the local reset signal /RDPn.

Local reset signal /RDPn must be a signal having the amplitude of the boosted potential Vpp. If the signal /RDPn has the amplitude of the supply potential Vcc, the gate-to-source voltage of p channel MOS transistor 811a would be Vcc–Vpp (<Vtp:Vtp represents threshold voltage of p channel MOS transistor 811a) and p channel MOS transistor 811a is not rendered non-conductive even when the local reset signal /RDPn rises to the supply potential Vcc.

Row decoder 810 includes an output holding circuit 814 holding the potential at node 812. Output holding circuit 814 includes an inverter circuit 814b operating with boosted potential Vpp, having its input connected to a first input node 814a which in turn is connected to the first node 812 and its output connected to a first output node 814c; and a p channel MOS transistor 814d connected between boosted potential node 50c and first input node 814a and having its gate electrode connected to the first output node 814c.

Inverter circuit 814b in output holding circuit 814 further includes a p channel MOS transistor 814ba connected between boosted potential node 50c and first output node 814c and having its gate electrode connected to the first input node 814a; and an n channel MOS transistor 814bb connected between the first output node 814c and ground potential node 50b and having its gate electrode connected to the first input node 814a.

In output holding circuit 814, when the potential at first input node 814a is at the boosted potential Vpp, inverter circuit 814b provides the ground potential at first output node 814c. The p channel MOS transistor 814d receiving the potential at first output node 814c is rendered conductive, boosted potential node 50c couples to the first input node 814a, and the potential at first input node 814a is held at boosted potential Vpp while the potential at first output node 814c is held at the ground potential.

A word driver 920 includes a self boost circuit 921 provided corresponding to each word line 910. Self boost circuit 921 receives the row decode signal RD having the amplitude of the boosted potential Vpp provided from first output node 814c of row decoder 810, the row decode signal /RD having the amplitude of boosted potential Vpp provided from first input node 814a, and local word line drive signal RXmn (m=0, 1, 2, 3; n=0, 1, 3 ..., 15) from word line drive signal generating circuit 700, and raises the potential WL of the corresponding word line 910 to the boosted potential Vpp.

Self boost circuit 921 includes a first word line driving n channel MOS transistor 921a having its source electrode connected to word line 910 and receiving a local word line drive signal RXmn having binary levels, that is, the boosted potential Vpp and the ground potential at its drain electrode; a second word line driving n channel MOS transistor 921b connected between word line 910 and ground potential node 50b and having its gate electrode connected to first input node 814a; and a third word line driving n channel MOS transistor 921c connected between the first output node 814c and the gate electrode of the first word line driving n channel MOS transistor 921a and having its gate electrode connected to the boosted potential node 50c. Four self boost circuits 921 are provided corresponding to one row decoder 810. Self boost circuits 921 receives common row decode signals RD and /RD and different local word line drive signals $RX_{0n}$, $RX_{1n}$, $RX_{2n}$ and $RX_{3n}$, respectively.

FIG. 10 is a schematic circuit diagram of bit line selecting signal generating circuit 1000 shown in FIG. 1A. Referring to FIG. 10, circuit 1000 includes a BLI generating circuit 1010 providing a bit line selecting signal BLIn. Circuit 1010 operates with boosted potential Vpp, receives master reset signal /RDPM of the amplitude of the boosted potential Vpp from reset signal generating circuit 600 and a sub block selecting signal /BSn (n=0, 1, 3 . . . , 15) of the amplitude of supply potential Vcc from sub block selecting signal generating circuit 500, and provides a bit line selecting signal BLIn (n=0, 1, 3 . . . , 15) of the amplitude of boosted potential Vpp.

BLI generating circuit 1010 includes a pull up circuit 1011 for pulling up the potential at node 1012 to the Vpp level, a pull down circuit 1013 for pulling down the potential at node 1012 to the ground potential, and a holding circuit 1014 for holding the potential at node 1014c. Pull up circuit 1011 is connected between boosted potential node 50c and a first node 1012 and receives a master reset signal /RDPM for the decoder. When master reset signal /RDPM attains to the ground potential, the boosted potential node 50c is coupled to the first node 1012, and the potential at first node 1012 is raised to the boosted potential Vpp. When the master reset signal RDPM attains to the boosted potential Vpp, the boosted potential node 50c is disconnected from first node 1012. Pull up circuit 1011 includes a p channel MOS transistor 1011a connected between boosted potential node 50c and first node 1012 and receiving at its gate electrode the master reset signal /RDPM.

Pull down circuit 1013 is connected between first node 1012 and ground potential node 50b, receives a sub block selecting signal BSn which has binary levels of the supply potential Vcc and the ground potential and changes in accordance with row address signals $RA_8$, $/RA_8$ to $RA_{11}$ and $/RA_{11}$, and the master reset signal /RDPM. When the sub block selecting signal BSn attains to the supply potential Vcc and the master reset signal /RDPM attains to the boosted potential Vpp, pull down circuit 1013 lowers potential at first node 1012 to the ground potential by connecting first node 1012 to the ground potential node 50b. When at least one of sub block selecting signal BSn and master reset signal /RDPM is at the ground potential, the first node 1012 is disconnected from ground potential node 50b.

Pull down circuit 1013 includes an n channel MOS transistor 1013a having its drain electrode connected to the first node 1012 and receiving at its gate electrode the master reset signal /RDPM; and an n channel MOS transistor 1013b connected between the first node 1012 and the ground potential node 50b through n channel MOS transistor 1013a and receiving at its gate electrode the sub block selecting signal BSn (n=0, 1, . . . , 15).

Output holding circuit 1014 includes an inverter circuit 1014b operating with boosted potential Vpp, having its input connected to a first input node 1014a which is connected to the first node 1012 and its output connected to a first output node 1014c; and a p channel MOS transistor 1014d connected between boosted potential node 50c and first input node 1014a and having its gate electrode connected to first output node 1014c. Inverter circuit 1014b of output holding circuit 1014 further includes a p channel MOS transistor 1014ba connected between boosted potential node 50c and first output node 1014c and having its gate electrode connected to first input node 1014a; and an n channel MOS transistor 1014bb connected between first output node 1014c and ground potential node 50b and having its gate electrode connected to first input node 1014a.

An inverter 1015 provided at an output stage operates receiving boosted potential Vpp, having its input connected to first output node 1014c and providing from its output, a bit line selecting signal BLIn having the amplitude of boosted potential Vpp. Inverter 1015 includes a p channel MOS transistor connected between boosted potential node 50c and a second output node 1016 and having its gate electrode connected to first output node 1014c; and an n channel MOS transistor 1015b connected between second output node 1016 and ground potential node 50b and its gate electrode connected to first output node 1014c.

FIG. 11 is a specific circuit diagram of a column decoder 1420 in column decoder group 1400 shown in FIG. 1B. Referring to FIG. 11, column decoder 1420 includes a p channel MOS transistor 1420b connected between supply potential node 50a and a node 1420a and receiving at its gate electrode one signal $Y_A$ of column predecode signals $Y_0$, $Y_1$, $Y_2$ and $Y_3$ from partial decoder 1310; an n channel MOS transistor 1420c having its drain electrode connected to node 1420a and receiving at its gate electrode the column predecode signal $Y_A$; an n channel MOS transistor 1420d having its drain electrode connected to the source electrode of n channel MOS transistor 1420c and receiving at its gate electrode one signal $Y_B$ of column predecode signals $Y_4$, $Y_5$, $Y_6$ and $Y_7$ from partial decoder 1320; an n channel MOS transistor 1420e having its drain electrode connected to the source electrode of n channel MOS transistor 1420d and receiving at its gate electrode one signal $Y_C$ of column predecode signals $Y_8$, $Y_9$, $Y_{10}$ and $Y_{11}$ from partial decoder 1330; an n channel MOS transistor 1420f having its drain electrode connected to the source electrode of n channel MOS transistor 1420e and receiving at its gate electrode one signal $Y_D$ of column predecode signals $Y_{12}$, $Y_{13}$, $Y_{14}$ and $Y_{15}$ from partial decoder 1340; and an n channel MOS transistor 1420g connected between the source electrode of n channel MOS transistor 1420f and ground potential node 50b and receiving at its gate electrode one signal $Y_E$ of column predecode signals $Y_{16}$, $Y_{17}$, $Y_{18}$ and $Y_{19}$ from partial decoder 1350.

Column decoder 1420 includes holding circuits 1420h, 1420j and 1420k for holding the potential at output node 1420i. A p channel MOS transistor 1420h is connected between supply potential node 50a and node 1420a and has its gate electrode connected to output node 1420i from which column selecting signal $CSL_i$ (i=0, 1 . . . , 1023) is provided. A p channel MOS transistor 1420j is connected between supply potential node 50a and output node 1420i and has its gate electrode connected to node 1420a. The n channel MOS transistor 1420k is connected between output node 1420i and ground potential node 50b, with its gate electrode connected to node 1420a.

Figure 12A:
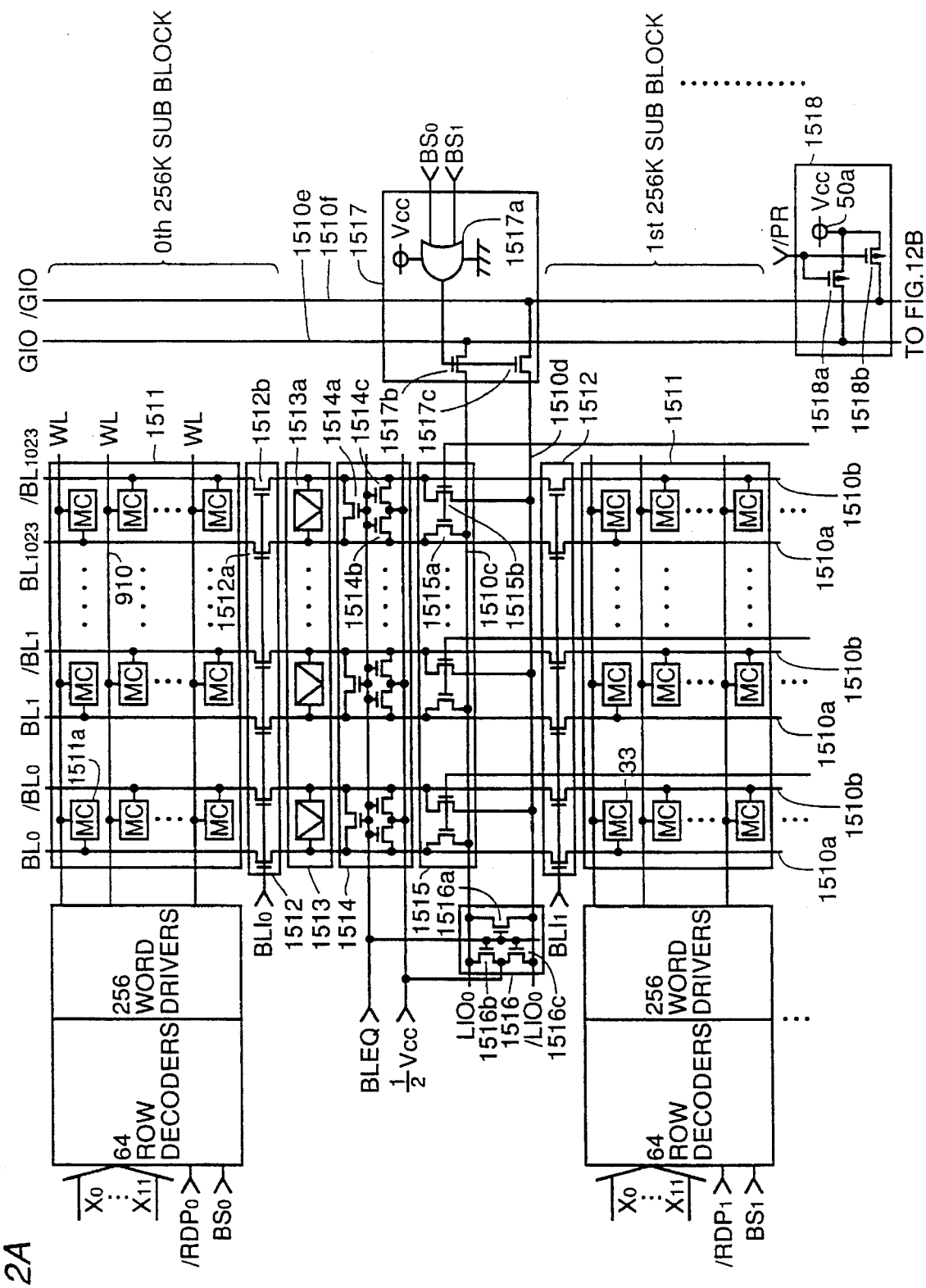
FIGS. 12A and 12B are schematic diagrams of a 4 Mbit block in Embodiment 1 of the present invention.
Figure 12B:
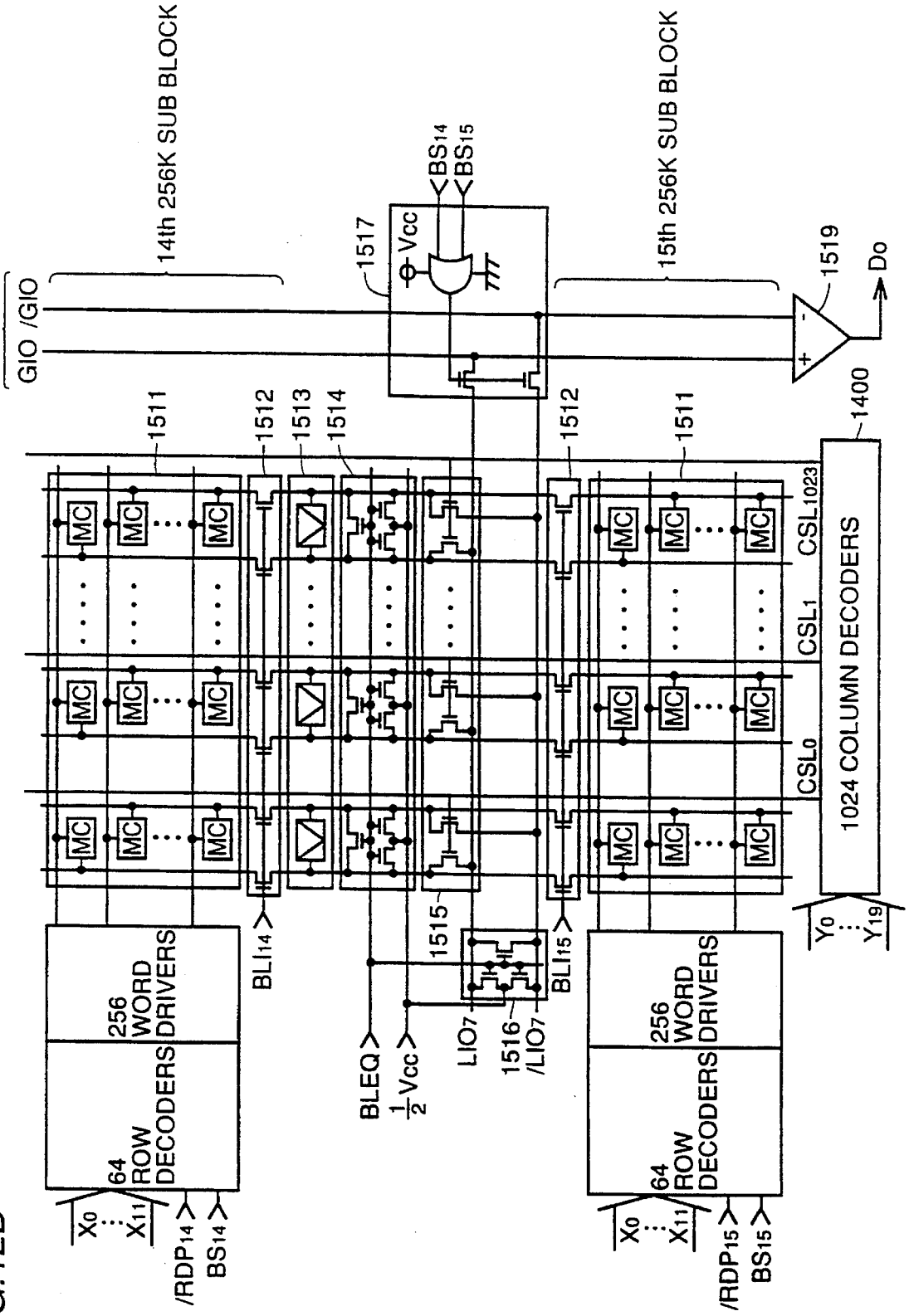

FIGS. 12a and 12b are specific circuit diagrams showing 0th 4 Mbit block 1510 as a representative of 4 Mbit blocks 1510, 1520, 1530 and 1540 shown in FIG. 1B. Referring to FIGS. 12A and 12B, memory block 1510 includes 16 sub memory arrays 1511 and in each sub array 1511, 256k memory cells 1511a are arranged in a matrix at crossings between 256 word lines 910 and 1024 pairs of bit lines 1510a and 1510b.

Sub memory array 1511 is provided with a bit line gate circuit 1512 including 2048 bit line selecting n channel MOS transistors 1512a connected to each of the bit lines 1510a and 1510b and receiving at its gate electrode a bit line selecting signal BLIn (n=0, 1 . . . , 15) of the amplitude of boosted potential Vpp from bit line selecting signal generating circuit 100, and a sense amplifier group 1513 consisting of a total of 1024 sense amplifiers 1513a connected to the bit line pairs. Sense amplifier group 1513 is shared by two sub memory arrays 1511. Further, a bit line precharge circuit 1514 is provided to be shared by two sub memory arrays 1511.

Bit line precharge circuit 1514 includes an n channel MOS transistor 1514a connected between bit lines 1510a and 1510b and receiving at its gate electrode a bit line equalizing signal BLEQ having the amplitude of supply potential Vcc; and n channel MOS transistors 1514b and 1514c connected in series between bit lines 1510a and 1510b and receiving at gate electrodes the bit line equalizing signal BLEQ having the amplitude of supply potential Vcc. An intermediate potential (½) Vcc is applied to a node between n channel MOS transistors 1514b and 1514c. When the bit line equalizing signal BLEQ attains to the H level, potentials BL1 and /BL1 (l=0, 1 . . . , 1023) of bit lines 1510a and 1510b are precharged to the intermediate potential (½) Vcc.

Local IO line pair LIO and /LIO are provided to be shared by two sub memory arrays 1511, and a first I/O gate circuit 1515 is provided between local IO line and the two sub memory cell arrays. The first I/O gate circuit 1515 includes an n channel MOS transistor 1515a connected between bit line 150a and local I/O line 1510c and receiving at its gate electrode the column selecting signal CSL1 (l=0, 1 . . . , 1023) from column decoder 1420; and an n channel MOS transistor 1515b connected between bit line 1510b and local I/O line 1510d and receiving at its gate electrode the column selecting signal CSL1 (l=0, 1 . . . , 1023) from column decoder 1420.

A local I/O line precharge circuit 1516 is provided for precharging the local I/O line to a prescribed potential. The precharge circuit 1516 includes an n channel MOS transistor 1516a connected between local I/O lines 1510c and 1510d and receiving at its gate electrode the bit line equalizing signal BLEQ; and n channel MOS transistors 1516b and 1516c connected in series between local I/O lines 1510c and 1510d and receiving at gate electrodes the bit line equalizing signal BLEQ. An intermediate potential (½) Vcc is applied to a node between n channel MOS transistors 1516b and 1016c, and when the bit line equalizing signal BLEQ attains to the H level, potentials LIOp and /LIOp (p=0, 1 . . . , 7) of local I/O lines 1510c and 1510b are precharged to the intermediate potential (½) Vcc.

Global I/O lines 1510e and 1510f are provided commonly to all the sub memory cell arrays. Between each local I/O line pair and the global I/O line pair, a second I/O gate circuit 1517 is provided.

Second I/O gate circuit 1517 includes an OR circuit 1517a operating with supply potential Vcc, receiving sub block selecting signals $BS_{2p}$ and $BS_{(2p+1)}$ and providing a signal at the H level when at least one of these two signals is at the H level; an n channel MOS transistor 1517b connected between local I/O line 1510c and global I/0 line 1510e and receiving an output from OR circuit 1517a at its gate electrode; and an n channel MOS transistor 1517c connected between local I/O line 1510d and global I/O line 1510f and receiving at its gate electrode the output from OR circuit 1517a.

A global I/O line precharge circuit 1518 for precharging global I/O lines 1510e and 1510f to a prescribed potential (Vcc) at the time of precharge is provided. Precharge circuit 1518 includes a p channel MOS transistor 1518a connected between supply potential node 50a and global I/O line 1510e and receiving at its gate electrode an I/O line precharge signal /PR having the amplitude of supply potential Vcc; and a p channel MOS transistor 1518b connected between supply potential node 50a and global I/O line 1510f and receiving at its gate electrode the I/O precharge signals /PR. The precharge circuit 1518 precharges potentials GIO and /GIO of global I/O lines 1510e and 1510f to the supply potential Vcc when I/O line precharge signal /PR attains to the L level.

A preamplifier 1519 for data reading (see FIG. 12b) operates receiving supply potential Vcc and provides data $D_0$ which is obtained by amplifying potential difference between potential GIO of global I/O line 1510e and potential /GIO of global I/O line 1510f. Preamplifier 1519 is formed of, for example, a current mirror type amplifier. Preamplifier 1519 provides, for example, data $D_0$ which attains approximately to the ground potential when the potential GIO of global I/O line 1510e is lower than the potential of GIO of global I/O line 1510f and otherwise attains approximately to the supply potential Vcc.

The operation of the DRAM having the above structure will be described with reference to the diagram of signal waveforms of FIG. 13. First, until time $t_0$ at which external row address strobe signal ext/RAS changes from H level to the L level as shown in FIG. 13(a), the row address strobe signal /RAS output from RAS buffer 200 is kept at H level. Row address buffer 300 sets row address signals $RA_0$, $/RA_0$ to $RA_{11}$, $/RA_{11}$ to the L level, and row predecoder 400 receiving the row address signals $RA_0$, $/RA_0$ to $RA_{11}$, $/RA_{11}$ sets all row predecode signals $X_0$ to $X_{19}$ to the L level. Master reset signal generating circuit 610 in reset signal generating circuit 600 receives the row address strobe signal /RAS at the H level, and provides a master reset signal /RDPM at the ground potential, as shown in FIG. 13(d). Local reset signal generating circuit 620 receiving master reset signal /RDPM sets all the local reset signals /RDPn (n=0, 1 . . . , 15) to the ground potential as shown in FIG. 13(e), while sub block selecting signal generating circuit 500 receiving row predecode signals $X_{12}$ to $X_{19}$ which are at the L level sets the sub block selecting signals /BSn and BSn (n=0, 1 . . . , 15) to the H level and the L level, respectively, as shown in (f) and (g) of FIG. 13.

In row decoder 810, p channel MOS transistor 811a receives at its gate electrode the local reset signal /RDPn which is at the ground potential, and is rendered conductive, while n channel MOS transistors 813a, 813b, 813c and 813d receive the block selecting signal BSn at the L level and the row predecode signals $X_0$ to $X_{11}$ at the L level, and hence these transistors are non-conductive. The potential at first node 812 attains to the boosted potential Vpp through transistor 811a, and in response, p channel MOS transistor 814ba is rendered non-conductive and n channel MOS transistor 814bb is rendered conductive. The row decode signal RD output from first output node 814c is reset to the ground potential as shown in FIG. 13(h), and the row decode signal /RD output from the first input node 814a is reset at the boosted potential Vpp.

The n channel MOS transistor 921a in word driver 920 receiving the row decode signal RD at the ground potential and the row decode signal /RD at the boosted potential Vpp is rendered non-conductive, and n channel MOS transistor 921b is rendered conductive. Word line 910 is coupled to ground potential node 50b, and therefore the potential WL of word line 110 attains to the ground potential as shown in FIG. 13(j).

In BLI generating circuit 1010 in bit line selecting signal generating circuit 1010, master reset signal /RDPM at the ground potential from master reset signal generating circuit 610 is received by p channel MOS transistor 1011a and n channel MOS transistor 1013a, and p channel MOS transistor 1011a is rendered conductive, n channel MOS transistor 1013a is rendered non-conductive and the potential at first node 1012 attains to the boosted potential Vpp.

P channel MOS transistor 1014ba and n channel MOS transistor 1014bb receiving at gate electrodes the potential at the first node 1012 are respectively rendered non-conductive and conductive, and the potential at the first output node 1014c is at the ground potential. The p channel MOS transistor 1015a and n channel MOS transistor 1015b receiving at their gates the potential at first output node 1014c are rendered conductive and non-conductive, respectively, and the bit line selecting signal BLIn (n=0, 1 . . . , 15) output from the second output node 1016 is at the boosted potential Vpp as shown in FIG. 13(k). Bit line selecting n channel MOS transistor 1512a in bit line gate circuit 1512 receiving at its gate the bit line selecting signal BLIn at Vpp level is rendered conductive.

At time $t_6$, the external column address strobe signal ext/CAS falls from the H level to the L level as shown in FIG. 13(b). Before time $t_6$, the CAS buffer 1100 receiving the external column address strobe signal ext/CAS provides a column address strobe signal /CAS which is at the H level. The column address buffer 1200 receiving the column address strobe signal /CAS provides column address signals $CA_0$, /$CA_0$ to $CA_{11}$, /$CA_{11}$ which are all at the L level. Column predecoder 1300 receives the column address signals $CA_0$, $CA_0$ to $CA_9$, /$CA_9$ which are at the L level, and provides column predecode signals $Y_0$ to $Y_{19}$ which are all at the L level. Column decoder 1420 in column decoder group 1400 receives column predecode signals $Y_0$ to $Y_{19}$ which are at the L level, and provides column selecting signals CSL1 (l=0, 1 . . . , 1023) which are all at the L level, and n channel MOS transistors 1515a and 1515b in the first I/O gate circuit 1515 receiving the column selecting signals CSL1 are rendered non-conductive.

Further, before $t_0$, the bit line equalizing signal BLEQ is kept at the H level as shown in FIG. 13(l), and the bit line precharge circuit 1514 receiving the bit line equalizing signal BLEQ precharges potentials BL1 and /BL1 (l=0, 1 . . . , 1023) of bit lines 1510a and 1510b to an intermediate potential (½) Vcc as shown in FIG. 13(m). Similarly, local I/O line precharge circuit 1516 receiving the bit line equalizing signal BLEQ precharges potentials LIOp and /LIOp (p=0, 1 . . . , 7) of local I/O lines 1510c and 1510d to the intermediate potential (½) Vcc. The n channel MOS transistors 1517b and 1517c in the second I/O gate circuit 1517 receive at their gate electrodes the L level signal output from OR circuit 1517a which in turn receives the sub block selecting signal BSn (n=0, 1 . . . , 15) at the ground potential from sub block selecting signal generating circuit 500, and these transistors are rendered non-conductive. In global I/O line precharge circuit 1518, p channel MOS transistors 1518a and 1518b receiving at their gates the I/O line precharge signal /PR which is set to the L level as shown in FIG. 13(p) are rendered conductive at this time, and the potentials GIO and /GIO of global I/O lines 1510e and 1510f are precharged to the supply potential Vcc.

When external address signals $A_0$ to $A_{11}$ are applied as shown in FIG. 13(c) and the external row address strobe signal ext/RAS falls from the H level to the L level at time $t_0$ as shown in FIG. 13(a), the row address strobe signal /RAS provided from RAS buffer 200 also falls from the H level to the L level. Row address buffer 300 responsive to the row address strobe signal /RAS latches address signals $A_0$ to $A_{11}$ as a row address, and provides row address signals $RA_0$, /$RA_0$ to $RA_{11}$, /$RA_{11}$. By partial decoders 410, 420, 430, 440 and 450 in row predecoder 400 receiving row address signals $RA_2$, /$RA_2$ to $RA_{11}$, /$RA_{11}$, one of row predecode signals $X_0$, $X_1$, $X_2$ and $X_3$, one of $X_4$, $X_5$, $X_6$, and $X_7$, one of $X_8$, $X_9$, $X_{10}$ and $X_{11}$, one of $X_{12}$, $X_{13}$, $X_{14}$ and $X_{15}$, and one of $X_{16}$, $X_{17}$, $X_{18}$ and $X_{19}$ are set to H level, based on the row address signals $RA_2$, /$RA_2$ to $RA_{11}$, /$RA_{11}$.

Bit line equalizing signal BLEQ also falls to the L level as shown in FIG. 13(l), n channel MOS transistors 1514a, 1514b and 1514c in bit line precharge circuit 1514 (FIGS. 1A and 1B) and n channel MOS transistors 1516a, 1516b and 1516c in local I/O line precharge circuit 1516 are rendered conductive, and supply of the intermediate potential (½) Vcc to bit lines 1510a and 1510b and to local I/O line 1510c and 1510b is stopped.

In response to the fall of row address strobe signal /RAS to the L level, n channel MOS transistor 612f in master reset signal generating circuit 610 (FIG. 5) is rendered non-conductive, and inverter 611 provides a signal at the H level. Responsively, n channel MOS transistor 612e receiving the output from inverter 611 is rendered conductive, setting output node 612a to the ground potential. The p channel MOS transistor 612b receiving the potential at output node 612a is rendered conductive, potential at complementary output node 612b is set to the boosted potential Vpp, and p channel MOS transistor 612c receiving the potential at complementary output node 612b is rendered non-conductive.

Inverter 613 receiving the potential at output node 612a, which is at the ground potential, provides a signal at the boosted potential Vpp, and inverter 614 receiving the output from inverter 613 provides a signal at the ground potential. Inverter 615 receiving the output from inverter 614 provides master reset signal /RDPM which attains to the boosted potential Vpp at time $t_6$ as shown in FIG. 13(d).

In local reset signal generating circuit 620 (FIG. 6), p channel MOS transistor 621b and n channel MOS transistor 621c receive at their gate electrodes the local reset signal /RDPM which is at the boosted potential Vpp, and rendered non-conductive and conductive, respectively. Only one /RDP generating circuit 621 out of 16 /RDP generating circuit 621 receives row predecode signals $X_D$ and $X_E$ which are both at the H level, and in this /RDP generating circuit 621, node 621a is coupled to ground potential node 50b, so that the potential at node 621a attains to the ground potential. The p channel MOS transistor 621h and n channel MOS transistor 621i receiving at their gate electrodes the potential at the node 621 which is at the ground potential are rendered conductive and non-conductive, respectively, the local reset signal /RDPn output from output node 621g rises from the ground potential as shown in FIG. 13(e) to exceed the potential Vpp-|Vtp| (where Vtp represents threshold voltage of p channel MOS transistor), and attains to the boosted potential Vpp at time $t_2$.

Meanwhile, 15 /RDP generating circuits 621 out of 16 /RDP generating circuits 621 receive row predecode signals $X_D$ and $X_E$ at least one of which is at the L level. In these 15 /RDP generating circuits 621, node 621a is not coupled to ground potential node 50b. Therefore, by p channel MOS transistors 621f and 621h constituting a cross coupled type circuit, the potential at node 621a is kept at the boosted potential Vpp, and local reset signal /RDPn provided from output node 621g is kept at the ground potential. For example, if row predecode signal $X_{12}$ and $X_{16}$ are at the H level, local reset signal /RDP$_0$ is raised to the boosted potential Vpp and remaining signals /RDP$_1$ to /RDP$_{15}$ are set to the ground potential. If row predecode signals $X_{12}$ and $X_{17}$ are at the H level, local reset signal /RDP$_1$ is raised to the boosted potential Vpp and remaining signals /RDP$_0$ and /RDP$_2$ to /RDP$_{15}$ are set to the ground potential.

Sub block selecting signal generating circuit 500 receives row predecode signals $X_{12}$ to $X_{19}$ from partial decoders 440 and 450, and based on these row predecode signals $X_{12}$ to $X_{19}$, sets one of the sub block selecting signals /BS$_0$ to /BS$_{15}$ to the L level at time $t_1$ as shown in FIG. 13(f), and sets one of the sub block selecting signals BS$_0$ to BS$_{15}$ to the H level at time $t_2$ as shown in FIG. 13(g).

In bit line selecting signal generating circuit 1000 (FIG. 10) receive master reset signal /RDPM at the boosted potential Vpp from master reset signal generating circuit 610, 16 BLI generating circuits 1010, and the sub block selecting signal /BSn from sub block selecting signal generating circuit 500. In one BLI generating circuit 1010 receiving a L level sub block selecting signal /BSn, n channel MOS transistor 1013b receiving at its gate electrode the sub block selecting signal /BSn is rendered non-conductive, and p channel MOS transistor 1011a and n channel MOS transistor 1013a receiving at their gate electrodes the master reset signal /RDPM at the boosted potential Vpp are rendered non-conductive and conductive, respectively. By a cross coupled type circuit consisting of p channel MOS transistor 1014b and p channel MOS transistor 1014ba in output holding circuit 1014, potentials at first node 1012 and first input node 1014a are kept at the boosted potential Vpp and the potential at the first output node 1014c is kept at the ground potential. P channel MOS transistor 1015a and n channel MOS transistor 1015b receiving at their gate electrodes the potential of the first output node 1014c are kept conductive and non-conductive, respectively, and bit line selecting signal BLIn provided from output node 1016 is kept at the boosted potential Vpp (selected state) as shown in FIG. 13(k).

In remaining 15 BLI generating circuits 1010 receiving the sub block selecting signals /BSn at the H level, n channel MOS transistor 1013b receiving at its gate the sub block selecting signal /BSn is rendered conductive, and p channel MOS transistor 1011a and n channel MOS transistor 1013a receiving at their gates the master reset signal /RDPM at the boosted potential Vpp are rendered non-conductive and conductive, respectively. First node 1012 is coupled to ground potential node 50b, and the potential at first node 1012 attains to the ground potential. The p channel MOS transistor 1014ba and the n channel MOS transistor 1014bb receiving at their gates the ground potential are rendered conductive and non-conductive, respectively, and the potential at first output node 1014c attains to the boosted potential Vpp. The p channel MOS transistor 1015a and n channel MOS transistor 1015b receiving at their gate electrodes the potential at first output node 1014c are rendered non-conductive and conductive, respectively, and bit line selecting signal BLIn output from output node 1016 attains to the ground potential as shown in FIG. 13(k) (non-selected state).

In the sub block (sub memory cell block) receiving the bit line selecting signal BLIn at the boosted potential Vpp, n channel MOS transistor 1512a of bit line gate circuit 1512 (FIGS. 12A, 12B) is kept conductive, connecting bit lines 1510a and 1510b to sense amplifier 1513, first I/O gate 1510 and the like.

In the sub block receiving the bit line selecting signal BLIn at the ground potential, n channel MOS transistor 1512a of bit line gate circuit 1512 is rendered non-conductive, so that bit lines 1510a and 1510b are disconnected from sense amplifier 1513, first I/O gate 1515 and the like.

OR circuit 1517a in second I/O gate circuit 1517 (FIGS. 12A, 12B) receiving the sub block selecting signal BSn at the H level provides an H level signal to the gate electrode of n channel MOS transistors 1517b and 1517c. In response, n channel MOS transistors 1517b and 1517c are rendered conductive, and hence local I/O line pairs 1510c and 1510d are connected to global I/O line pairs 1510e and 1510f. Current flows from global I/O lines 1510e and 1510f which have been precharged at the supply potential Vcc to local I/O line 1510c and 1510d which have been precharged to the intermediate potential (½) Vcc, and potentials of local I/O lines 1510c and 1510d are precharged to a potential lower than the supply potential Vcc by the threshold voltage of n channel MOS transistors 1517b and 1517c. Since two inputs to OR circuit 1517a in second I/O gate circuit 1517 provided for other non-selected sub blocks are at the L level, the circuit 1517a provides an L level signal to the gate electrodes of n channel MOS transistors 1517b and 1517c. These n channel MOS transistors 1517b and 1517c are kept non-conductive, and therefore local I/O lines 1510c and 1510d are not connected to global I/O lines 1510e and 1510f.

The following operation is carried out in row decoder group 800 receiving row predecode signal $X_A$ (A=0, 1, 2, 3) from partial decoder 410, row predecode signal $X_B$ (B=4, 5, 6, 7) from partial decoder 420, row predecode signal $X_C$ (C=8, 9, 10, 11) from partial decoder 430, sub block selecting signal BSn (n=0, 1 . . . , 15) from sub block selecting signal generating circuit 500 and local reset signals /RDPn (n=0, 1 . . . , 15) from reset signal generating circuit 600. In row decoder 810 (FIG. 9) belonging to nth 256k sub block (one of 16 sub blocks) receiving local reset signal /RDPn which rises to the boosted potential Vpp at time $t_2$ and the sub block selecting signal BSn which rises to the H level, p channel MOS transistor 811a receives reset signal /RDPn at the boosted potential Vpp at its gate electrode and is rendered non-conductive, while n channel MOS transistor 813d receives the sub block selecting signal BSn at the H level at its gate electrode and is rendered conductive.

In row decoder 810 belonging to other sub blocks (remaining 15 sub blocks), p channel MOS transistor 811a receives local reset signals /RDP$_0$ to /RDPn−1, /RDPn+1 to /RDP$_{15}$ at the ground potential at its gate and is rendered conductive, while n channel MOS transistor 813d receives at its gate the sub block selecting signals BS$_0$ to BS$_{n-1}$, BS$_{n+1}$ to BS$_{15}$ at the L level, and is rendered non-conductive. Accordingly, the potential /RD at first input node 814a is kept at the boosted potential Vpp and the potential RD at first output node 814c is kept at the ground potential. The n channel MOS transistor 921a in self boost circuit 921 at word driver 920 receiving row decode signals RD and /RD is non-conductive, n channel MOS transistor 921b is kept conductive, and the potential WL at word line 910 is kept at the ground potential (non-selected state) as shown in FIG. 13(j).

The following operation is carried out in 64 row decoders 810 belonging to nth 256k sub block in which local reset signal /RDPn is at the boosted potential Vpp, sub block selecting signal BSn is at the H level, p channel MOS transistor 811a is non-conductive and n channel MOS transistor 813d is conductive. In 63 row decoders 810 in which at least one of row predecode signal $X_A$ received at the gate electrode of n channel MOS transistor 813a, row predecode signal $X_B$ received at the gate electrode of n channel MOS transistor 813d and row predecode signal $X_C$ received at the gate electrode of n channel MOS transistor 813c is at the L level, first node 812 is not connected to ground potential node 50b. Accordingly, by a cross coupled type circuit consisting of p channel MOS transistors 814d and 814ba in output holding circuit 814, potentials /RD at first input node 814a is kept at the boosted potential Vpp and potential RD at first output node 814c is held at the ground potential. In self boost circuit 921 in word driver 920 receiving row decode signals RD and /RD, n channel MOS transistor 921a is maintained non-conductive and n channel MOS transistor 921b is maintained conductive, and potential WL of word line 910 is kept at the ground potential (non-selected state) as shown in FIG. 13(j).

In one row decoder 810 in which three row predecode signals $X_A$, $X_B$ and $X_C$ are all at the H level out of 64 row decoders 810 belonging to the nth 256k sub block, n channel MOS transistors 813a, 813b and 813c are rendered conductive, first node 812 is connected to ground potential node 50b and potential /RD of first node 812 and first input node 814a attains to the ground potential. The p channel MOS transistor 814ba receiving at its gate the potential /RD of first input node 814a is rendered conductive, n channel MOS transistor 814bb is rendered non-conductive, and row decode signal RD provided from first output node 814c rises to the boosted potential Vpp (selected state) at time $t_3$ as shown in FIG. 13(h).

In self boost circuit 921 (FIG. 9) in word driver 920, the gate electrode of third word line driving n channel MOS transistor 921a receives the row decode signal RD which is at the boosted potential Vpp and the potential thereof rises. When the potential of the gate electrode reaches a potential lower than the boosted potential Vpp by the threshold voltage Vth of n channel MOS transistor 921c, the voltage between gate and source of the third word line driving n channel MOS transistor 921c becomes lower than the threshold voltage Vth, and therefore the third word line driving n channel MOS transistor 921c is rendered non-conductive. Second word line driving n channel MOS transistor 921b receives at its gate electrode the potential /RD of first input node 814a which is at the ground potential, and is rendered non-conductive. At this time, first word line driving n channel MOS transistor 921a in self boost circuit 921 has been conductive. However, since the local word line driving signal RXmn (m=0, 1, 2, 3; n=0, 1 . . . , 15) input to the drain electrode of the first word line driving n channel MOS transistor 921a is still at the ground potential, the potential WL of four word lines corresponding to the selected row decoder 810 is still at the ground potential.

Meanwhile, delay circuit 711 (FIG. 7) of master word line drive signal generating circuit 710 in word line drive signal generating circuit 700 receives row address strobe signal /RAS from RAS buffer 200, and provides a delay signal /RXT which changes from the H level to the L level after a prescribed time period from time $t_0$ at which the row address strobe signal attains to the L level. RXM generating circuit 712 in master word line drive signal generating circuit 710 receives the delay signal /RXT, either row address signal RA0 or /RA0 from row address buffer 300, and either row address signal $RA_1$ or /$RA_1$, and provides a master word line drive signal RXMm (m=0, 1, 2, 3), which rises from the ground potential to the boosted potential Vpp when these three received signals are at the H level, and which attains to the ground level if at least one of these three signals is at the L level. For example, when row address strobe signal /RAS falls to the L level, row address signal $RA_0$ is at the H level, /$RA_0$ is at the L level, $RA_1$ is at the H level and /$RA_1$ is at the L level, then only that RXM generating circuit 712 which receives row address signals $RA_0$ and $RA_1$ provides the master word line drive signal $RXM_0$ which is at the boosted potential Vpp, and remaining three RXM generating circuit 712 provide master word line drive signals $RXM_1$, $RXM_2$ and $RXM_3$ which are at the ground potential.

In local word line drive signal generating circuit 720 (FIG. 8) in word line drive signal generating circuit 700 receiving master word line drive signal RXMm (m=0, 1, 2, 3) from master word line drive signal generating circuit 710 and sub block selecting signal BSn (n=0, 1, 3 . . . , 15) from sub block selecting signal generating circuit 500, only one RX generating circuit 721 receiving master word line drive signal RXMm at the boosted potential Vpp and sub block selecting signal BSn at the H level provides a local word line drive signal RXmn which rises to the boosted potential Vpp at time $t_4$ (selected state) as shown in FIG. 13(i). Remaining 63 RX generating circuits 721 provide a local word line drive signal RXmn at the ground potential (non-selected state).

For example, when master word line drive signal $RXM_0$ is at the boosted potential Vpp and sub block selecting signal $BS_0$ is at the H level, only the local word line drive signal $RX_{000}$ is at the boosted potential Vpp, and other signals $RX_{001}$ to $RX_{015}$, $RX_{100}$ to $RX_{115}$, $RX_{200}$ to $RX_{215}$ and $RX_{300}$ to $RX_{315}$ are at the ground potential. When master word line drive signal $RXM_1$ is at the boosted potential Vpp and sub block selecting signal $BS_1$ is at the H level, only the local word line drive signal $RX_{101}$ is at the boosted potential Vpp and other signals $RX_{000}$ to $RX_{015}$, $RX_{100}$, $RX_{102}$ to $RX_{115}$, $RX_{200}$ to $RX_{215}$ and $RX_{300}$ to $RX_{315}$ are at the ground potential.

When one of the local word line drive signals $RX_{mn}$ rises to the boosted potential Vpp at time $t_4$, only one of the four self boost circuits 921 connected to the selected row decoder 810 (row decoder 810 providing the row decode signal RD of the boosted potential Vpp: FIG. 9) receives the local word line drive signal RXmn which rises to the boosted potential Vpp, at the drain electrode of the first word line driving n channel MOS transistor 921a which is conductive. The potential WL of the word line 910 connected to the source electrode of the first word line driving n channel MOS transistor 921a receiving at its drain the boosted potential Vpp rises from the ground potential as shown in FIG. 13 (j). Further, by the capacitive coupling by the gate capacitance of the first word line driving n channel MOS transistor 921a, the potential at the gate of the first word line driving n channel MOS transistor 921a attains at least Vpp+Vtn (Vtn represents the threshold voltage of n channel MOS transistor 921a), the local word line drive signal RXmn at the boosted potential Vpp is transmitted to word line 910, and the potential WL of word line 910 attains to the boosted potential Vpp (selected state) at time $t_5$ as shown in FIG. 13(j). Since remaining three self boost circuits 921 receive the local word line drive signal RXmn at the ground potential, the potential WL of word lines 910 connected to these self boost circuits 921 is kept at the ground potential (non-selected state) as shown in FIG. 13(j).

When the potential WL of word line 910 rises to the boosted potential Vpp, data which has been stored in memory cell 1511a is read to bit line 1510a or 1510b, generating potential difference between the bit lines. Sense amplifier 1513a amplifies the potential difference, and sets the bit line having lower potential to the ground potential and the bit line having the higher potential to the supply potential Vcc, as shown in FIG. 13(m).

When external address signals $A_0$ to $A_{11}$ are applied as shown in FIG. 13(c) and external column address strobe signal ext/CAS changes from the H level to the L level at time $t_6$ as shown in FIG. 13(b), then, in response, column address strobe signal /CAS provided from CAS buffer 1100 falls from the H level to the L level. Column address buffer 1200 receiving column address strobe signal /CAS latches address signals $A_0$ to $A_{11}$ as the column address, and provides column address signals $CA_0$, $/CA_0$ to $CA_{11}$, $/CA_{11}$. By partial decoders 1310, 1320, 1330, 1340 and 1350 in column predecoder 1300 receiving column address signals $CA_2$, $/CA_2$ to $CA_9$, $/CA_9$, based on column address signals $CA_2$, $/CA_2$ to $CA_9$, $/CA_9$, one of column predecode signals $Y_0$, $Y_1$, $Y_2$ and $Y_3$, one of $Y_4$, $Y_5$, $Y_6$ and $Y_7$, one of $Y_8$, $Y_9$ and $Y_{10}$ and $Y_{11}$, one of $Y_{12}$, $Y_{13}$, $Y_{14}$ and $Y_{15}$, and one of $Y_{16}$, $Y_{17}$, $Y_{18}$, and $Y_{19}$ are set to the H level.

As the column address strobe signal /CAS attains to the L level, I/O line precharge signal /PR attains to the H level as shown in FIG. 13(p). In I/O line precharge circuit 1518 (FIG. 12A) receiving the precharge signal /PR, p channel MOS transistors 1518a and 1518b are rendered non-conductive, and precharging of global I/O lines 1510e and 1510f to the supply potential Vcc is stopped.

1024 column decoders 1420 (FIG. 11) in column decoder group 1400 each receive one signal $Y_A$ of column predecode signals $Y_0$, $Y_1$, $Y_2$ and $Y_3$ from partial decoder 1310 of column predecoder 1300, one signal $Y_B$ of column predecode signals $Y_4$, $Y_5$, $Y_6$ and $Y_7$ from partial decoder 1320, one signal $Y_C$ out of column predecode signals $Y_8$, $Y_9$, $Y_{10}$ and $Y_{11}$ from partial decoder 1330, one signal $Y_D$ of column predecode signals $Y_{12}$, $Y_{13}$, $Y_{14}$ and $Y_{15}$ from partial decoder 1340, and one signal $Y_E$ of column predecode signals $Y_{16}$, $Y_{17}$, $Y_{18}$ and $Y_{19}$ from partial decoder 1350. Five column predecode signals $Y_A$, $Y_B$, $Y_C$, $Y_D$ and $Y_E$ received by one of 1024 column decoders 1420 are all at the H level, and at least one of the column predecode signals $Y_A$, $Y_B$, $Y_C$, $Y_D$ and $Y_E$ received by each of remaining 1023 column decoders 1420 is at the L level.

In that column decoder 1420 in which five column predecode signals $Y_A$, $Y_B$, $Y_C$, $Y_D$ and $Y_E$ are all at the H level, p channel MOS transistor 1420b is rendered non-conductive, n channel MOS transistors 1420c, 1420d, 1420e, 1420f and 1420g are all rendered conductive, node 1420a is connected to ground potential node 50b, and the potential at node 1420a attains to the ground potential. The p channel MOS transistor 1420j and the n channel MOS transistor 1420k receiving at their gate electrodes the ground potential at node 1420a are rendered conductive and non-conductive, respectively. The column selecting signal $CSL_1$ provided from output node 1420i to column selecting line 1410 attains to the H level of the amplitude of the supply potential Vcc at time $t_7$ as shown in FIG. 13(n). In remaining 1023 column decoders 1420, node 1420a is disconnected from ground potential node 50b, and by the p channel MOS transistors 1420h and 1420j constituting a cross coupled type circuit, the potential at node 1420a is kept at the supply potential Vcc and the column selecting signal $CSL_1$ provided from output node 1420i to column selecting line 1410 is kept at the L level (non-selected).

A pair of n channel MOS transistors 1515a and 1515b in the first I/O gate circuit 1515 (FIGS. 12A, 12B) receiving the column selecting signal CSL1 at the H level from column decoder 1420 are rendered conductive, while 1023 pairs of n channel MOS transistors 1515a and 1515b in the first I/O gate circuit 1515 receiving the column selecting signal CSL1 at the L level from column decoder 1420 are kept non-conductive. Through n channel MOS transistors 1515a and 1515b which are conductive, bit lines 1510a and 1510b are coupled to global I/O lines 1510e and 1510f, through local I/O lines 1510c and 1510d. The potential GIO of global I/O line 1510e or the potential /GIO of global I/O line 1510f connected to the bit line of the ground potential falls from the supply potential Vcc to the ground potential as shown in FIG. 13(q), and the potential difference between global I/O lines attain or exceeds a prescribed voltage at time $t_8$.

Preamplifier 1519 receives the potential GIO of global I/O line 1510e and the potential /GIO of 1510f, and provides data $D_0$, $D_1$, $D_2$ and $D_3$ which attain to the H level if GIO>/GIO and L level if GIO</GIO, at time $t_8$ as shown in FIG. 13(r). Selector 1600 receives data $D_0$, $D_1$, $D_2$ and $D_3$ provided from 0th to 3rd 4 Mbit blocks 1510, 1520, 1530 and 1540 as well as column address signals $CA_{10}$, $/CA_{10}$, $CA_{11}$ and $/CA_{11}$ from column address buffer 1200, selects one of four pieces of data $D_0$, $D_1$, $D_2$ and $D_3$ based on the logics of the column address signals $CA_{10}$, $/CA_{10}$, $CA_{11}$, and $/CA_{11}$, and provides the selected one as output data Dout. For example, when $CA_{10}$=L, $/CA_{10}$=H, $CA_{11}$=L and $/CA_{11}$=H, data $D_0$ is provided as output data Dout. When $CA_{10}$=L, $/CA_{10}$=H, $CA_{11}$=H and $/CA_{11}$=L, data $D_1$ is provided as output data Dout. When $CA_{10}$=H, $/CA_{10}$=L, $CA_{11}$=L and $/CA_{11}$=H, data $D_2$ is provided as output data Dout. When $CA_{10}$=H, $/CA_{10}$=L, $CA_{11}$=H and $/CA_{11}$=L, data $D_3$ is provided as output data Dout.

Figure 14:
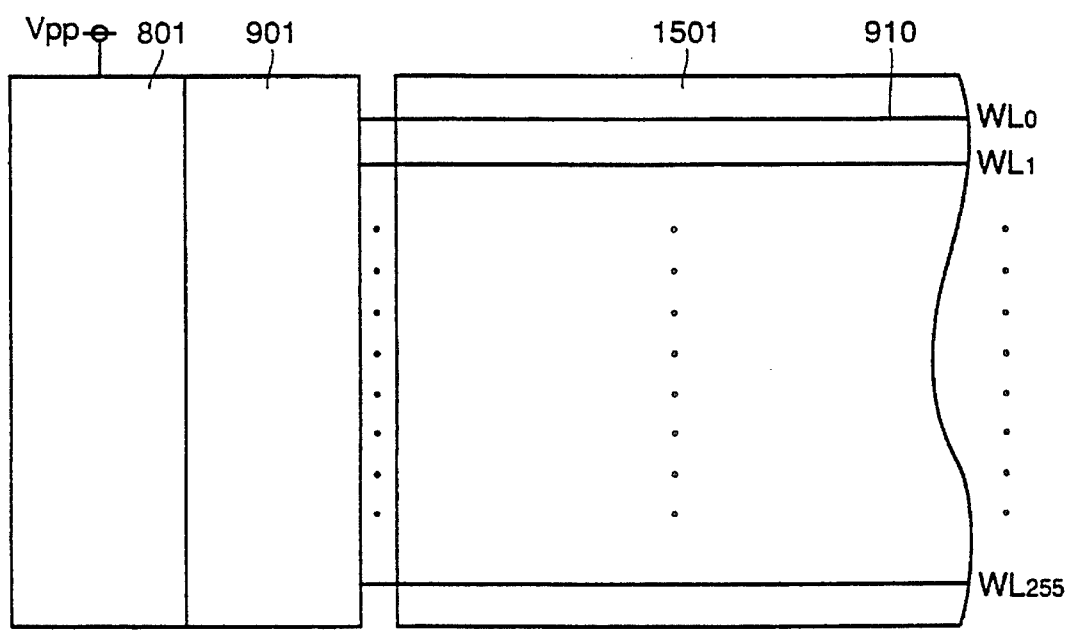
FIG. 14 is a schematic layout near the row decoder of Embodiment 1 of the present invention.
Figure 36:
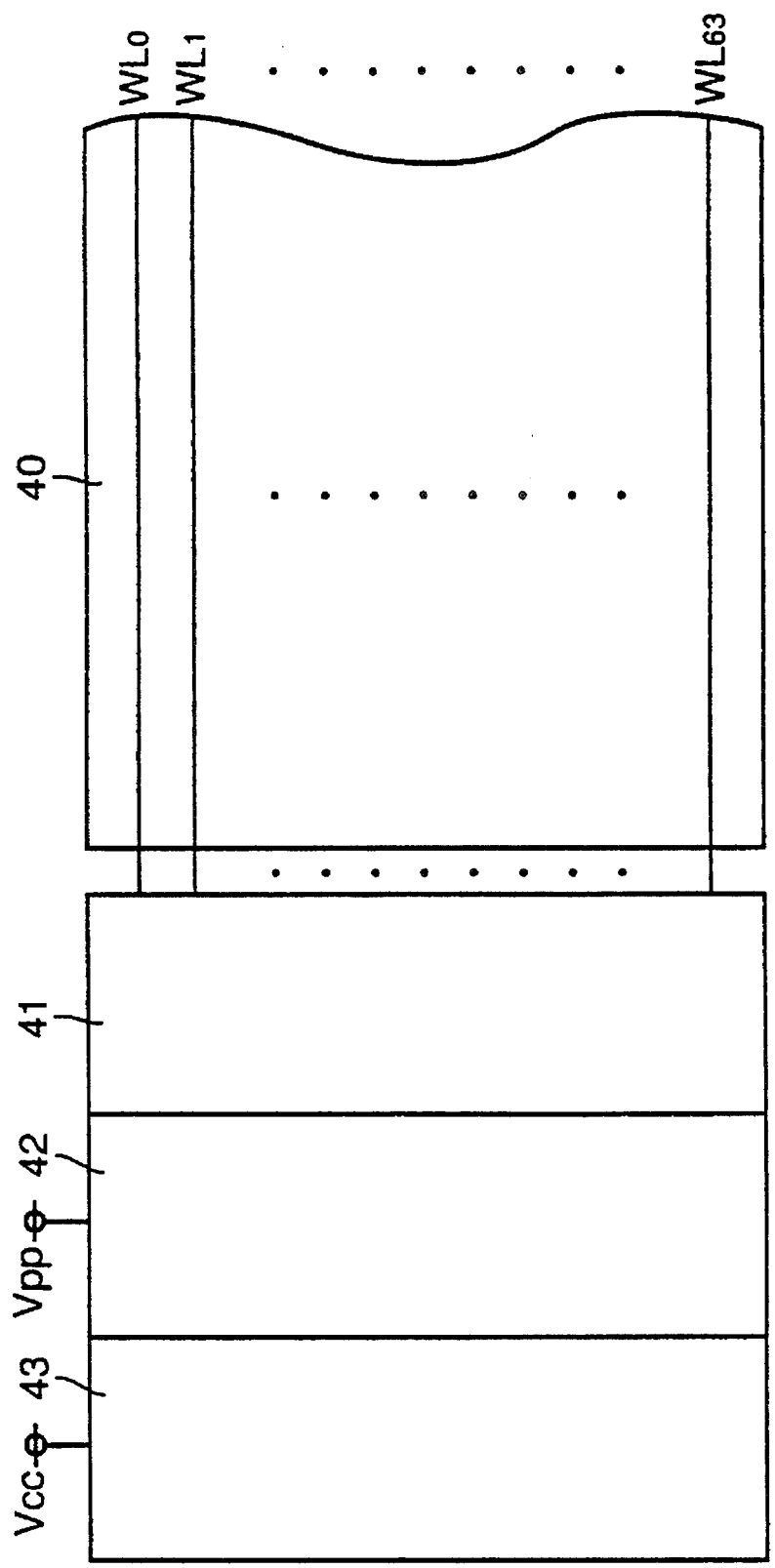
FIG. 36 is a schematic layout near the row decoder of the conventional DRAM.

Referring to FIG. 14, layout near the row decoder of the DRAM of Embodiment 1 will be described. FIG. 14 is a schematic diagram showing the layout near the row decoder in one sub block 1511. FIG. 14 shows an area 801 in which row decoders 810 are formed, an area 901 in which word drivers 920 are formed, and an area 1501 in which memory cell array 1511 is formed. As compared with the conventional device shown in FIG. 36, the area in which row decoders 810 are formed is reduced approximately to one half (level converting circuit becomes unnecessary), and the number of circuits for selecting the word lines 910 placed near the memory array forming area 1501 is reduced approximately to one third as compared with the prior art example (one level converted or boosted signal drives plurality of circuits, that is, a level converter is provided for a plurality of circuits). Consequently, layout area of the circuits for selecting the word lines 910 in an area near the memory cell array forming area 1501, where conditions for layout is severe because of narrow pitch of the word lines 910, can be reduced (it is not necessary to provide a row decoder for each word line).

By Embodiment 1, the following effects can be obtained.

(1) Since the row decode signal RD provided from row decoder 810 is adapted to have the amplitude of the boosted potential Vpp and the gate potential of the first word line driving n channel MOS transistor 921a in self boost circuit 921 of word driver 920 is set to a potential Vpp–Vtn (where Vtn is the threshold voltage of the third word line driving n channel MOS transistor 921c) than the supply potential Vcc, word line potential rises quickly.

(2) It is not necessary to provide such a circuit for converting a signal having the amplitude of supply potential Vcc to a signal having the amplitude of boosted potential Vpp as in the prior art between row decoder 810 providing row decode signal RD of the amplitude of boosted potential Vpp based on the row predecode signals $X_0$ to $X_{19}$ having the amplitude of supply potential Vcc and the word driver 920 receiving the row decode signal RD having the amplitude of the boosted potential Vpp, the layout area can be reduced. Since the level converting circuit is not necessary, the layout area can be reduced in the area near the memory cell array forming area 1501.

(3) In order to render non-conductive the p channel MOS transistor 811a having its source electrode connected to the boosted potential node 50c in row decoder 810, a local reset signal /RDPn having the amplitude of the boosted potential Vpp is used. The signal RDPn is output based on the predecode signals $X_{12}$ to $X_{19}$ and the row address strobe signals /RAS each having the amplitude of supply potential Vcc, and therefore it may seem, at one sight, that the circuit for converting a signal having the amplitude of supply potential Vcc to a signal having the amplitude of boosted potential Vpp is simply shifted from row decoder 810 to another circuit. However, since one local reset signal /RDPm is received by a plurality of (64× 4 blocks=256) row decoders 810 and each row decoder 810 does not include a level converter, the layout area can be reduced as a whole, and thus a highly integrated semiconductor memory device can be obtained.

(4) Since a bit line selecting signal BLIn having the amplitude of the boosted potential Vpp is input to the gate electrode of bit line selecting n channel MOS transistor 1512a in bit line gate circuit 1512, the potential of supply potential Vcc amplified by sense amplifier 1513a can be transmitted to memory cell 1511a without voltage drop of threshold voltage Vtn.

(5) Since it is not necessary to provide a circuit for converting a signal having the amplitude of supply potential Vcc to a signal having the amplitude of boosted potential Vpp between BLI generating circuit 1010 in bit line selecting signal generating circuit 1000 providing bit line selecting BLIn having the amplitude of boosted potential Vpp based on the sub block selecting signal BSn having the amplitude of supply potential Vcc and bit line gate circuit 1512 receiving the bit line selecting signal BLIn having the amplitude of the boosted potential Vpp, the layout area can be made small. Similar to row decoder 810, bit line selecting signal generating circuit 1000 is placed near memory cell array forming area 1501 (see FIG. 1A), and therefore layout area can be reduced especially in this area.

(6) In order to render non-conductive p channel MOS transistor 1011a having its source electrode connected to the boosted potential node 50c in BLI generating circuit 1010, a master reset signal /RDPM having the amplitude of the boosted potential Vpp is used. Since the signal /RDPM is provided based on the row address strobe signal /RAS having the amplitude of supply potential Vcc, it may seem at one sight that the circuit for converting a signal having the amplitude of supply potential Vcc to a signal having the amplitude of boosted potential Vpp is simply shifted from BLI generating circuit 1010 to another circuit. However, since one master reset signal /RDPM is input to a plurality of (16) BLI generating circuits 1010, the layout area can be reduced as a whole, and therefore a highly integrated semiconductor memory device can be obtained.

(7) Master reset signal /RDPM from master reset signal generating circuit 610 is not directly input to row decoder 810 but it is first divided into 16 local reset signals /RDPn. The number of MOS transistors receiving at their gates reset signal /RDPM or /RDPn in common can be reduced, and therefore capacitance (load) associated with the signal lines transmitting these reset signals is reduced. These signals /RDPM and /RDPn change quickly, and therefore a semiconductor memory device in which row selecting operation can be carried out at high speed is obtained. For example, when the reset signal /RDPM is directly input to row decoder 810, there will be associated gate capacitances of 64×16 sub blocks×4 blocks=4096 transistors. Since the reset signal /RDPM is divided into 16 local signals, the capacitance of the line transmitting the signal /RDPM is reduced to the gate capacitance of 2×16 /RDP generating circuits=32 transistors, and one local reset signal /RDPn is associated with the gate capacitance of only 64×1 sub block'4 blocks= 256 transistors.

(8) Since local reset signal /RDPn for the decoder changes quickly, p channel MOS transistor 811a in row decoder 810 is rendered non-conductive before n channel MOS transistors 813a, 813b, 813c and 813d are all rendered conductive, whereby through-current flowing through boosted potential node 50c to the ground potential node 50b can be suppressed, and thus a semiconductor memory device of low power consumption can be obtained.

Embodiment 2

Figure 15:
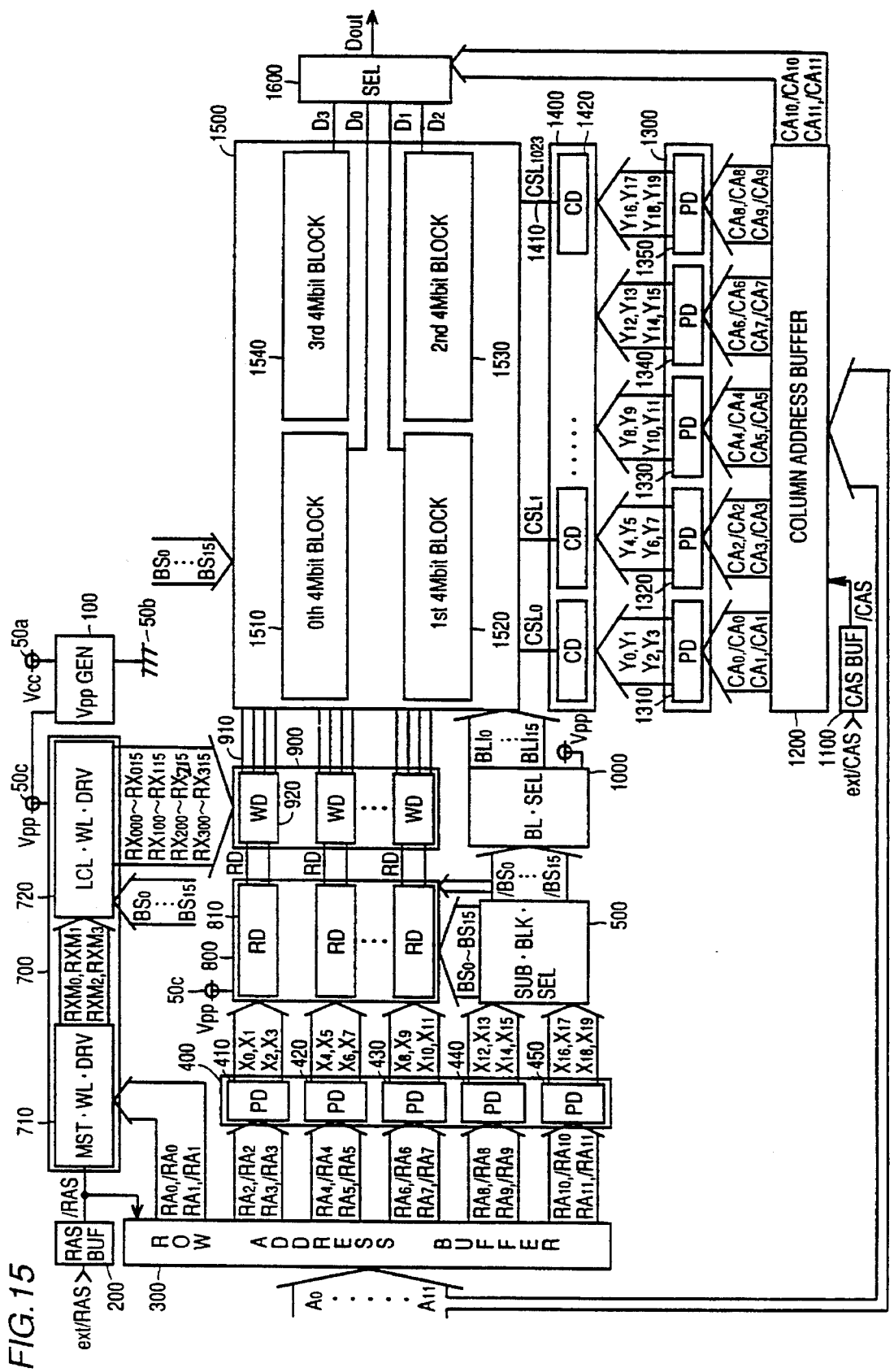
FIG. 15 is a block diagram showing Embodiment 2 of the present invention.

Embodiment 2 of the present invention will be described with reference to FIGS. 15 to 18. FIG. 15 is a block diagram showing, similar to FIG. 1, a 16 Mbit DRAM. The DRAM of Embodiment 2 shown in FIG. 15 differs from the DRAM of Embodiment 1 shown in FIG. 1 in that the reset signal generating circuit 600 is eliminated in Embodiment 2, and in specific circuit structure (FIG. 16) of sub block selecting signal generating circuit 500, specific circuit structure (FIG. 17) of row decoder 810 and specific circuit structure (FIG. 18) of bit line selecting signal generating circuit 1000. Circuits different from those of Embodiment 1 will be described.

Figure 16:
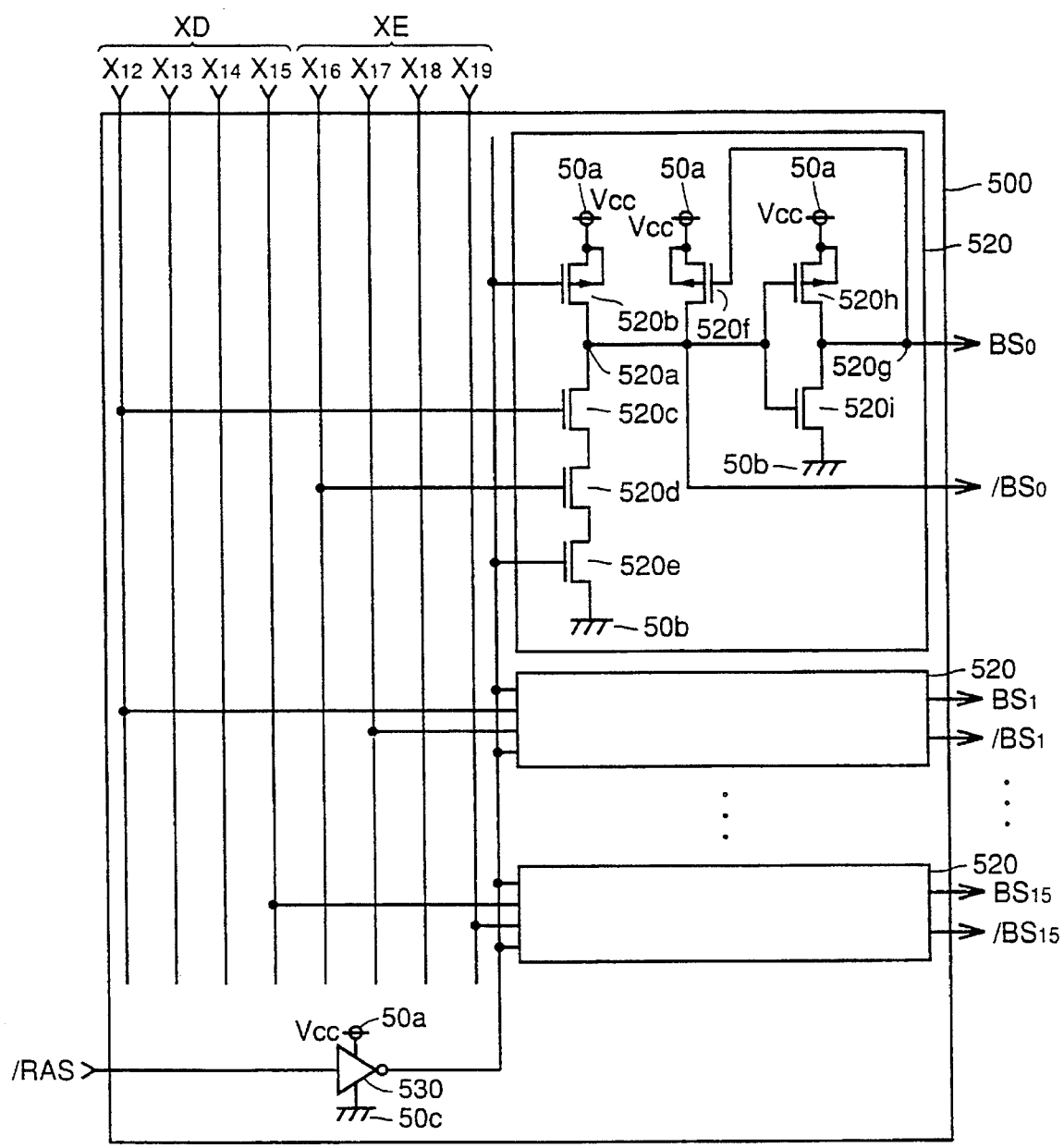
FIG. 16 is a schematic diagram of a sub block selecting signal generating circuit in Embodiment 2 of the present invention.

FIG. 16 is a schematic circuit diagram of sub block selecting signal generating circuit 500 shown in FIG. 15. Referring to FIG. 16, circuit 500 includes a BS generating circuit 520 providing complementary block selecting signals. BS generating circuit 520 receives one signal of row predecode signals $X_{12}$, $X_{13}$, $X_{14}$ and $X_{15}$ from partial decoder 440, one signal $X_E$ of row predecode signals $X_{16}$, $X_{17}$, $X_{18}$ and $X_{19}$ from partial decoder 450, and a signal having the complementary logic of the row address strobe signal /RAS provided from inverter 530, and provides a sub block selecting signal BSn and its inverted signal /BSn (n=0, 1, . . . , 15).

More specifically, BS generating circuit 520 operates with supply potential Vcc, receives row predecode signals $X_D$ and $X_E$ as well as row address strobe signal /RAS, and effects the following logic operation. When row address strobe signal /RAS is at the supply potential Vcc, then sub block selecting signal BSn is set to the L level and the signal /BSn is set to the H level, regardless of the row predecode signals $X_D$ and $X_E$. When row address strobe signal /RAS is at the ground potential and row predecode signals $X_D$ and $X_E$ are both at the H level, sub block selecting signal BSn is set to H level and /BSn is set to the L level, and if at least one of row predecode signals $X_D$ and $X_E$ is at the L level, then sub block selecting signal BSn is set to the L level and /BSn is set to the H level.

BS generating circuit 520 includes a p channel MOS transistor 520b connected between supply potential node 50a and node 520a and receiving at its gate electrode an inverted signal of row address strobe signal /RAS from inverter 530; an n channel MOS transistor 520c having its drain electrode connected to node 520a and receiving at its gate electrode the row predecode signal $X_D$; n channel MOS transistor 520d having its drain electrode connected to the source electrode of n channel MOS transistor 520c and receiving at its gate electrode the row predecode signal $X_E$; an n channel MOS transistor 520e connected between n channel MOS transistor 520d and the ground potential node 50b and receiving at its gate electrode the inverted signal of the row address strobe signal /RAS from inverter 530; a p channel MOS transistor 520f connected between supply potential node 50a and node 520a and having its gate electrode connected to an output node 520g providing the sub block selecting signal BSn; a p channel MOS transistor 520h connected between supply potential node 50a and output node 520a and having its gate electrode connected to node 520a; and an n channel MOS transistor 520i connected between output node 520g and ground potential node 50b and its gate electrode connected to node 520a. P channel MOS transistor 520h and n channel MOS transistor 520i constitute an inverter.

Figure 17:
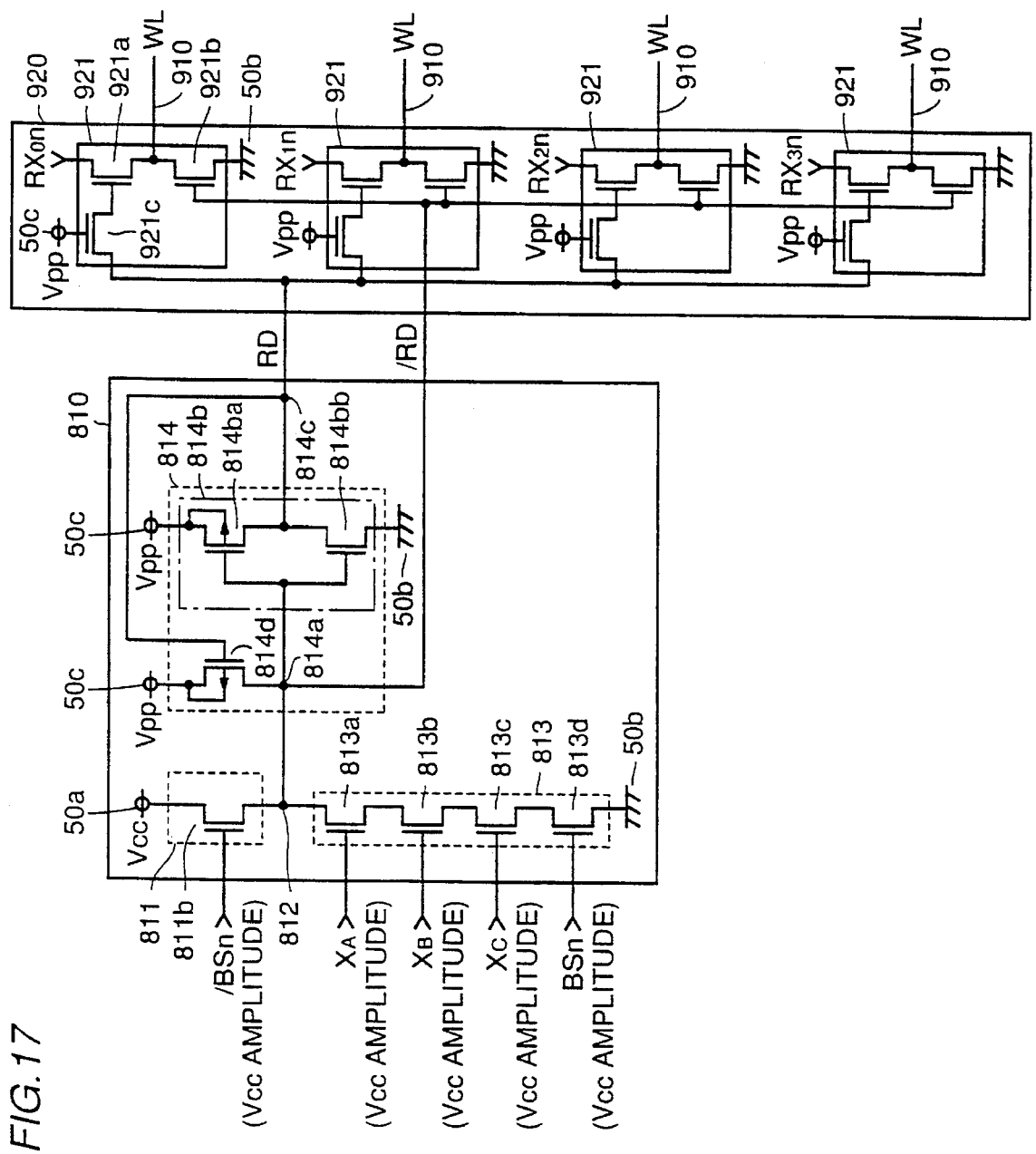
FIG. 17 is a schematic diagram of a row decoder and a word driver in Embodiment 2 of the present invention.

FIG. 17 is a schematic circuit diagram of row decoder 810 and word driver 920 in row decoder group 800 and word driver group 900 shown in FIG. 15. The circuit shown in FIG. 17 differs from the circuit of FIG. 9 in the structure of the pull up circuit 811. Pull up circuit 811 of row decoder 810 is connected not between the boosted potential node 50c and the first node 812 but connected between supply potential node 50a and the first node 812. In addition, the pull up circuit 811 includes an n channel MOS transistor 811b connected between supply potential node 50a and the first node 812 and receiving at its gate electrode the sub block selecting signal /BSn from sub block selecting signal generating circuit 500 as the reset signal for the decoder.

In row decoder 810, when row address strobe signal /RAS is at the standby state of H level, sub block selecting signal BSn is at the L level, signal /BSn is at the H level and n channel MOS transistor 813d is non-conductive. When the potential at first node 812 is held at the boosted potential Vpp and the potential at first output node 814c is held at the ground potential by the output holding circuit 814, then the source electrode of n channel MOS transistor 811b is on the side of supply potential node 50a (in n channel MOS transistor, the electrode having lower potential serves as the source electrode), gate-to-source voltage attains to zero and thus n channel MOS transistor 811b is rendered non-conductive. Even if the potential at first node 812 is at the boosted potential Vpp, through-current does not flow from the first node 812 to the ground potential node 50a through n channel MOS transistor 811b.

When the potential at first node 812 is at the ground potential, the source electrode of n channel MOS transistor 811b is on the side of the first node 812, and gate-to-source voltage becomes higher than the threshold voltage Vpu of n channel MOS transistor 811b. Consequently, n channel MOS transistor 811b is rendered conductive, charges are supplied to the first node 812 from supply potential node 50a, and the potential of first node 812 is raised. If the potential at first node 812 is raised to Vcc–Vpu, the gate-to-source voltage of n channel MOS transistor 811b does not exceed the threshold voltage Vpu, so that n channel MOS transistor 811b is rendered non-conductive. Inverter circuit 814b receiving the potential at first node 812 provides a L level signal to first output node 814c. The p channel MOS transistor 814d receiving at its gate electrode the potential at first output node 814c is rendered conductive, boosted potential node 50c is coupled to first node 812, and the potential at first node 812 attains to the boosted potential Vpp. Responsively, inverter 814b lowers the potential at first output node 814c to the ground potential, while the potentials at the first node 812 and at the first input node 814a are kept at Vpp and the potential at the first output node 814c is kept at the ground potential, respectively.

When the potential at first input node 814a in row decoder 810 is to be raised to the boosted potential Vpp, at first, charges are supplied from supply potential node 50a to the first input node 814a through n channel MOS transistor 811b. When the potential at first input node 814a exceeds Vcc–Vpu, n channel MOS transistor 811b is rendered non-conductive, and charges are supplied from boosted potential node 50c to first input node 814a through p channel MOS transistor 814d so as to raise the potential at the first input node to the boosted potential Vpp. Power consumption can be reduced as compared with the operation in which charges are supplied from boosted potential node 50c from the beginning to the end. Boosted potential Vpp is generated by boosted potential generating circuit 100 based on the supply potential Vcc. The efficiency of Vcc/Vpp conversion at the time of generation of Vpp is not 100% normally, but it is about one third. If 1 mW of power is consumed from supply potential Vcc for charge pump operation, for example, 1 mW power is consumed as a whole. If 1 mW of power is consumed from the boosted potential Vpp, extra 2 mW power is necessary to generate the boosted potential Vpp from the supply potential Vcc, resulting in consumption of a total of 3 mW power as a whole.

When row address strobe signal /RAS attains to the L level and is activated, sub block selecting signal BSn attains to the H level in response to the row address signal and the signal /BSn attains to the L level, then n channel MOS transistor 811b is rendered non-conductive, and transistor 813d is rendered conductive. When n channel MOS transistors 813a, 813b and 813c are all rendered conductive based on row predecode signals $X_A$, $X_B$ and $X_C$, the potential at first node 812 is lowered to the ground potential. Inverter circuit 814b receiving the potential at first node 812 sets the potential at first output node 814c to the boosted potential Vpp.

Figure 18:
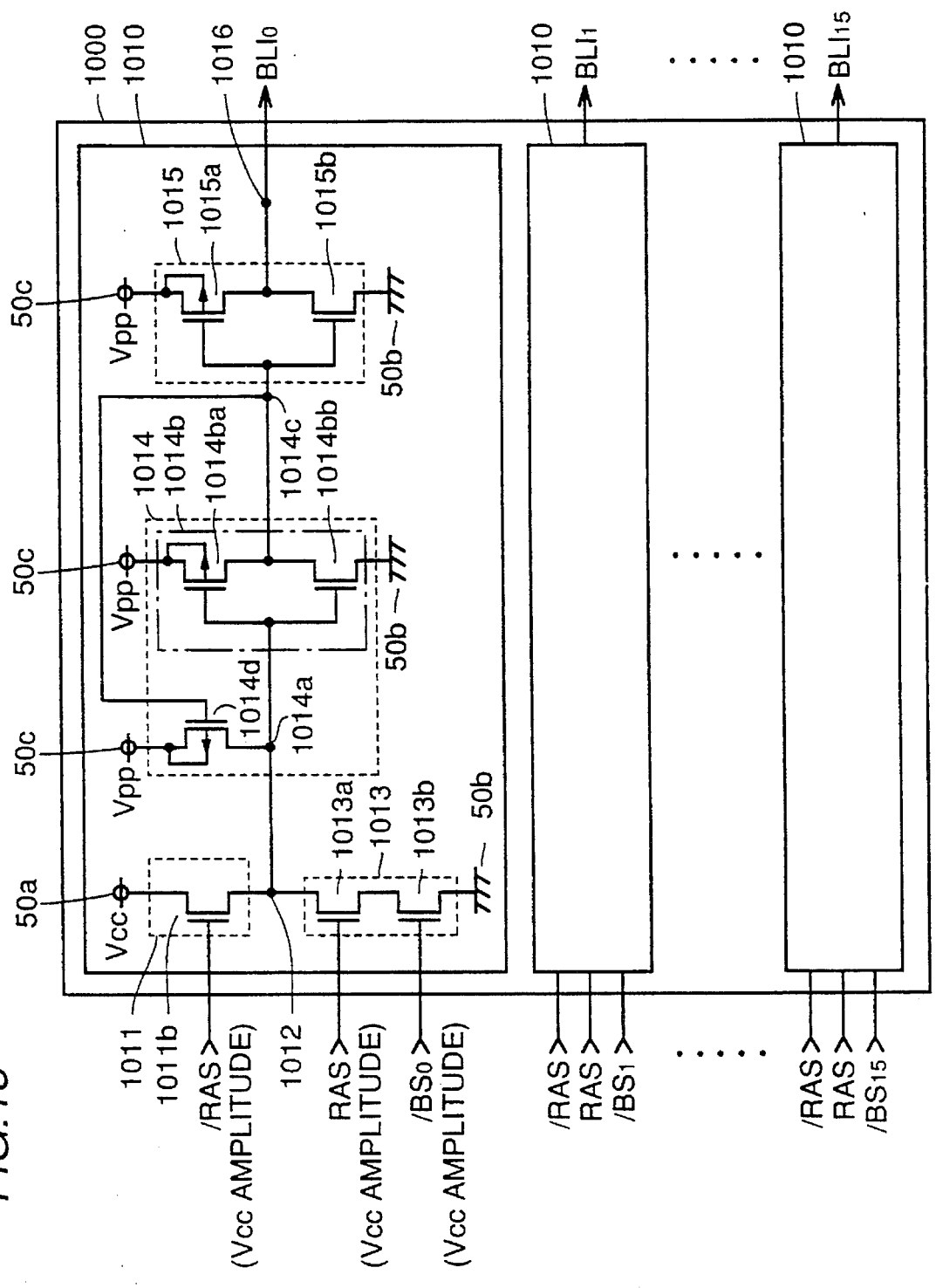
FIG. 18 is a schematic diagram of a bit line selecting signal generating circuit in Embodiment 2 of the present invention.

FIG. 18 is a schematic circuit diagram of bit line selecting signal generating circuit 1000 shown in FIG. 15. The circuit shown in FIG. 18 differs from the circuit of Embodiment 1 shown in FIG. 10 in the following three points: (a) pull up circuit 1010 in BLI generating circuit 1011 is connected not between boosted potential node 50c and first node 1012 but between supply potential node 50a and first node 1012; (b) pull up circuit 1011 includes an n channel MOS transistor 1011b connected between supply potential node 50a and first node 1012 and receiving at its gate the row address strobe signal /RAS from RAS buffer 200 as a reset signal; and (c) an inverted signal RAS of row address strobe signal /RAS is received by the gate electrode of n channel MOS transistor 1013a of pull down circuit 1013.

In BLI generating circuit 1010, when row address strobe signal /RAS is at the standby state of H level, the inverted signal RAS is at the L level, sub block selecting signal /BSn is at the H level and n channel MOS transistor 1013a is non-conductive. When the potential at first node 1012 is held at the boosted potential Vpp and the potential at first output node 1014c is held at the ground potential by output holding circuit 1014, then the source electrode of n channel MOS transistor 1011b is on the side of supply potential node 50a (in n channel MOS transistor, the electrode having lower potential serves as the source electrode), the gate-to-source voltage attains to zero and n channel MOS transistor 1011b is rendered non-conductive. Therefore, even if the potential at first node 1012 is at the boosted potential Vpp, through-current does not flow from first node 1012 to the supply potential node 50*a* through n channel MOS transistor 1011*b*.

If the potential at the first node 1012 is at the ground potential, the source electrode of n channel MOS transistor 1011*b* is on the side of first node 1012. Since the gate-to-source voltage is higher than the threshold voltage Vpu of n channel MOS transistor 1011*b*, n channel MOS transistor 1011*b* is rendered conductive, charges are supplied from supply potential node 50*a* to the first node 1012, and the potential at first node 1012 is raised. When the potential at the first node 1012 is raised to Vcc−Vpu, the gate-to-source voltage of n channel MOS transistor 1011*b* attains to the threshold voltage Vpu or lower, and therefore n channel MOS transistor 1011*b* is rendered non-conductive. Inverter circuit 1014*b* receiving the potential at first node 1012 provides an L level signal to first output node 1014*c*, and p channel MOS transistor 1014*b* receiving at its gate electrode the potential at the first output node 1014*c* is rendered conductive. Boosted potential node 50*c* is coupled to the first node 1012, and the potential at first node 1012 attains to the boosted potential Vpp. Inverter 1014*b* receiving this potential sets the potential at first output node 1014*c* to the ground potential, the potentials at first node 1012 and at first input node 1014*a* are held at Vpp, and the potential of first output node 1014*c* is held at the ground potential. Inverter 1015 receiving the potential at first output node 1014*c* provides a bit line selecting signal BLIn of the boosted potential Vpp from second output node 1016.

When row address strobe signal /RAS attains to the L level and is activated and the inverted signal of the row address strobe signal /RAS attains to the H level, then n channel MOS transistor 1011*b* is rendered non-conductive and n channel MOS transistor 1013*a* is rendered conductive. When sub block selecting signal /BSn attains to the H level in response to the row address signal, the potential at first node 1012 is lowered to the ground potential. Inverter circuit 1014*b* receiving the potential of the first node 1012 sets the potential at first output node 1014*c* to the boosted potential Vpp, while inverter 1015 receiving the potential of the first output node 1014*c* provides a bit line selecting signal BLIn of the ground potential from second output node 1016.

The DRAM of Embodiment 2 structured as described above carries out similar operation as the DRAM of Embodiment 1 shown in FIG. 13, except that master reset signal /RDPM and local reset signal /RDPn are not generated.

In addition to the advantage provided by Embodiment 1, Embodiment 2 provides the following advantages.

(1) It becomes not necessary to provide a circuit for generating a local reset signal /RDPn having the amplitude of the boosted potential Vpp in order to render non-conductive p channel MOS transistor 811*a* having its source electrode connected to the boosted potential node 50*c* in row decoder 810, layout area can be further reduced.

(2) It is not necessary to provide a circuit for generating a master reset signal /RDPM having the amplitude of boosted potential Vpp in order to render non-conductive p channel MOS transistor 1011*a* having its source electrode connected to boosted potential node 50*c* in BLI generating circuit 1010, layout area can be further reduced.

(3) The potential of the first input node 814*a* in row decoder 810 is raised to the boosted potential Vpp in two steps. More specifically, at first, charges are supplied from supply potential node 50*a* to the first input node 814*a* through n channel MOS transistor 811*b*, and when the potential at first input node 814*a* exceeds Vcc−Vpu, n channel MOS transistor 811*b* is rendered non-conductive, and the charges are supplied from boosted potential node 50*c* to the first input node 814*a* through p channel MOS transistor 814*d* so as to raise the potential at the first input node to the boosted potential Vpp. Therefore, as compared with the operation in which charges are supplied from boosted potential node 50*c* from the beginning to the end, power consumption can be reduced. The reduction in power consumption is also realized in BL generating circuit 1010.

Embodiment 3

Embodiment 3 of the present invention will be described with reference to FIGS. 19 and 20. The DRAM of Embodiment 3 differs from the DRAM of Embodiment 2 in the specific circuit structure (FIG. 19) of row decoder 810 and in specific circuit structure (FIG. 20) of bit line selecting signal generating circuit 1000. Circuits which are different from Embodiment 2 will be described.

Figure 19:
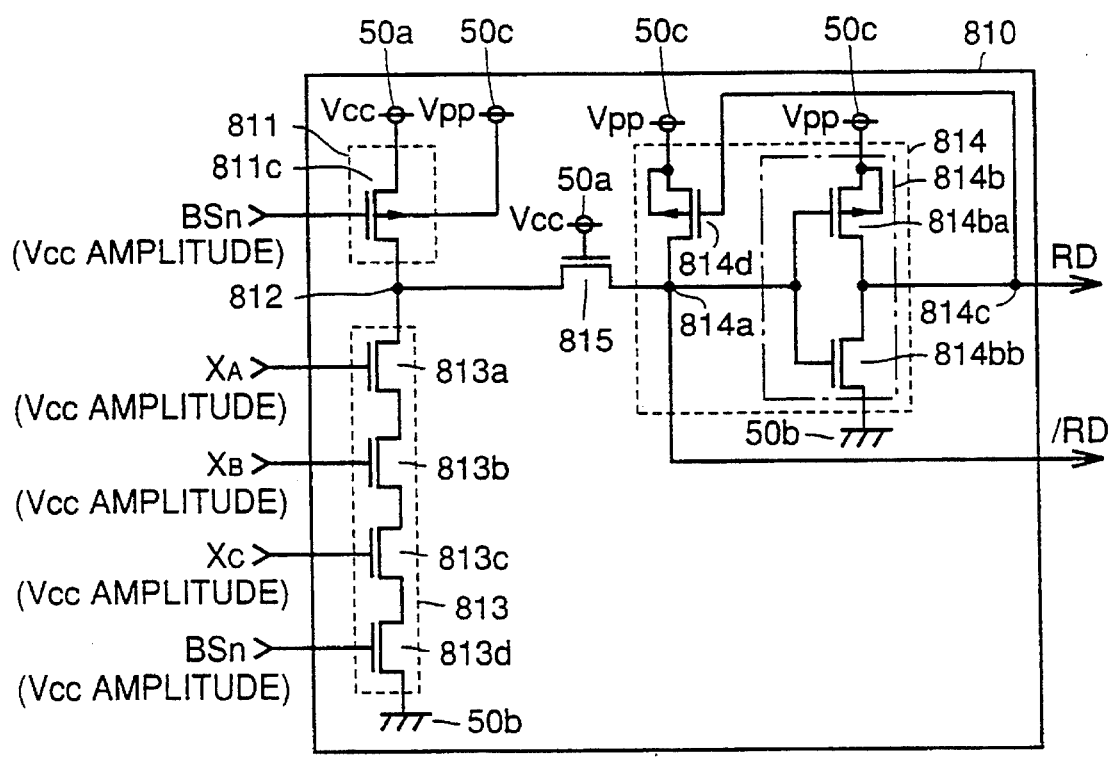
FIG. 19 is a schematic diagram of a row decoder in Embodiment 3 of the present invention.

FIG. 19 is a specific circuit diagram of row decoder 810. In this circuit shown in FIG. 19 also, as the row decoder 810 of Embodiment 2 shown in FIG. 17, pull up circuit 811 of row decoder 810 is connected not between boosted potential node 50*c* and first node 812 but between supply potential node 50*a* and first node 812. However, pull up circuit 811 includes a p channel MOS transistor 811*c* connected between supply potential node 50*a* and first node 812 and receiving at its gate electrode a sub block selecting signal BSn from sub block selecting signal generating circuit 500 as a reset signal and receives the boosted potential Vpp as a backgate potential. Further, it includes an n channel MOS transistor 815 between first node 812 and the first input node 814*a* of output holding circuit 814 with its gate electrode connected to supply potential node 50*a*.

In row decoder 810, when row address strobe signal /RAS is at the standby state of H level, then sub block selecting signal BSn is at the L level, p channel MOS transistor 813*d* is non-conductive, p channel MOS transistor 811*c* is conductive and the potential at the first node 812 is at the supply potential Vcc. When the potential at first input node 814*a* is held at the boosted potential Vpp and the potential at the first output node 814*c* is held at the ground potential by output holding circuit 814, the source electrode of n channel MOS transistor 815 is on the side of the first node 812, gate-to-source voltage attains to zero, and hence n channel MOS transistor 815 is rendered non-conductive. Even if the potential at first input node 814*a* is at the boosted potential Vpp, through-current does not flow from first input node 814*a* to the supply potential node 50*a* through p channel MOS transistor 811*c*.

When the potential at first input node 814*a* is at the ground potential, the source electrode of n channel MOS transistor 815 is on the side of the first input node 814*a*. Since gate-to-source voltage is higher than the threshold voltage Vpu of n channel MOS transistor 815, n channel MOS transistor 815 is rendered conductive, charges are supplied from supply potential node 50*a* through p channel MOS transistor 811*c* and n channel MOS transistor 815 to the first input node 814*a*, and hence the potential at the first input node 814*a* is raised. When the potential at the first input node 814*a* is raised to Vcc−Vpu, gate-to-source voltage of n channel MOS transistor 815 attains to be lower than the threshold voltage Vpu, and hence n channel MOS transistor 815 is rendered non-conductive. Inverter circuit 814*b* receiving the potential at first input node 814*a* provides an L level signal to first output node 814*c*. The p channel MOS transistor 814*d* receiving at its gate electrode the potential at first output node 814*c* is rendered conductive, and boosted potential node 50*c* is coupled to first input node 814*a*. The potential at first input node 814*a* attains to the boosted potential Vpp, inverter 814*b* sets the potential at first output node 814*c* to the ground potential, the potential at first input node 814*a* is held at Vpp and the potential at first output node 814*c* is held at the ground potential, respectively.

In this manner, when the potential at first input node 814*a* in row decoder 810 is to be raised to the boosted potential Vpp, at first charges are supplied from supply potential node 50*a* to the first input node 814*a* through p channel MOS transistor 811*c* and n channel MOS transistor 815, and when the potential at first input node 814 exceeds Vcc–Vpu, n channel MOS transistor 815 is rendered non-conductive. Thereafter, charges are supplied from boosted potential node 50*c* to the first input node 814*a* through p channel MOS transistor 814*d* so as to raise the potential at the first input node to the boosted potential Vpp. As compared with the operation in which charges are supplied from boosted potential node 50*c* from the beginning to the end, power consumption can be reduced as in Embodiment 2.

When row address strobe signal /RAS attains to the L level and is activated and sub block selecting signal BSn attains to the H level in response to the row address signal, p channel MOS transistor 811*c* is rendered non-conductive and n channel MOS transistor 813*d* is rendered conductive. When n channel MOS transistors 813*a*, 813*b* and 813*c* are all rendered conductive based on row predecode signals $X_A$, $X_B$, and $X_C$, the potential at first node 812 is lowered to the ground potential, and the potential of the first input node 814*a* is also lowered to the ground potential through n channel MOS transistor 815. Inverter circuit 814*b* receiving the potential of first input node 814*a* sets the potential at first output node 814*c* to the boosted potential Vpp.

Figure 20:
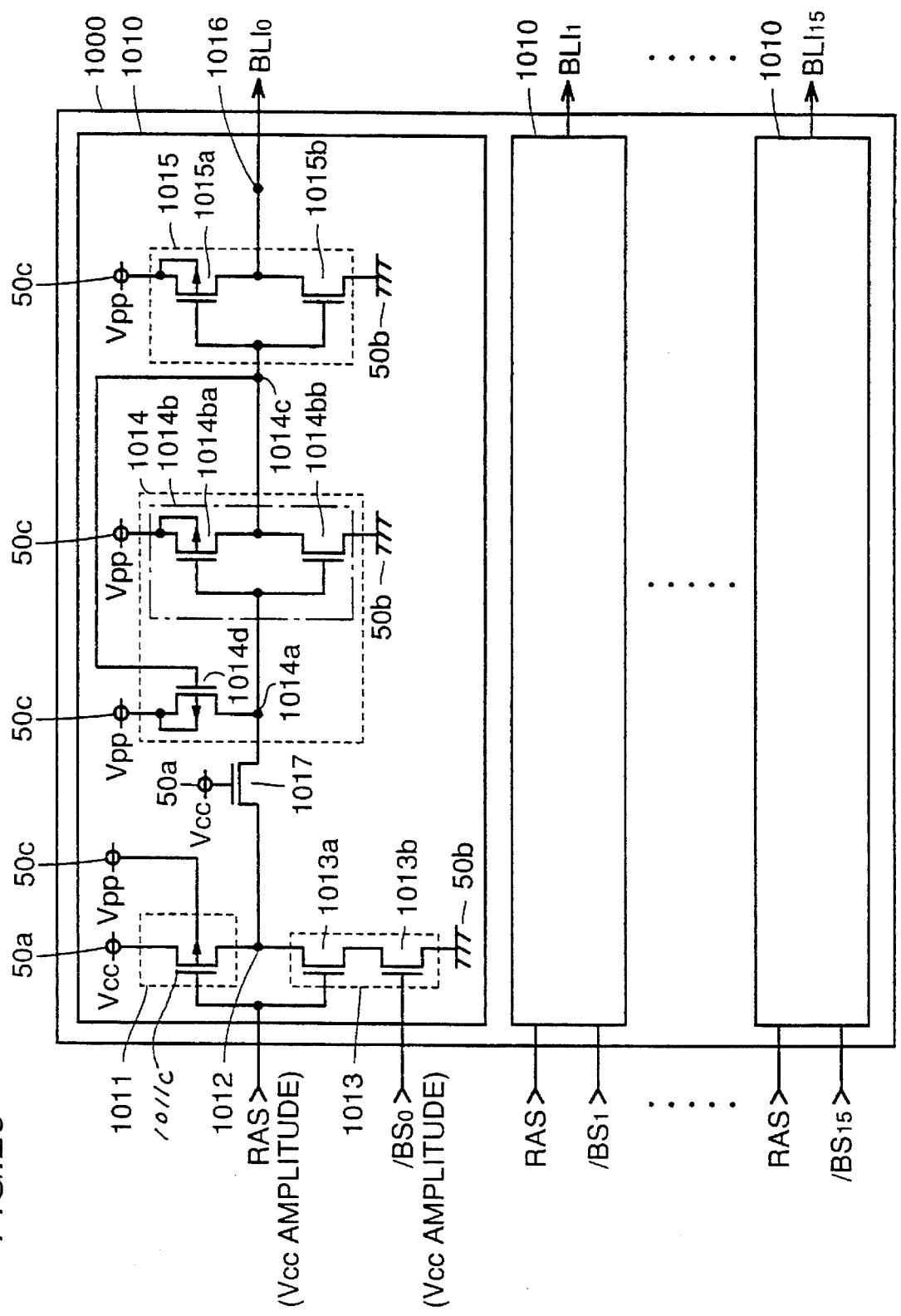
FIG. 20 is a schematic diagram of a bit line selecting signal generating circuit in Embodiment 3 of the present invention.

FIG. 20 is a specific circuit diagram of bit line selecting signal generating circuit 1000. As in the circuit of Embodiment 2 shown in FIG. 18, in bit line selecting signal generating circuit 1000 of Embodiment 3 shown in FIG. 20, pull up circuit 1011 in BLI generating circuit 1010 is connected not between boosted potential node 50*c* and the first node 1012 but between supply potential node 50*a* and the first node 1012. However, different from the circuit shown in FIG. 18, pull up circuit 1011 includes a p channel MOS transistor 1011*c* connected between supply potential node 50*a* and the first node 1012 and receiving at its gate electrode the inverted signal RAS of the row address strobe signal /RAS from RAS buffer 200 as a reset signal for the decoder. Further, it differs from the circuit of FIG. 18 in that it further includes an n channel MOS transistor 1017 between first node 1012 and the first input node 1014*a* of output holding circuit 1014 with its gate electrode connected to supply potential node 50*a*.

In BLI generating circuit 1010, when row address strobe signal /RAS is at the standby state of H level, then the inverted signal RAS is at the L level, and sub block selecting signal /BSn is at the H level. The n channel MOS transistor 1013*a* is non-conductive, p channel MOS transistor 1011*c* is conductive and the potential at the first node 1012 is at the supply potential Vcc. When the potential at first input node 1014*a* is held at the boosted potential Vpp and the potential at first output node 1014*c* is held at the ground potential by output holding circuit 1014, the source electrode of n channel MOS transistor 1017 is on the side of the first node 1012, and the gate-to-source voltage thereof attains to zero, whereby n channel MOS transistor is rendered non-conductive. Therefore, through-current does not flow from first input node 1014*a* to the supply potential node 50*a* through p channel MOS transistor 1011*c*.

When the potential at first input node 1014*a* is at the ground potential, the source electrode of n channel MOS transistor 1017 is on the side of the first input node 1014*a*, and the gate-to-source voltage is higher than the threshold voltage Vpu of n channel MOS transistor 1017. Consequently, n channel MOS transistor 1017 is rendered conductive, and charges are supplied from supply potential node 50*a* to first input node 1014*a* through p channel MOS transistor 1011*c* and n channel MOS transistor 1017. When the potential at first input node 1014*a* is raised, the gate-to-source voltage of n channel MOS transistor 1017 becomes not higher than the threshold voltage Vpu, and hence n channel MOS transistor 1017 is rendered non-conductive. Inverter circuit 1014*b* receiving the potential at the first input node 1014*a* provides an L level signal to the first output node 1014*c*. The p channel MOS transistor 1014*d* receiving at its gate electrode the potential at first output node 1014*c* is rendered conductive, the boosted potential node 50*c* is coupled to the first input node 1014*a*, and the potential at the first input node 1014*a* attains to the boosted potential Vpp. Inverter 1014*b* receiving the boosted potential Vpp of the first input node sets the potential at first output node 1014*c* to the ground potential, the potential at first input node 1014*a* is held at Vpp, and the potential at the first output node 1014*c* is held at the ground potential, respectively. Inverter 1015 receiving the potential at the first output node 1014*c* provides a bit line selecting signal BLIin of the boosted potential Vpp from second input node 1016.

When row address strobe signal /RAS is set to the active state of L level and the inverted signal RAS of the row address strobe signal /RAS attains to the H level, p channel MOS transistor 1011*c* is rendered non-conductive, and n channel MOS transistor 1013*a* is rendered conductive. When sub block selecting signal /BSn attains to the H level in response to the row address signal, the potential at first node 1012 is lowered to the ground potential, and the potential at first input node 1014*a* is also lowered to the ground potential through n channel MOS transistor 1017. Inverter circuit 1014*b* receiving the potential at first input node 1014*a* sets the potential at first output node 1014*c* to the boosted potential Vpp. Inverter 1015 receiving the potential at first output node 1014*c* provides a bit line selecting signal BLIn at the ground potential from the second output node 1016.

The DRAM of Embodiment 3 structured as described above carries out similar operation as the DRAM of Embodiment 1 shown in FIG. 13 except that master reset signal /RDPM and local reset signal /RDPn are not generated as in Embodiment 2.

Similar advantages as Embodiment 2 can be obtained by Embodiment 3.

Embodiment 4

Embodiment 4 of the present invention will be described with reference to FIGS. 21 and 22. The DRAM of Embodiment 4 differs from the DRAM of Embodiment 2 in specific circuit structure (FIG. 21) of row decoder 810 and specific circuit structure (FIG. 22) of bit line selecting signal generating circuit 1000. Circuits different from Embodiment 2 will be described.

Figure 21:
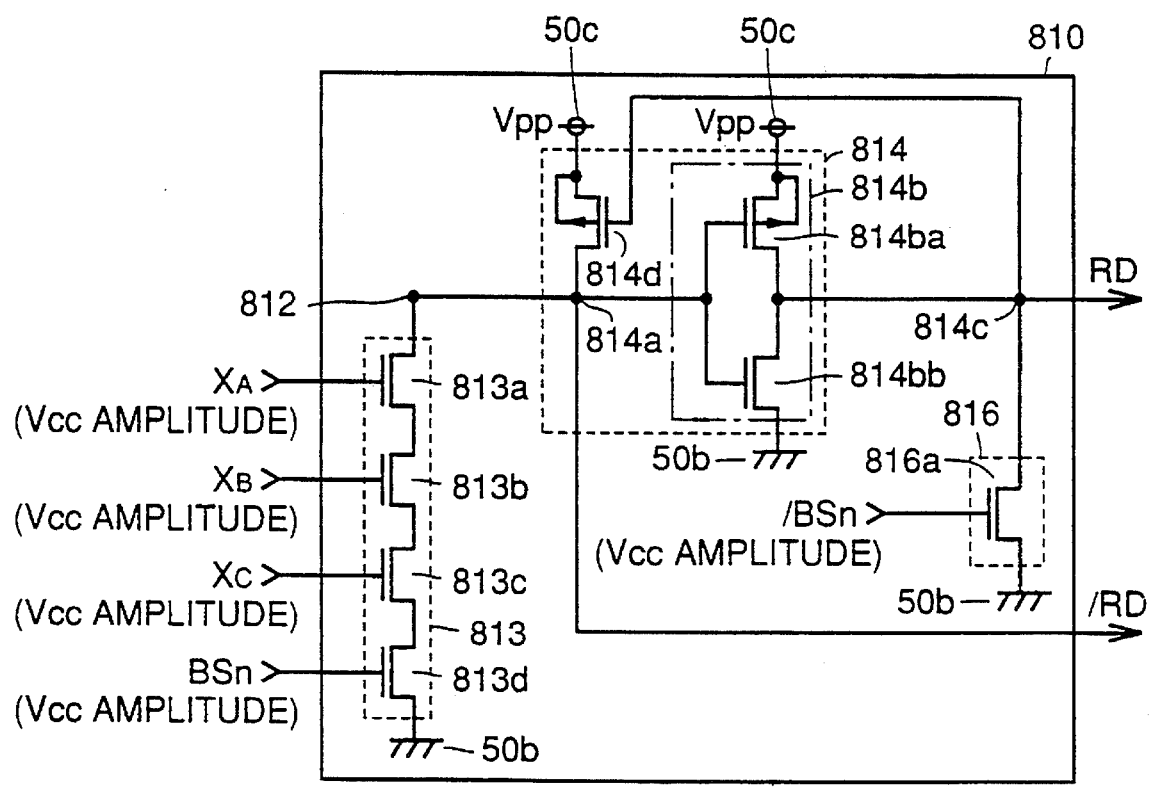
FIG. 21 is a schematic diagram of a row decoder in Embodiment 4 of the present invention.

FIG. 21 is a schematic circuit diagram of row decoder 810. The circuit shown in FIG. 21 differs from row decoder 810 of Embodiment 2 shown in FIG. 17 in the following points. Namely, (a) pull up circuit 811 of row decoder 810 is eliminated, and (b) it includes a second pull down circuit 816 which is connected between first output node 814*c* and ground potential node 50*b*, receives the sub block selecting signal /BSn and connects the first output node 814c to ground potential node 50b when the sub block selecting signal /BSn attains to the H level. Second pull down circuit 816 includes an n channel MOS transistor 816a connected between first output node 814c and ground potential node 50b and receiving at its gate electrode the sub block selecting signal /BSn.

In row decoder 810, when row address strobe signal /RAS is at the standby state of H level, sub block selecting signal BSn is at the L level and the signal /BSn is at the H level. The n channel MOS transistor 813d is non-conductive, n channel MOS transistor 816 is conductive, and the potential at first output node 814c is lowered to the ground potential through n channel MOS transistor 816a. The p channel MOS transistor 814d receiving the potential at first output node 814c is rendered conductive, and the potential of the first input node 814a is charged to the boosted potential Vpp. In inverter 814b receiving the boosted potential Vpp, p channel MOS transistor 814b is rendered non-conductive and n channel MOS transistor 814bb is rendered conductive.

When row address strobe signal /RAS is set to the active state of L level and the sub block selecting signals BSn and /BSn attain to the H level and the L level in response to the row address signals, respectively, n channel MOS transistor 816a is rendered non-conductive and n channel MOS transistor 813d is rendered conductive. When n channel MOS transistors 813a, 813b, and 813c are all rendered conductive based on row predecode signals $X_A$, $X_B$ and $X_C$, potentials at first node 812 and first input node 814a are lowered to the ground potential, and inverter circuit 814b receiving the potential at first input node 814a sets the potential at first output node 814c to the boosted potential Vpp.

Figure 22:
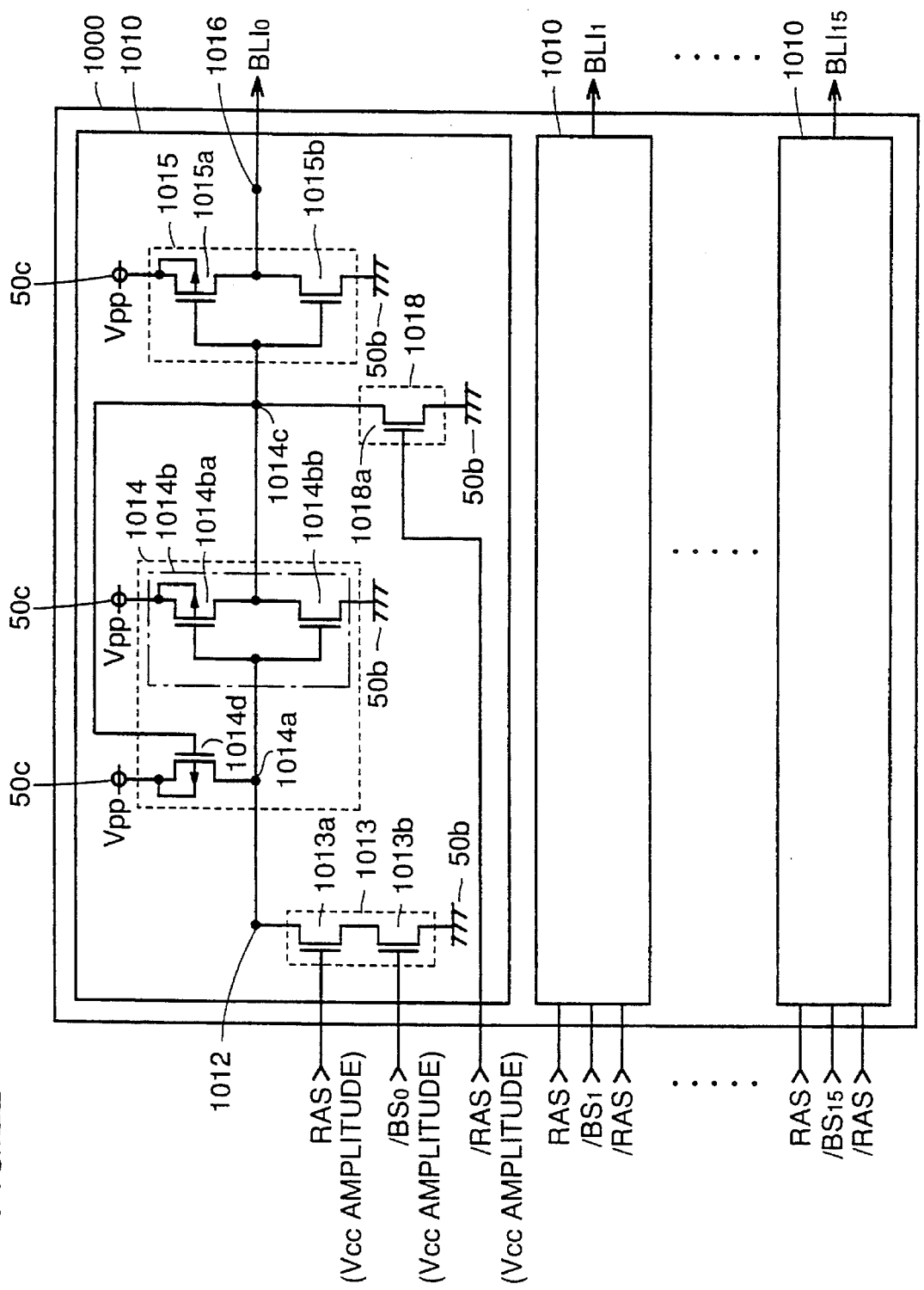
FIG. 22 is a schematic diagram of a bit line selecting signal generating circuit in Embodiment 4 of the present invention.

FIG. 22 is a specific circuit diagram of bit line selecting signal generating circuit 1000. Bit line selecting signal generating circuit 1000 shown in FIG. 22 differs from bit line selecting signal generating circuit 1000 of Embodiment 2 shown in FIG. 18 in the following points. Namely, (a) pull up circuit 1011 of BLI generating circuit 1010 is eliminated, and (b) a second pull down circuit 1018 is included which is connected between first output node 1014c and ground potential node 50b, receives row address strobe signal /RAS and couples the first output node 1014c to the ground potential node 50b when the row address strobe signal /RAS attains to the H level. Second pull down circuit 1018 includes an n channel MOS transistor 1018a connected between first output node 1014c and ground potential node 50b and receiving at its gate electrode the row address strobe signal /RAS.

In BLI generating circuit 1010, when row address strobe signal /RAS is at the standby state of H level, the inverted signal RAS is at the L level, sub block selecting signal /BSn is at the H level, n channel MOS transistor 1013a is non-conductive and n channel MOS transistor 1018a is conductive. The potential at first output node 1014c is lowered to the ground potential through n channel MOS transistor 1018a. The p channel MOS transistor 1014d receiving the potential at first output node 1014c is rendered conductive, and the potential at first input node 1014a is charged to the boosted potential Vpp. In inverter 1014b receiving Vpp, p channel MOS transistor 1014b is rendered non-conductive, and n channel MOS transistor 1014bb for the inverter is rendered conductive. Inverter 1015 receiving the potential at first output node 1014c provides a bit line selecting signal BLIin of the boosted potential Vpp from second output node 1016.

When row address strobe signal /RAS is set to the active state of L level and the inverted signal RAS of the row address strobe signal /RAS attains to the H level, n channel MOS transistor 1018a is rendered non-conductive and n channel MOS transistor 1013a is rendered conductive. When sub block selecting signal /BSn attains to the H level in response to the row address signal, the potentials at first node 1012 and at the first input node 1014a are lowered to the ground potential. Inverter circuit 1014b receiving the potential of first input node 1014a sets the potential at first output node 1014c to the boosted potential Vpp. Inverter 1015 receiving the potential at first output node 1014c provides a bit line selecting signal BLIn of the ground potential from second output node 1016.

The DRAM of Embodiment 4 structured as described above effects similar operation as the DRAM of Embodiment 1 shown in FIG. 13, except that master reset signal /RDPM and local reset signal /RDPn are not generated as in the circuit of Embodiment 2. The structure of Embodiment 4 provides similar effects as Embodiment 2.

Embodiment 5

Embodiment 5 of the present invention will be described with reference to FIGS. 23 and 24. The DRAM of Embodiment 5 differs from the DRAM of Embodiment 4 in specific circuit structure (FIG. 23) of row decoder 810 and in specific circuit structure (FIG. 24) of bit line selecting signal generating circuit 1000. Circuits different from Embodiment 4 will be described.

Figure 23:
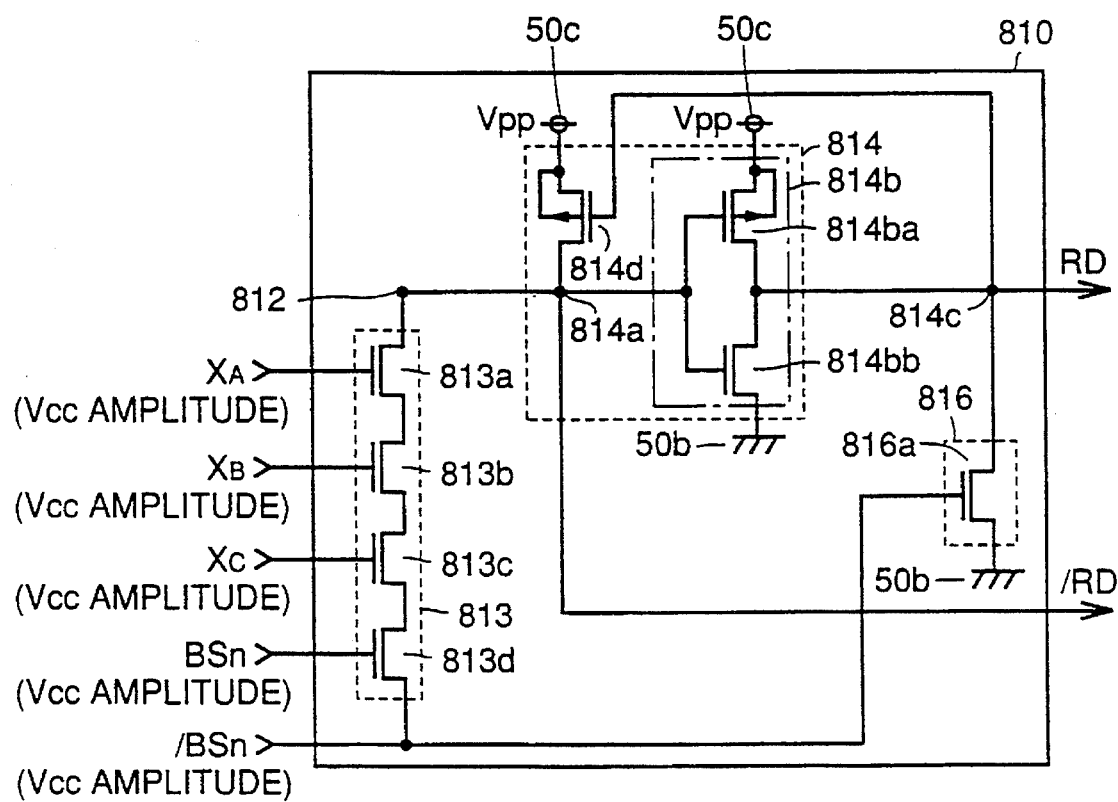
FIG. 23 is a schematic diagram of a row decoder in Embodiment 5 of the present invention.

FIG. 23 is a specific circuit diagram of row decoder 810. The circuit shown in FIG. 23 differs from row decoder 810 of Embodiment 4 shown in FIG. 21 in the following points. Namely, (a) the source electrode of n channel MOS transistor 813d in pull down circuit 813 of row decoder 810 is not directly connected to the ground potential node 50b but is connected to receive the sub block selecting signal /BSn. More specifically, the source electrode of n channel MOS transistor 813d is connected to the ground potential node through an n channel MOS transistor 520i of sub block selecting signal generating circuit 500 shown in FIG. 16 providing the sub block selecting signal /BSn.

Though the structure is slightly different, row decoder 810 of Embodiment5 operates similarly as row decoder 810 of embodiment 4. More specifically, at the standby state, the signal /BS is at the H level and the signal BS is at L level. The node 814c is kept at ground potential through transistor 816a and the node 812 is kept at Vpp through transistor 814d. Transistor 813d is off. In operation, when the signal BS attains to the H level, the signal /BS attains to the L level and transistor 816a turns off.

Figure 24:
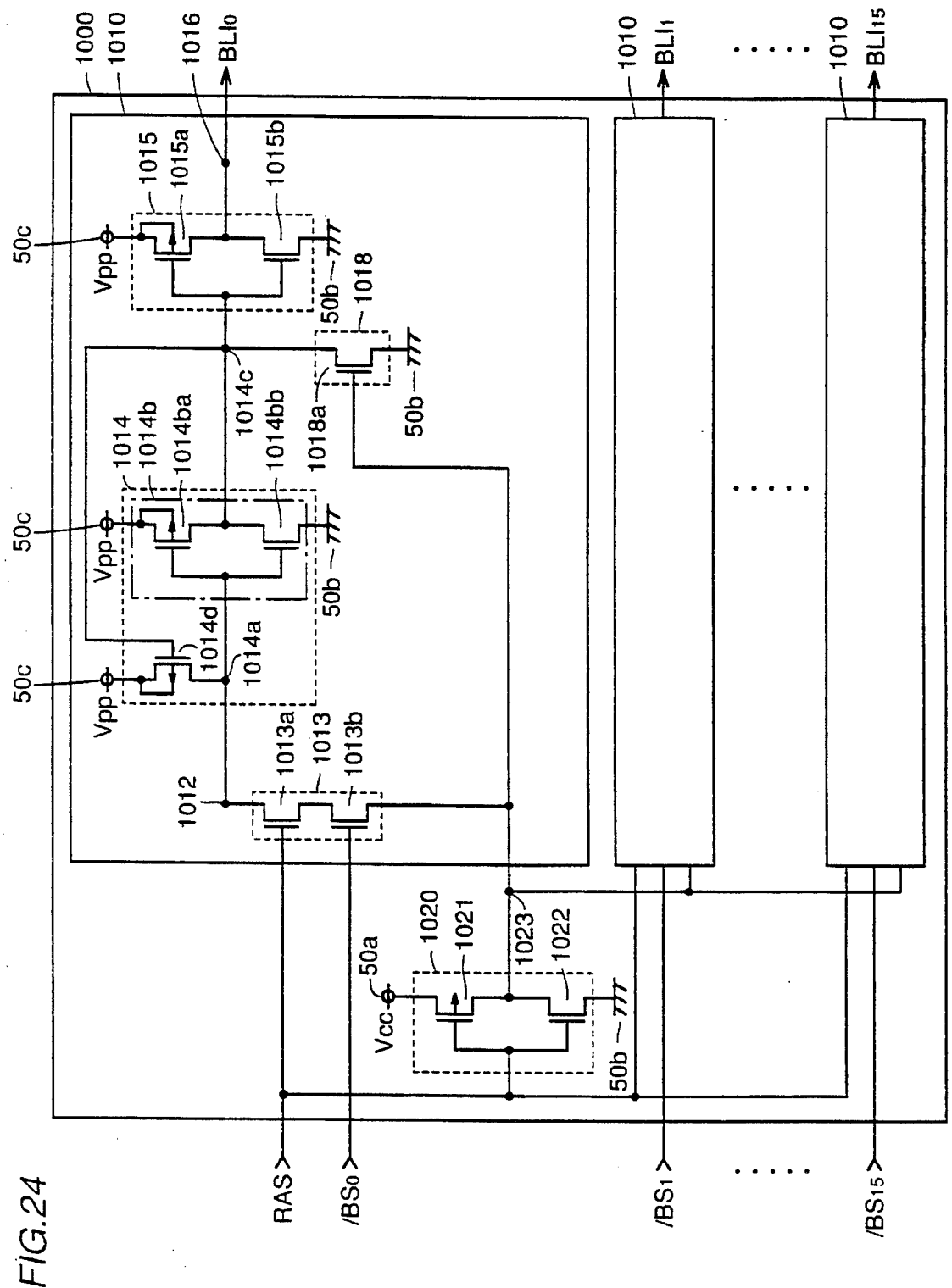
FIG. 24 is a schematic diagram of a bit line selecting signal generating circuit in Embodiment 5 of the present invention.

FIG. 24 is a specific circuit diagram of bit line selecting signal generating circuit 1000. The circuit shown in FIG. 24 differs from bit line selecting signal generating circuit 1000 of Embodiment 4 shown in FIG. 25 in the following points. Namely (a) the gate electrode of n channel MOS transistor 1018a in second pull down circuit 1018 is connected to an output node 1023 of inverter circuit 1020 receiving at the input, the inverted signal RAS of the row address strobe signal /RAS, and (b) the source electrode of n channel MOS transistor 1013b of BLI generating circuit 1010 is not directly connected to ground potential node 50b but connected to the ground potential node 50b through n channel MOS transistor 1022 of inverter circuit 1020.

Though structures differ slightly, bit line selecting signal generating circuit 1000 shown in FIG. 24 operates similarly as bit line selecting signal generating circuit 1000 of Embodiment 4. When signal RAS is at the L level, transistor 1018a is turned on by inverter 1020, so that node 1014c is pulled down to the ground potential. When the signal RAS attains to the H level and the signal /BSn attains to the H level, transistor 1018a turns off, node 1012 is set to the ground potential and node 1014c attains to the Vpp level.

The DRAM of Embodiment 5 structured as described above effects similar operation as the circuit of Embodiment 4.

The DRAM of Embodiment 5 provides similar advantages as Embodiment 2.

Embodiment 6

Embodiment 6 of the present invention will be described with reference to FIG. 25. The DRAM of Embodiment 6 differs from the DRAMs of Embodiments 1 to 5 in the specific circuit structure (FIG. 25) of word driver circuit 920. The circuit different from Embodiments 1 to 5 will be described.

Figure 25:
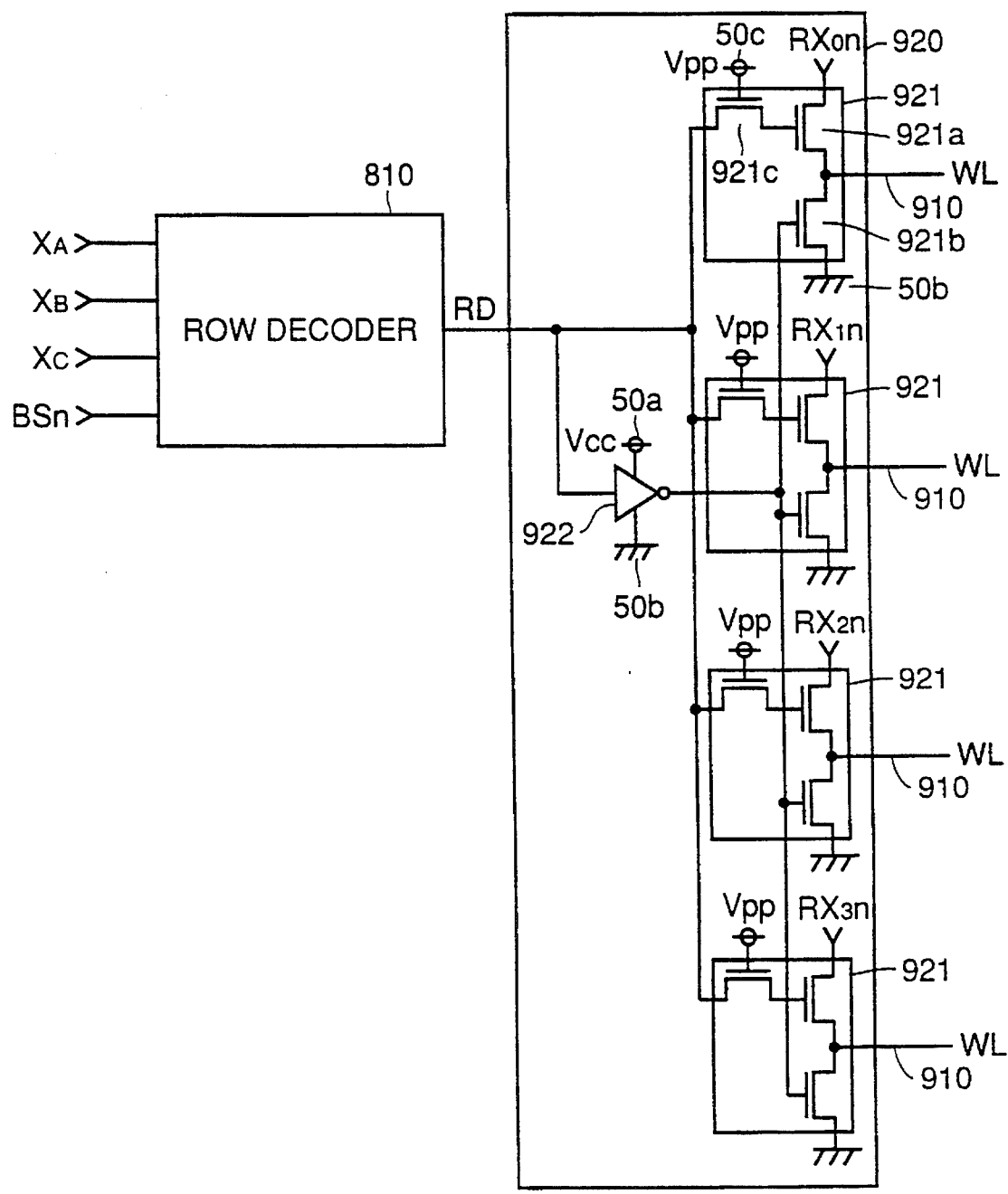
FIG. 25 is a schematic diagram of a row decoder and a word driver in Embodiment 6 of the present invention.

FIG. 25 is a specific circuit diagram of word driver 920 of the DRAM of Embodiment 6. Any one of row decoders 810 in the DRAMs of Embodiments 1 to 5 may be used as row decoder 810. Word driver 920 of the DRAM of Embodiment 6 differs from the word driver 920 in the DRAMs of Embodiments 1 to 5 in the following points.

(a) row decoder 810 does not receive row decode signal /RD (of the amplitude of Vpp) but receives only the row decode signal RD, (b) an inverter circuit 922 receiving row decode signal RD of row decoder 810 is newly provided on the input side. In place of row decode signal /RD, an output of amplitude of Vcc from inverter circuit 922 operating with Vcc power supply is used. It is required of transistor 921b to pull down the word line 910 to the ground potential, and the signal at the gate electrode thereof may have the amplitude of Vcc. When the potential of word line 910 is at Vpp, transistor 921b receives from inverter 922 an L level signal at its gate electrode, and turns off.

The DRAM of Embodiment 6 structured as described above carries out similar operation as that of Embodiments 1 to 5.

The DRAM provides similar effects as the DRAMs of Embodiments 1 to 5.

Embodiment 7

Figure 26:
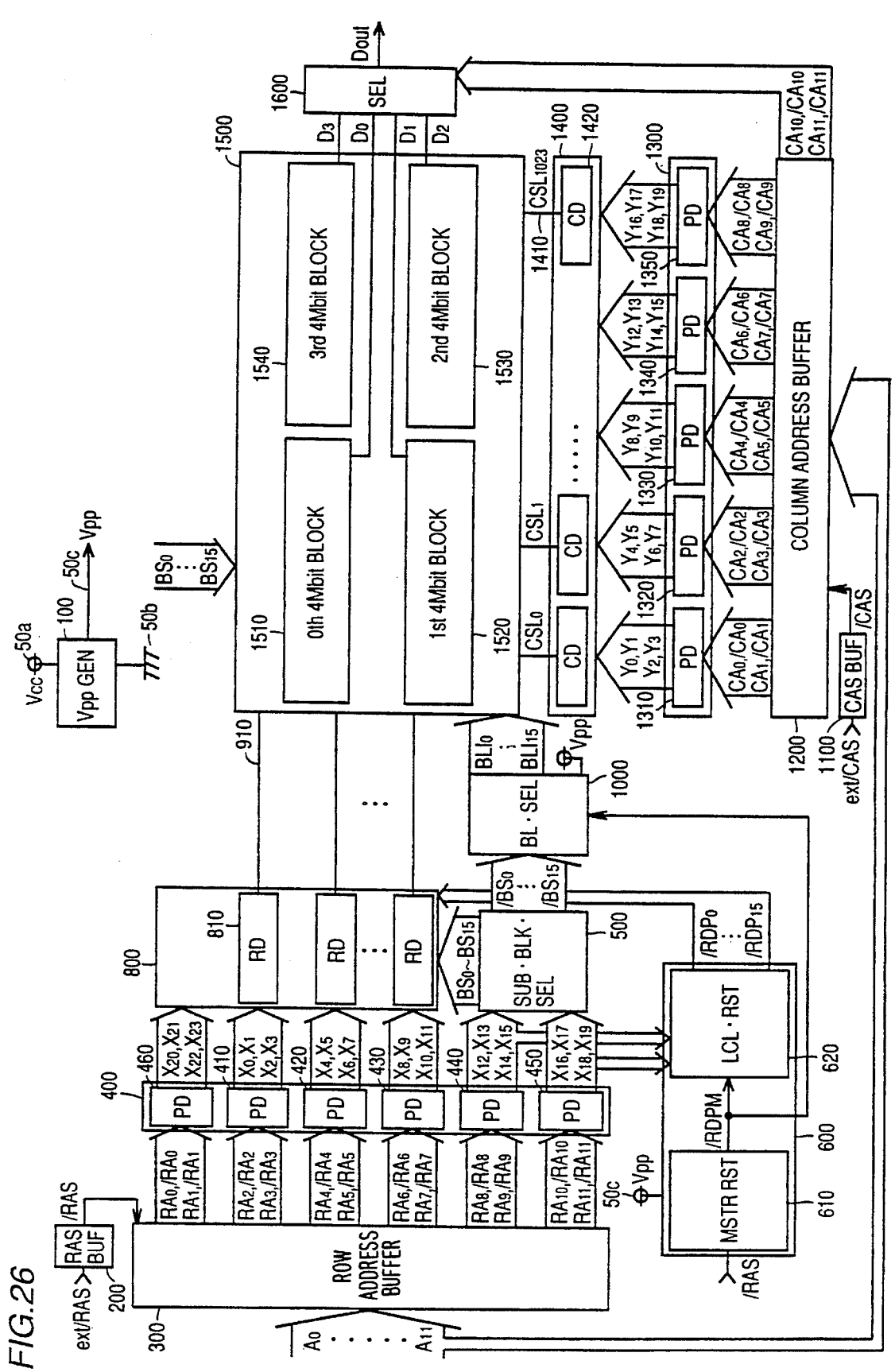
FIG. 26 is a block diagram showing Embodiment 7 of the present invention.

Embodiment 7 of the present invention will be described with reference to FIGS. 26 and 27. FIG. 26 is a block diagram showing the DRAM of Embodiment 7. The DRAM shown in FIG. 26 differs from the DRAM of Embodiment 1 in the following points, namely, (a) word line drive signal generating circuit 700 and word driver group 900 are eliminated, (b) row predecoder 400 includes partial row decoder 460 which receives row address signals $RA_0$, /$RA_0$, $RA_1$, /$RA_1$ and provides predecode signals $X_{20}$, $X_{21}$, $X_{22}$ and $X_{23}$ one of which attains to the H level based on the received signals, and (c) row decoder 810 has different circuit structure (FIG. 27).

Figure 27:
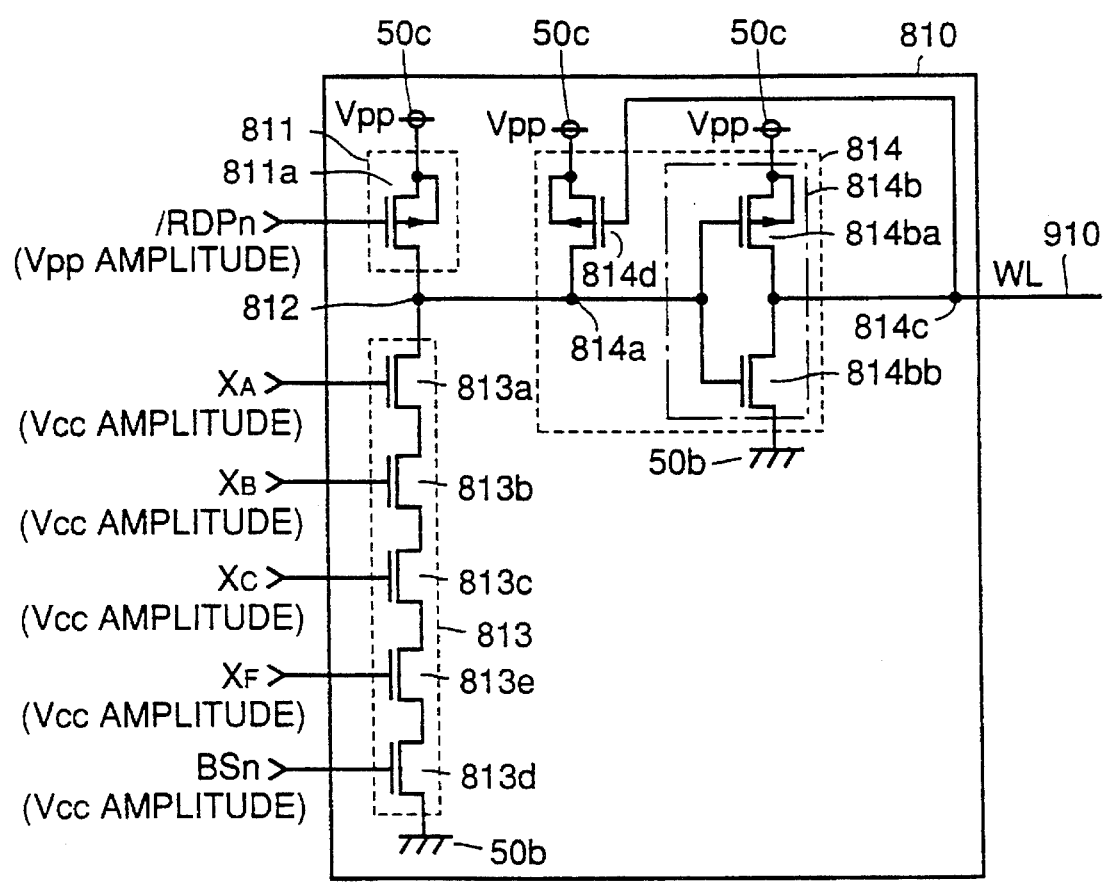
FIG. 27 is a schematic diagram of a row decoder in Embodiment 7 of the present invention.

FIG. 27 is a specific circuit diagram of row decoder 810 in the DRAM of Embodiment 7. Row decoder 810 shown in FIG. 27 differs from row decoder 810 of the DRAM of Embodiment 1 shown in FIG. 9 in that row decoder 810 of FIG. 27 additionally receives one signal $X_F$ of row predecode signals $X_{20}$, $X_{21}$, $X_{22}$ and $X_{23}$ from partial decoder 460 of row predecoder 400. Row decoder 810 newly includes an n channel MOS transistor 813e connected between n channel MOS transistors 813c and 813d and receiving at its gate electrode, the row predecode signal $X_F$. Further, word line 910 is directly connected to first output node 814c, and word driver 920 shown in FIG. 9 is eliminated.

In row decoder 810 of the DRAM of Embodiment 7, when row address strobe signal /RAS is at the standby state of H level, then local reset signal /RDPn is at the ground potential, sub block selecting signal BSn is at the ground potential, potentials at first node 822 and first input node 814a are set to the boosted potential Vpp and the potential WL of word line 910 connected to first output node 814c is set to the ground potential. When row address strobe signal /RAS is at the active state of L level, in the sub block selected based on the row address signals, local reset signal /RDP is set to the boosted potential Vpp and sub block selecting signal BSn is set to the supply potential Vcc. Further, only in that row decoder 810 in which four row predecode signals $X_A$, $X_B$, $X_C$ and $X_F$ are all at the supply potential Vcc based on the row address signals, potentials at the first node 812 and the first input node 814 attain to the ground potential and the potential WL of word line 910 connected to first output node 814c attains to the boosted potential Vpp. In row decoder 810 in which at least one of four row decode signals $X_A$, $X_B$, $X_C$ and $X_F$ is at the L level in the selected sub block and in row decoder 810 in the non-selected sub blocks (in which signal BSn is at the L level), the potentials at first node 812 and at first input node 814a are kept at the boosted potential Vpp and the potential WL of word line 910 is held at the ground potential.

After the selection of word line 910, the DRAM of Embodiment 7 structured as described above operates similarly as the DRAM of Embodiment 1.

Embodiment 7 provides the following advantages.

(1) Since word line 910 is directly connected to the first output node 814 which attains to the boosted potential Vpp or the ground potential based on the row address signals, in row decoder 810, it becomes unnecessary to consider the timing condition that the local word line drive signal RXmn must be raised to the boosted potential Vpp after the rise of the potential at first output node 814c to the boosted potential Vpp for self boost operation, and therefore word line can be selected quickly.

Embodiment 8

Figure 28:
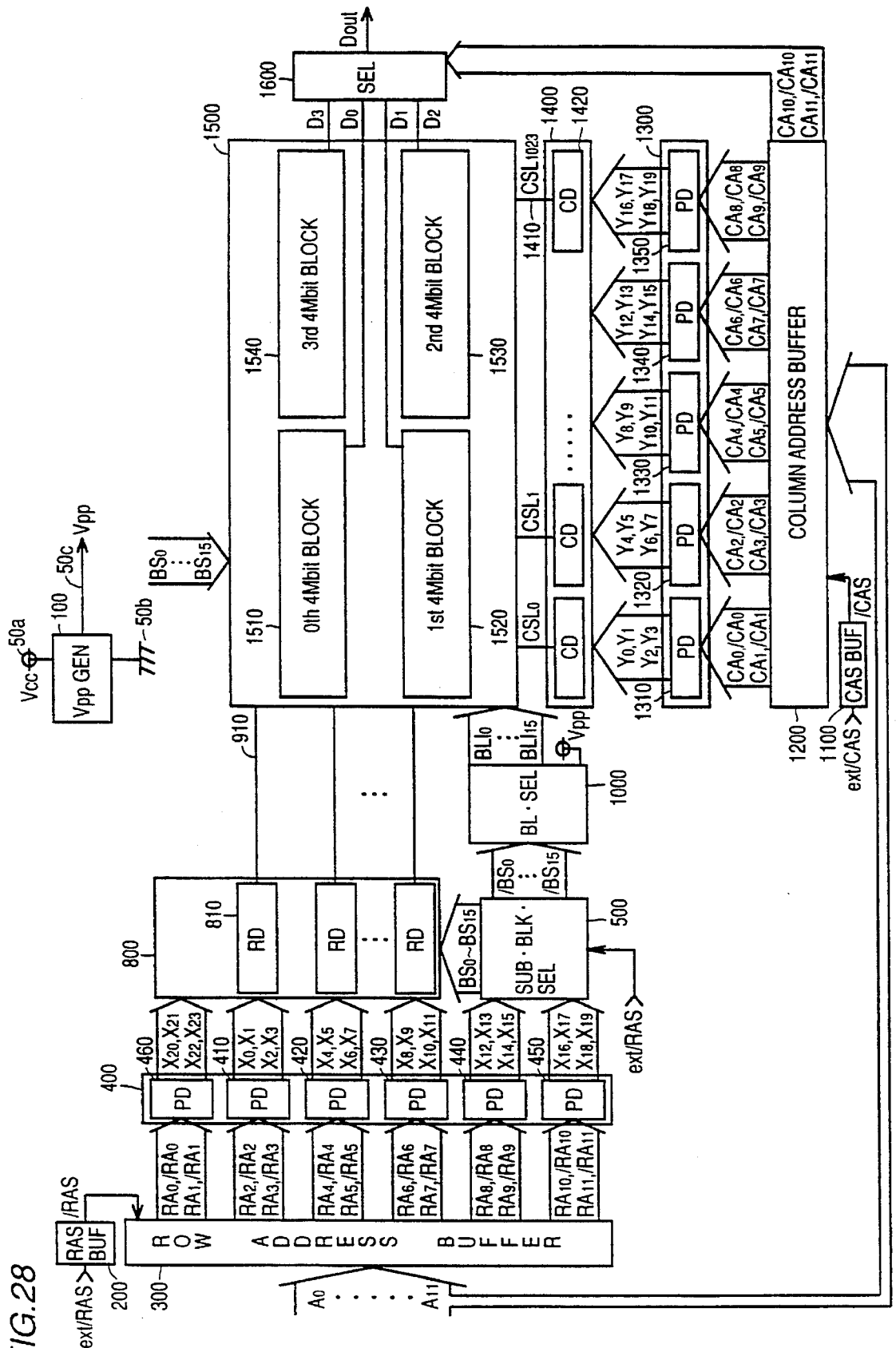
FIG. 28 is a block diagram showing Embodiment 8 of the present invention.
Figure 29:
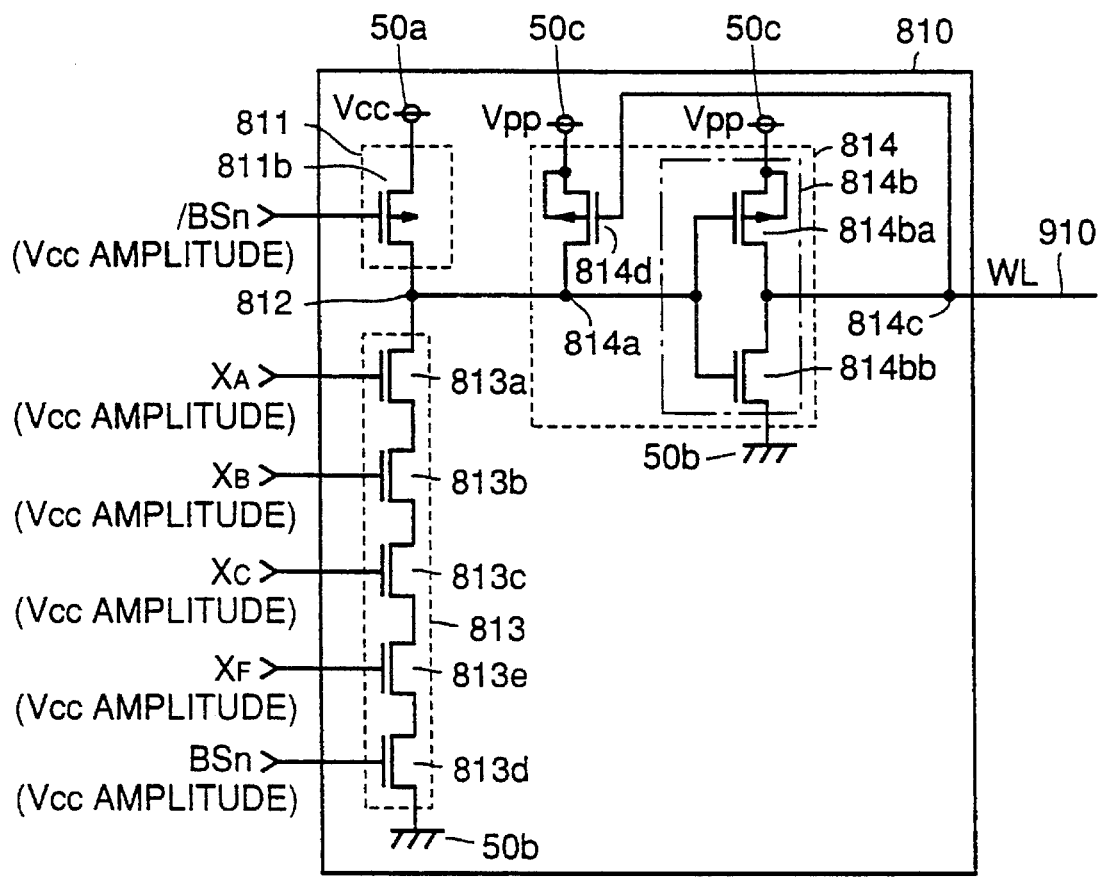
FIG. 29 is a schematic diagram of a row decoder of Embodiment 8 of the present invention.

Embodiment 8 of the present invention will be described with reference to FIGS. 28 and 29. FIG. 28 is a block diagram showing the DRAM of Embodiment 8. The DRAM shown in FIG. 28 differs from the DRAM of Embodiment 2 shown in FIG. 15 in that (a) word line drive signal generating circuit 700 and word driver group 900 are eliminated, (b) row predecoder 400 includes partial decoder 460 which receives row address signals $RA_0$, /$RA_0$, $RA_1$ and /$RA_1$ and provides row predecode signals $X_{20}$, $X_{21}$, $X_{22}$ and $X_{23}$ one of which attains to H level based on the received signals, and (c) row decoder 810 has different circuit structure (FIG. 29). The whole structure is similar to the DRAM of FIG. 26, and corresponding portions are denoted by the same reference characters.

FIG. 29 is a specific circuit diagram of row decoder 810 in the DRAM of Embodiment 8. Different from row decoder 810 of the DRAM of Embodiment 2 shown in FIG. 17, row decoder 810 in the DRAM of FIG. 29 receives one signal $X_F$ of row predecode signals $X_{20}$, $X_{21}$, $X_{22}$ and $X_{23}$ from partial decoder 460 in row predecoder 400. Row decoder 810 is newly provided with an n channel MOS transistor 813c connected between n channel MOS transistors 813c and 813d and receiving at its gate electrode the row predecode signal $X_F$. Further, word line 910 is directly connected to first output node 814c, and word driver 920 shown in FIG. 17 is eliminated.

In row decoder 810 of the DRAM of Embodiment 8, when row address strobe signal /RAS is at the standby state of H level, then sub block selecting signal /BSn attains to the supply potential, the signal BSn attains to the ground potential, the potentials at first node 812 and first input node 814a attain to the boosted potential Vpp and the potential WL of word line 910 connected to first output node 814c attains to the ground potential. When row address strobe signal /RAS is at the active state of L level, in the sub block selected based on the row address signals, sub block selecting signal /BSn attains to the ground potential and the signal BSn attains to the supply potential Vcc. Only in that row decoder 810 in which four row predecode signals $X_A$, $X_B$, $X_C$ and $X_F$ are all at the supply potential Vcc based on the row address signals, the potentials at first node 812 and first input node 814a attain to the ground potential and the potential WL of word line 910 connected to first output node 814c attains to the boosted potential Vpp.

In row decoder 810 in which at least one of four predecode signals $X_A$, $X_B$, $X_C$ and $X_F$ is at the L level in the selected sub block and in row decoder 810 in non-selected sub blocks, potentials at first node 812 and first input node 814a are held at the boosted potential Vpp and the potential WL of word line 910 is held at the ground potential.

After the selection of word line 910, the DRAM shown in FIG. 28 operates similarly as the DRAM of Embodiment 2.

The DRAM shown in FIGS. 28 and 29 provides similar advantages as the DRAM shown in FIGS. 26 and 27.

Embodiment 9

Embodiment 9 of the present invention will be described with reference to FIG. 30. The DRAM of Embodiment 9 differs from the DRAM of Embodiment 8 shown in FIG. 28 in the specific circuit structure (FIG. 30) of row decoder 810. The circuit different from Embodiment 8 will be described.

Figure 30:
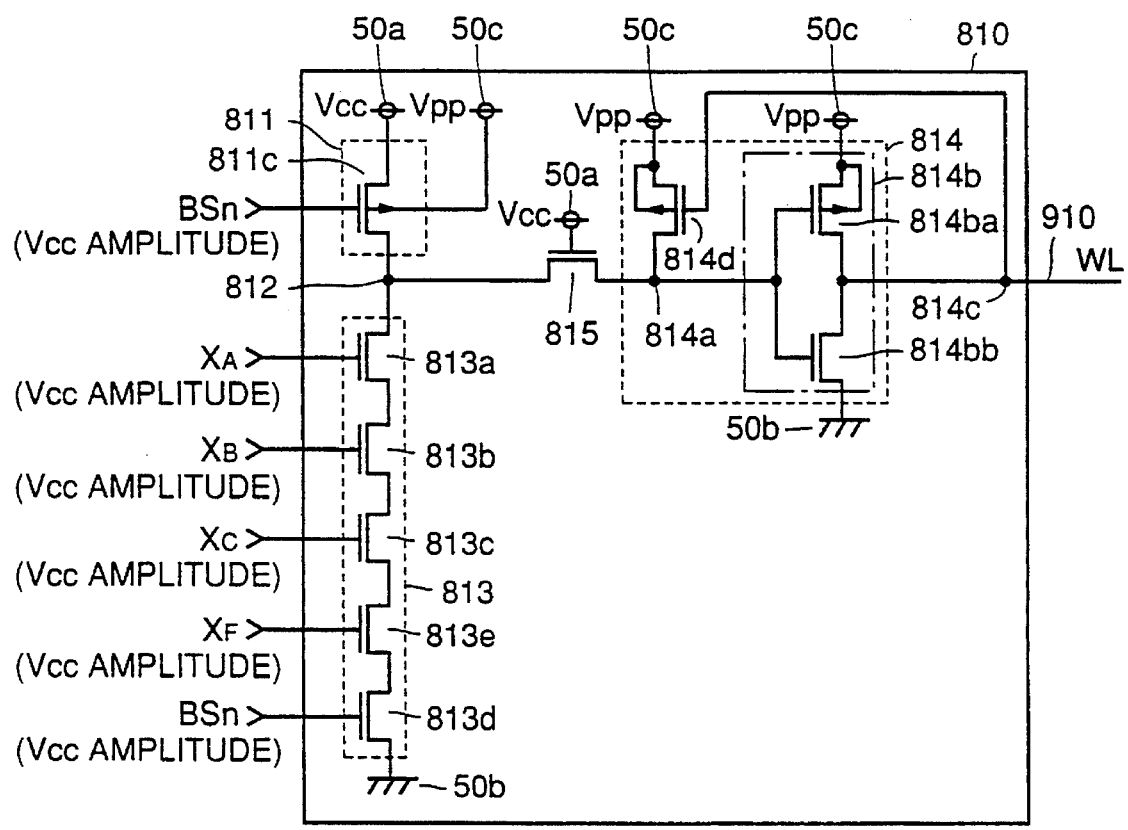
FIG. 30 is a schematic diagram of a row decoder in Embodiment 9 of the present invention.

FIG. 30 is a specific circuit diagram of row decoder 810. As in row decoder 810 of Embodiment 8 shown in FIG. 29, in the circuit 810 of FIG. 30, pull up circuit 811 of row decoder 810 is connected not between boosted potential node 50c and first node 812 but between supply potential node 50a and first node 812. However, pull up circuit 811 includes a p channel MOS transistor 811c connected between supply potential node 50a and first node 812 and receiving at its gate electrode the sub block selecting signal BSn from sub block selecting signal generating circuit 500 as reset signal and further receives the boosted potential Vpp as the backgate potential. Further, an n channel MOS transistor 815 having its gate connected to supply potential node 50a is provided between first node 812 and first input node 814a of output holding circuit 814.

In row decoder 810 of the DRAM of Embodiment 9, when row address strobe signal /RAS is at the standby state of H level, sub block selecting signal BSn attains to the ground potential, the potential at first node 812 attains to the supply potential Vcc, the potential at first input node 814a attains to the boosted potential Vpp and the potential WL of word line 910 connected to first output node 814c attains to the ground potential. When row address strobe signal /RAS is at the active state of L level, in the sub block selected based on the row address signals, sub block selecting signal BSn attains to the supply potential Vcc.

Further, in the selected sub block, only in that row decoder 810 in which four row predecode signals $X_A$, $X_B$, $X_C$ and $X_F$ are all set to the supply potential Vcc based on the row address signals, the potentials at first node 812 and first input node 814a attain to the ground potential and the potential WL of word line 910 connected to first output node 814c attains to the boosted potential Vpp.

In row decoders 810 in which at least one of four row predecode signals $X_A$, $X_B$, $X_C$ and $X_F$ is at the L level in the selected sub block and in row decoders 810 of the non-selected sub blocks, the potential at first node 812 is held at the supply potential Vcc, the potential at the first input node 814a is held at the boosted potential Vpp and the potential of word line 910 is held at the ground potential.

After the selection of word line 910, the DRAM of Embodiment 9 structured as described above operates similarly as the DRAM of Embodiment 3.

Embodiment 9 shown in FIG. 30 provides similar effects as the DRAM shown in FIGS. 28 and 29.

Embodiment 10

Embodiment 10 of the present invention will be described with reference to FIG. 31. The DRAM of Embodiment 10 differs from the DRAM of Embodiment 8 shown in FIG. 29 in the specific circuit structure (FIG. 31) of row decoder 810. The circuit different from Embodiment 8 will be described.

Figure 31:
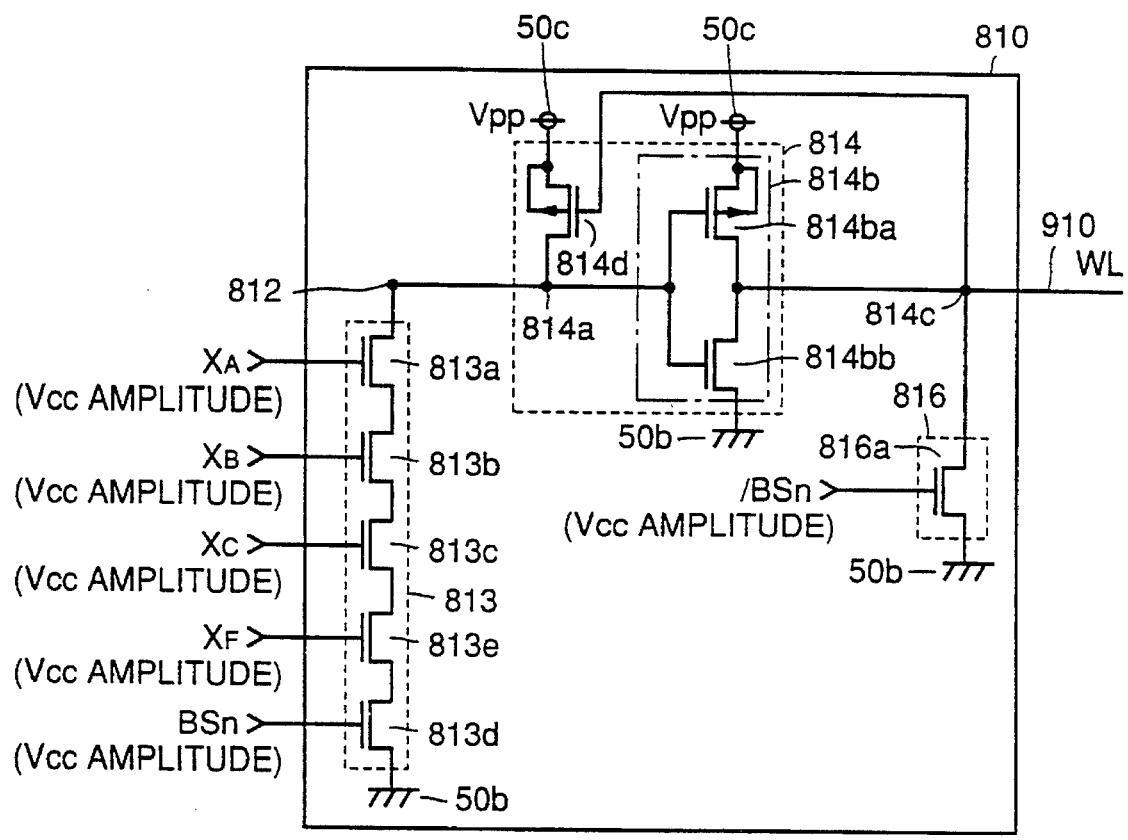
FIG. 31 is a schematic diagram of a row decoder in Embodiment 10 of the present invention.

FIG. 31 is a specific diagram of row decoder 810. The circuit of FIG. 31 differs from row decoder 810 of Embodiment 8 shown in FIG. 29 in that (a) pull up circuit 811 of row decoder 810 is eliminated, and that (6) a second pull down circuit 816 is additionally included which is connected between first output node 814c and ground potential node 50b, receives the sub block selecting signal BSn and connects the first output node 814c to the ground potential node 50b when the sub block selecting signal /BSn attains to the H level.

Further, second pull down circuit 816 includes an n channel MOS transistor 816a connected between first output node 814c and ground potential node 50b and receiving at its gate electrode sub block selecting signal /BSn.

In row decoder 810 of the DRAM of Embodiment 10, when row address strobe signal /RAS is at the standby state of H level, sub block selecting signal BSn attains to the ground potential, the signal /BSn attains to the supply potential Vcc, potentials at first node 812 and first input node 814a attain to the boosted potential Vpp and the potential WL of word line 910 connected to first output node 814c attains to the ground potential.

When row address strobe signal /RAS is at the active state of L level, in the sub block selected based on the row address signals, sub block selecting signal /BSn attains to the ground potential and the signal BSn attains to the supply potential Vcc. In the selected sub block, only in that row decoder 810 in which four row predecode signals $X_A$, $X_B$, $X_C$ and $X_F$ are all at the supply potential Vcc based on the row address signals, potentials at first node 812 and first input node 814a attain to the ground potential, and the potential WL of word line 910 connected to first output node 814c attains to the boosted potential Vpp.

In row decoders 810 in which at least one of four row predecode signals $X_A$, $X_B$, $X_C$ and $X_F$ is at the L level in the selected sub block and in row decoders 810 of the non-selected sub blocks, the potentials of first node 812 and first input node 814a are held at the boosted potential Vpp and the potential WL of word line 910 is held at the ground potential.

After the selection of word line 910, the DRAM of Embodiment 10 structured as described above operates similarly as the DRAM of Embodiment 4 shown in FIGS. 21 and 22. This embodiment also provides similar effects as Embodiment 8.

Embodiment 11

Embodiment 11 of the present invention will be described with reference to FIG. 32. The DRAM of Embodiment 11 shown in FIG. 32 differs from the DRAM of Embodiment 10 shown in FIG. 31 in the specific circuit structure (FIG. 32) of row decoder 810. The circuit different from Embodiment 10 will be described.

Figure 32:
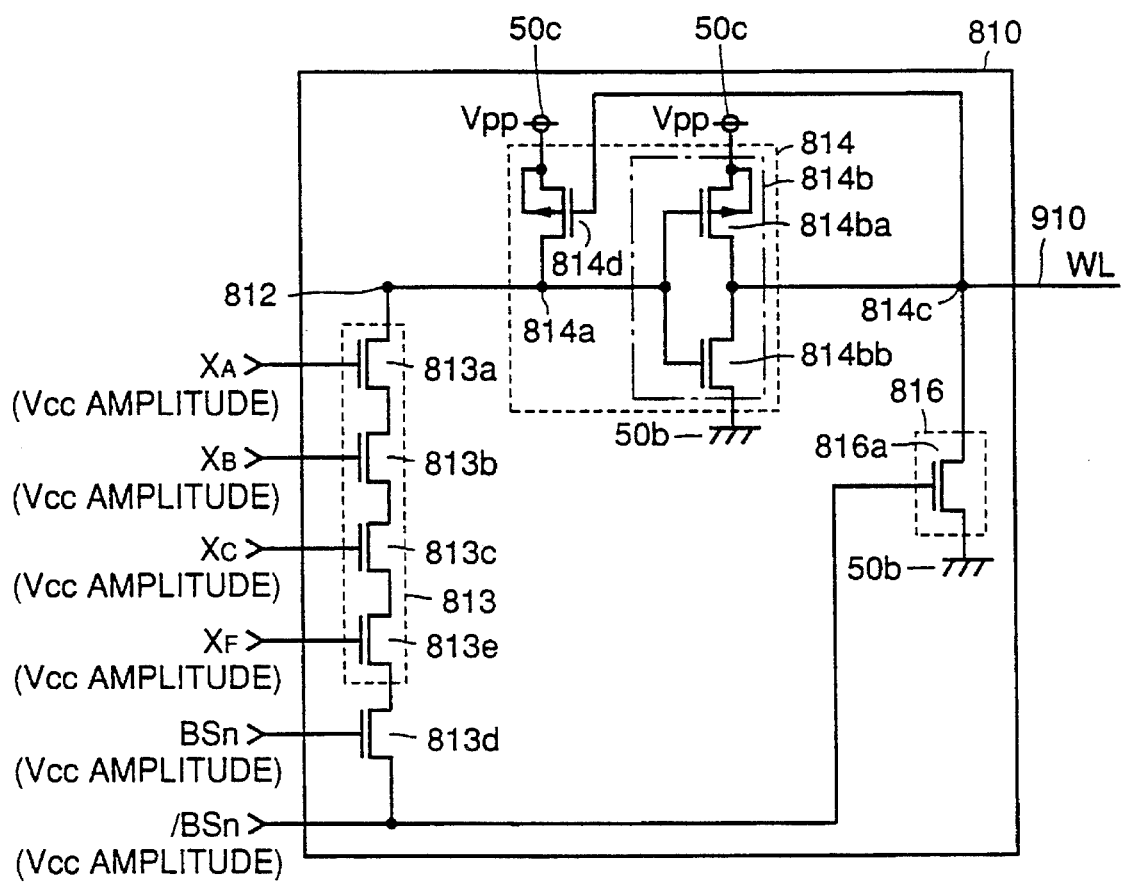
FIG. 32 is a schematic diagram of a row decoder in Embodiment 11 of the present invention.
Figure 33:
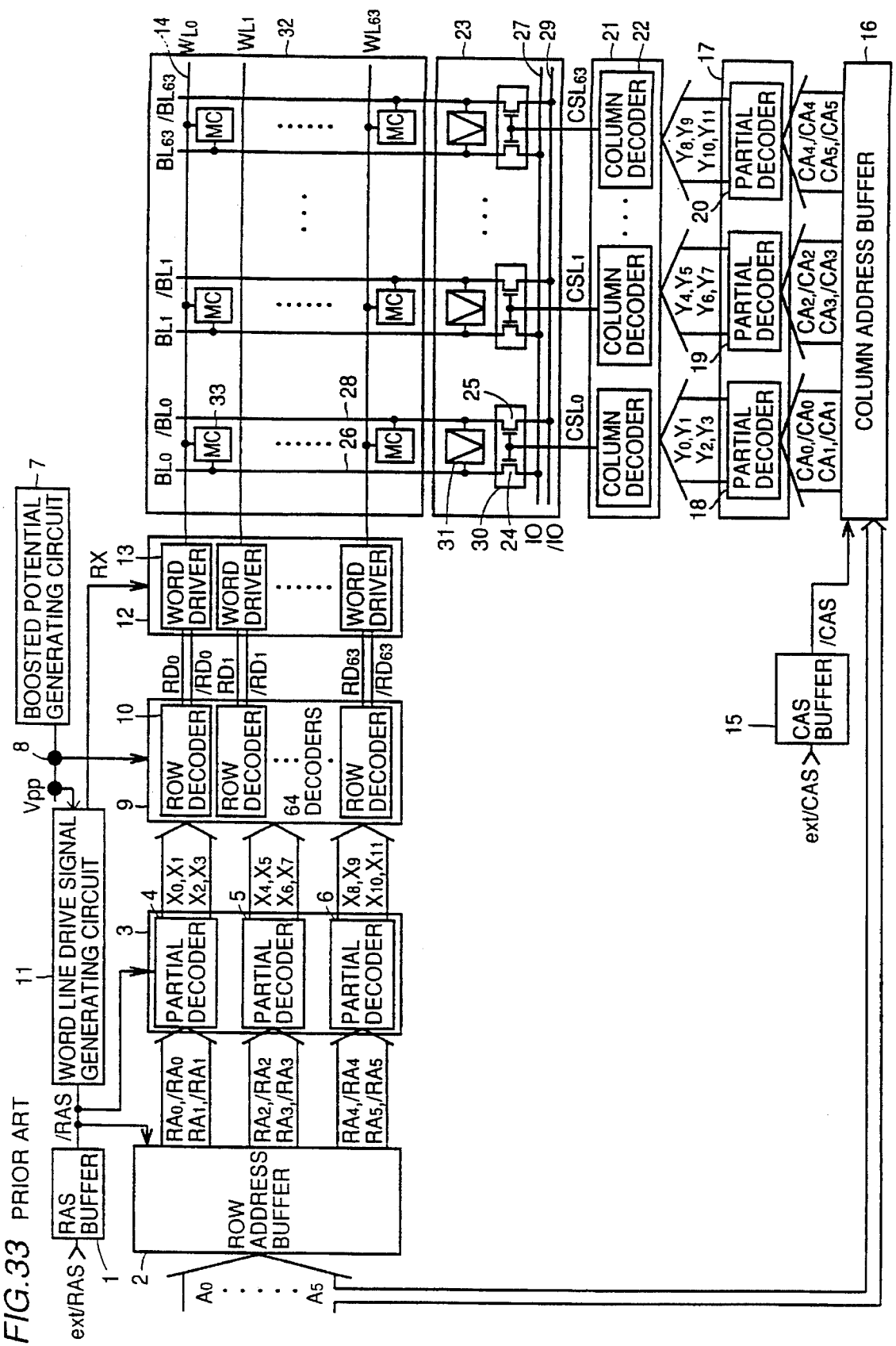
FIG. 33 is a block diagram of a conventional DRAM.
Figure 34:
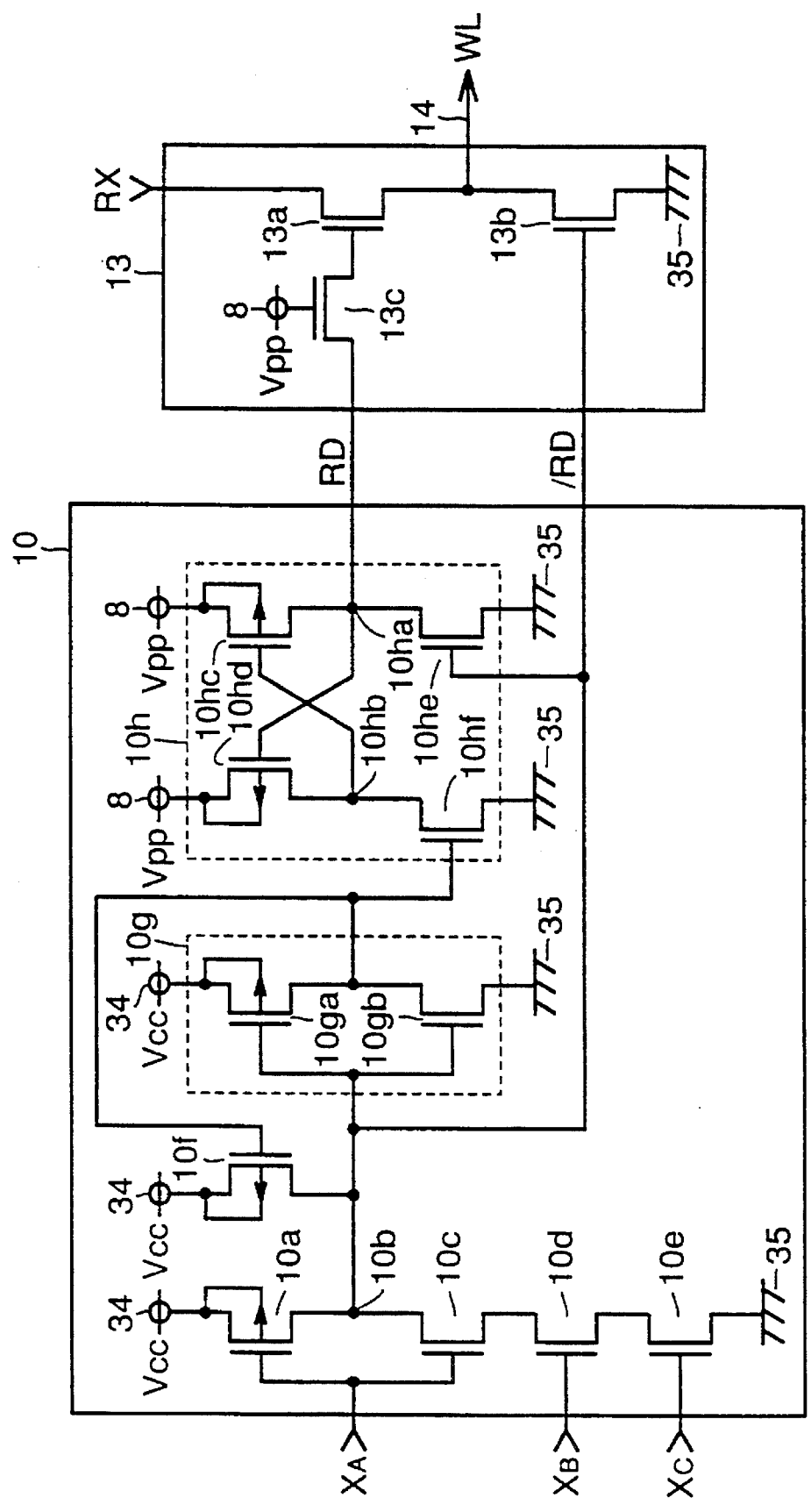
FIG. 34 is a schematic diagram of a row decoder in the conventional DRAM.
Figure 35:
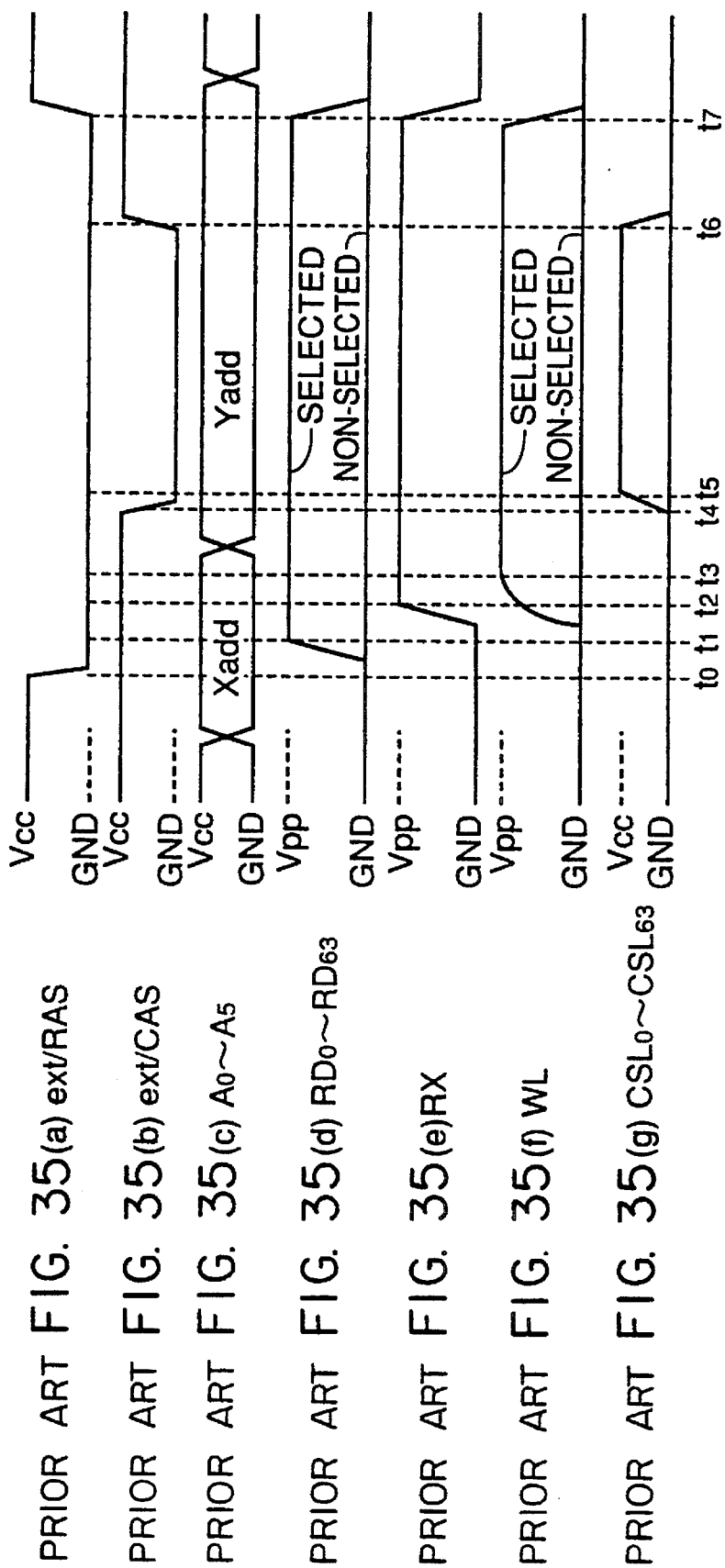
FIGS. 35($a$) to 35($g$) are timing charts showing the operation of the conventional DRAM.

FIG. 32 is a specific circuit diagram of row decoder 810. The circuit of FIG. 32 differs from row decoder 810 of Embodiment 10 shown in FIG. 31 in that the source electrode of n channel MOS transistor 813d in pull down circuit 813 of row decoder is not directly connected to the ground potential node 50b but receives the sub block selecting signal /BSn.

More specifically, the source electrode of transistor 813d is connected to the ground potential node 50b through n channel MOS transistor 520i of the inverter in sub block selecting signal generating circuit 500 shown in FIG. 16 which provides the sub block selecting signal /BSn. Though the structure is slightly different, row decoder 810 of Embodiment 11 operates similarly as row decoder 810 of Embodiment 10.

The DRAM of Embodiment 11 structured as described above operates similar as that of Embodiment 10.

The DRAM provides similar effects as the DRAM shown in Embodiment 10.

As described above, in accordance with the present invention, a DRAM can be obtained which occupies small area, consumes less power and operates at higher speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

pull up means connected between a prescribed potential node to which a prescribed potential is applied and a first node, receiving a pull up control signal, and coupling, in response to the pull up control signal, said prescribed potential node to the first node;

pull down means connected between said first node and a ground potential node to which a ground potential is applied, receiving an input signal having one of binary levels of a power supply potential and said ground potential, and coupling, in response to the input signal, said first node to said ground potential node; and signal generating means operating with a first potential higher than said power supply potential and including inverter means having an input connected to a first input node which is connected to a first node and an output connected to a first output node, and output holding means including a p channel MOS transistor connected between a first potential node to which said first potential is applied and said first input node and having a gate electrode connected to said first output node;

wherein the prescribed potential is the power supply potential, the pull up control signal has one of binary levels of the power supply potential and the ground potential, and the pull up means has a pull up n channel MOS transistor connected between the prescribed potential node and the first node and receiving at a gate electrode thereof said pull up control signal.

2. A semiconductor device comprising:

pull up means connected between a prescribed potential node to which a prescribed potential is applied and a first node, receiving a pull up control signal, and coupling, in response to the pull up control signal, said prescribed potential node to the first node;.

pull down means connected between said first node and a ground potential node to which a ground potential is applied, receiving an input signal having one of binary levels of a power supply potential and said ground potential, and coupling, in response to the input signal, said first node to said ground potential node; and signal generating means operating with a first potential higher than said power supply potential and including inverter means having an input connected to a first input node which is connected to said first node and an output connected to a first output node, and output holding means including a p channel MOS transistor connected between a first potential node to which said first potential is applied and said first input node and having a gate electrode connected to said first output node; wherein the prescribed potential is the power supply potential, the pull up control signal has one of binary levels of the power supply potential and the ground potential, the pull up means includes a pull up p channel MOS transistor connected between the prescribed potential node and the first node and receiving at a gate electrode thereof said pull up control signal, and said input node is connected to said first node through an n channel MOS transistor connected between said first node and said first input node with a gate electrode thereof connected to said prescribed potential node.

3. A semiconductor device comprising:

pull up means connected between a prescribed potential node to which a prescribed potential is applied and a first node, receiving a pull up control signal, and coupling, in response to the pull up control signal, said prescribed potential node to the first node;

pull down means connected between said first node and a ground potential node to which a ground potential is applied, receiving an input signal having one of binary levels of a power supply potential and said ground potential, and coupling, in response to the input signal, said first node to said ground potential node; and signal generating means operating with a first potential higher than said power supply potential and including inverter means having an input connected to a first input node which is connected to said first node and an output connected to a first output node, and output holding means including a p channel MOS transistor connected between a first potential node to which said first potential is applied and said first input node and having a gate electrode connected to said first output node; said semiconductor device further comprising:

a plurality of memory cells arranged in rows and columns, a plurality of word lines provided corresponding to the rows and connecting memory cells on corresponding rows;

means for generating said input signal in response to a row address signal designating a row in said rows; and a plurality of word driver means provided for the plurality of word lines;

a word driver means of said plurality of word driver means including;

a first word line driving n channel MOS transistor having a source electrode connected to a word line and a drain electrode receiving a word line drive signal having one of binary levels of the first potential and the ground potential;

a second word line driving n channel MOS transistor connected between said word line and the ground potential node with a gate thereof connected to the first input node; and a third word line driving n channel MOS transistor connected between the first output node and the gate electrode of said first word line driving n channel MOS transistor, with a gate thereof connected to the first potential node.

4. A semiconductor device comprising:

pull up means connected between a prescribed potential node to which a prescribed potential is applied and a first node, receiving a pull up control signal, and coupling, in response to the pull up control signal, said prescribed potential node to the first node;

pull down means connected between said first node and a ground potential node to which a ground potential is applied, receiving an input signal having one of binary levels of a power supply potential and said ground potential, and coupling, in response to the input signal, said first node to said ground potential node; and signal generating means operating with a first potential higher than said power supply potential and including inverter means having an input connected to a first input node which is connected to said first node and an output connected to a first output node, and output holding means including a p channel MOS transistor connected between a first potential node to which said first potential is applied and said first input node to which said first potential is applied and said first input node and having a gate electrode connected to said first output node, said semiconductor device further comprising:

a plurality of memory cells arranged in rows and columns, a plurality of word lines provided corresponding to the rows and connecting memory cells on corresponding rows;

means for generating said input signal in response to a row address signal designating a row in said rows; and a plurality of word driver means provided for the plurality of word lines;

a word driver means of said plurality of word driver means including;

a first word line driving n channel MOS transistor having a source electrode connected to a word line and receiving at a drain electrode thereof a word line drive signal having one of binary levels of the first potential and the ground potential;

a second word line driving n channel MOS transistor connected between said word line and the ground potential node;

a third word line n channel MOS transistor connected between the first output node and the gate electrode of said first word line driving n channel MOS transistor, with a gate electrode thereof connected to the first potential node; and inverter means having an input connected to said first output node and an output connected to the gate electrode of said second word line driving n channel MOS transistor.

5. The semiconductor device according to claim 1, further comprising:

a plurality of memory cells arranged in rows and columns, a plurality of word lines provided corresponding to the rows and connecting memory cells on corresponding rows;

means for generating said input signal in response to a row address signal designating a row in said rows;

a word line of said plurality of word line being connected to the first output node.

6. A semiconductor device comprising:

pull up means connected between a prescribed potential node to which a prescribed potential is applied and a first node, receiving a pull up control signal, and coupling, in response to the pull up control signal, said prescribed potential node to the first node;

pull down means connected between said first node and a ground potential node to which a ground potential is applied, receiving an input signal having one of binary levels of a power supply potential and said ground potential, and coupling, in response to the input signal, said first node to said ground potential node; and signal generating means operating with a first potential higher than said power supply potential and including inverter means having an input connected to a first input node which is connected to said first node and an output connected to a first output node, and output holding means including a p channel MOS transistor connected between a first potential node to which said first potential is applied and said first input node and having a gate electrode connected to said first output node, said semiconductor device further comprising:

a plurality of memory cells arranged in rows and columns, a plurality of pairs of bit lines provided corresponding to the columns and each of the plurality of pairs of bit lines connecting memory cells on a corresponding column, a pair of bit lines of first and second bit lines in said plurality of pairs of bit lines being provided with, (a) sense amplifier means connected between a first amplification node and a second amplification node, for detecting and amplifying potential difference between the first and the second amplification nodes for setting one of the first and second amplification nodes to the supply potential and the other to the ground potential, and (b) bit line gate means having a first bit line selecting n channel MOS transistor connected between the first bit line and said first amplification node with a gate thereof coupled to the output of said inverter means operating with the first potential, and a second bit line selecting n channel MOS transistor connected between the second bit line and said second amplification node, and having a gate electrode thereof coupled to the output of said inverter means.

7. A semiconductor device, comprising:

signal generating means including, a first n channel MOS transistor connected between a supply potential node to which a supply potential is applied and a first node, and receiving at a gate electrode thereof a control signal changing between binary levels of said supply potential and a ground potential;

a second n channel MOS transistor connected between said first node and a ground potential node to which said ground potential is applied and receiving at a gate electrode thereof an input signal changing between binary levels of said supply potential and said ground potential;

a p channel MOS transistor connected between a first potential node to which a first potential higher than said supply potential is applied and said first node, with a gate electrode thereof connected to a first output node; and an inverter including a p channel MOS transistor connected between said first potential node and said first output node with a gate electrode directly connected to said first node, and an n channel MOS transistor thereof connected between said first output node and said ground potential node, with a gate electrode thereof directly connected to said first node.

8. A semiconductor memory device comprising signal generating means including, first pull down means connected between a first node and a second node coupled to a ground potential node to which a ground potential is applied, receiving an input signal changing between binary levels of a supply potential and said ground potential, and coupling, in response to the input signal, said first node to said ground potential node;

output holding means operating with a first potential higher than said supply potential and including inverter means having an input connected to a first input node which is connected to said first node and an output connected to a first output node and a p channel MOS transistor connected between a first potential node to which said first potential is applied and said first input node with a gate electrode thereof connected to said first output node; and second pull down means connected between said first output node and said ground potential node, receiving a first control signal having no relation in logic to said input signal and connecting, in response to the first control signal, said first output node to said ground potential node.

9. The semiconductor device according to claim 8, wherein the second pull down means includes a pull down n channel MOS transistor connected between the first output node and the ground potential node and receiving at a gate electrode thereof the first control signal.

10. The semiconductor device according to claim 9, wherein the second node is connected to said ground potential node through an n channel MOS transistor connected between the second node and the ground potential node and receiving at a gate electrode thereof a second control signal;

the signal generating means further includes a p channel MOS transistor connected between the supply potential node and said second node, and receiving at a gate electrode thereof said second control signal; and the pull down n channel MOS transistor has the gate electrode connected to said second node and receives from the second node the first control signal.

11. A semiconductor device comprising:

signal generating means including:

a first p channel MOS transistor connected between a first potential node to which a first potential higher than a supply potential is applied and a first node, and receiving at a gate electrode thereof a control signal changing between binary levels of said first potential and a ground potential;

an n channel MOS transistor connected between said first node and a ground potential node to which said ground potential is applied, and receiving at a gate electrode thereof an input signal changing between binary levels of said supply potential and said ground potential;

a second p channel MOS transistor connected between said first potential node and the first node with a gate electrode thereof connected to a first output node; and an inverter including a p channel MOS transistor connected between said first potential node and said first output node with a gate electrode thereof connected to said first node, and an n channel MOS transistor connected between said first output node and said ground potential node with a gate electrode thereof connected to said first node; said semiconductor device further comprising:

a plurality of memory cells arranged in rows and columns, a plurality of word lines provided corresponding to the rows and connecting memory cells on corresponding rows;

means for generating said input signal in response to a row address signal designating a row in said rows; and a plurality of word driver means provided for the plurality of word lines;

a word driver means of said plurality of word driver means including;

a first word line driving n channel MOS transistor having a source electrode connected to a word line and a drain electrode receiving a word line drive signal having one of binary levels of the first potential and the ground potential;

a second word line driving n channel MOS transistor connected between said word line and the ground potential node with a gate thereof connected to the first input node; and a third word line driving n channel MOS transistor connected between the first output node and the gate electrode of said first word line driving n channel MOS transistor, with a thereof connected to the first potential node.

12. A semiconductor device comprising:

signal generating means including:

a first p channel MOS transistor connected between a first potential node to which a first potential higher than a supply potential is applied and a first node, and receiving at a gate electrode thereof a control signal changing between binary levels of said first potential and a ground potential;

an n channel MOS transistor connected between said first node and a ground potential node to which said ground potential is applied, and receiving at a gate electrode thereof an input signal changing between binary levels of said supply potential and said ground potential;

a second p channel MOS transistor connected between said first potential node and the first node with a gate electrode thereof connected to a first output node; and an inverter including a p channel MOS transistor connected between said first potential node and said first output node with a gate electrode thereof connected to said first node, and an n channel MOS transistor connected between said first output node and said ground potential node with a gate electrode thereof connected to said first node; said semiconductor device further comprising:

a plurality of memory cells arranged in rows and columns, a plurality of word lines provided corresponding to the rows and connecting memory cells on corresponding rows;

means for generating said input signal in response to a row address signal designating a row in said rows; and a plurality of word driver means provided for the plurality of word lines;

a word driver means of said plurality of word driver means including;

a first word line driving n channel MOS transistor having a source electrode connected to a word line and receiving at a drain electrode thereof a word line drive signal having one of binary levels of the first potential and the ground potential;

a second word line driving n channel MOS transistor connected between said word line and the ground potential node;

a third word line n channel MOS transistor connected between the first output node and the gate electrode of said first word line driving n channel MOS transistor, with a gate electrode thereof connected to the first potential node; and inverter means operating with the supply potential and having an input connected to said first output node and an output connected to the gate electrode of said second word line driving n channel MOS transistor.

13. A semiconductor device comprising:

signal generating means including:

a first p channel MOS transistor connected between a first potential node to which a first potential higher than a supply potential is applied and a first node, and receiving at a gate electrode thereof a control signal changing between binary levels of said first potential and a ground potential;

an n channel MOS transistor connected between said first node and a ground potential node to which said ground potential is applied, and receiving at a gate electrode thereof an input signal changing between binary levels of said supply potential and said ground potential;

a second p channel MOS transistor connected between said first potential node and the first node with a gate electrode thereof connected to a first output node; and an inverter including a p channel MOS transistor connected between said first potential node and said first output node with a gate electrode thereof connected to said first node, and an n channel MOS transistor connected between said first output node and said ground potential node with a gate electrode thereof connected to said first node; said semiconductor device further comprising:

a plurality of memory cells arranged in rows and columns, a plurality of pairs of bit lines provided corresponding to the columns and each of the plurality pairs of bit lines connecting memory cells on a corresponding column, a pair of bit lines of first and second bit lines in said plurality of pairs of bit lines being provided with, (a) sense amplifier means connected between a first amplification node and a second amplification node, for detecting and amplifying potential difference between the first and the second amplification nodes, for setting one of the first and the second amplification nodes to the supply potential and the other to the ground potential, and (b) bit line gate means having a first bit line selecting n channel MOS transistor connected between the first bit line and said first amplification node with a gate thereof connected to the output of said inverter means operating with the first potential, and a second bit line selecting n channel MOS transistor connected between the second bit line and said second amplification node, and having a gate electrode thereof connected to the output of said inverter means.

14. A semiconductor device, comprising:

reset signal generating means which includes signal level converting means for converting a signal changing between binary levels of a supply potential and a ground potential to a signal changing between binary levels of a first potential higher than the supply potential and the ground potential, and provides a decoder reset signal having binary levels of the ground potential and the first potential in accordance with a row address strobe signal changing between binary levels of the supply potential and the ground potential; and a plurality of decoders, each including a first p channel MOS transistor connected between a first potential node to which said first potential is applied and a first node, and receiving at a gate electrode thereof said decoder reset signal, a plurality of n channel MOS transistors connected in series between said first node and the ground potential node and each receiving at a gate electrode thereof an input signal which attains an H level or an L level between the ground potential and the supply potential based on an address signal, a second p channel MOS transistor connected between said first potential node and said first node with a gate electrode thereof connected to the first output node, a p channel inverter MOS transistor connected between said first potential node and said first output node with a gate electrode thereof connected to said first node, an n channel inverter MOS transistor connected between said first output node and said ground potential node with its gate electrode connected to said first node.

15. The semiconductor device according to claim 14, further comprising:

a plurality of word lines; and a plurality of word driver means, each including a first word line driving n channel MOS transistor provided corresponding to each said word line, having a source electrode connected to a corresponding word line and a drain electrode receiving a word line drive signal changing between binary levels of the first potential and the ground potential, a second word line driving n channel MOS transistor connected between said corresponding word line and the ground potential node with a gate electrode thereof connected to the first input node, and a third word line driving n channel MOS transistor connected between the first output node of the corresponding decoder and the gate electrode of said first word line driving n channel MOS transistor with a gate electrode thereof connected to the first potential node.

16. The semiconductor device according to claim 14, comprising:

a plurality of word lines; and a plurality of word driver means each including,
  a first word line driving n channel MOS transistor provided corresponding to each said word line and having a source electrode connected to a corresponding word line and a drain electrode receiving a word line drive signal changing between binary levels of the first potential and the ground potential,
  a second word line driving n channel MOS transistor connected between said corresponding word line and the ground potential node,
  a third word line driving n channel MOS transistor connected between the first output node of the corresponding decoder and the gate electrode of said first word line driving n channel MOS transistor with a gate electrode thereof connected to the first potential node, and
  inverter means having an input connected to said first output node of the corresponding decoder and an output connected to the gate electrode of said second word line driving n channel MOS transistor.

17. The semiconductor device according to claim 14, wherein a word line is connected to the first output node in each decoder.

18. The semiconductor device according to claim 14, further comprising:

a plurality of sense amplifier means each having a first amplification node and a second amplification node, connected between the first and the second amplification nodes for detecting and amplifying potential difference between the first and second amplification nodes and setting one of the first and the second amplification nodes to the supply potential and the other to the ground potential;

a first plurality of pairs of bit lines, a second plurality of pairs of bit lines, a plurality of first bit line gate means provided corresponding to said sense amplifier means and to said first plurality of pairs of bit lines, each including (a) a first bit line selecting n channel MOS transistor connected between a first bit line of a corresponding pair of bit lines and the first amplification node of the corresponding sense amplifier means with a gate electrode thereof connected to the first output node of the corresponding decoder, and (b) a second bit line selecting n channel MOS transistor connected between a second bit line which constitutes a pair with said first bit line, and the second amplification node of the corresponding sense amplifier means with a gate electrode thereof connected to the first output node, and a plurality of second bit line gate means provided corresponding to said sense amplifier means and said second plurality of pairs of bit lines, each including (a) a third bit line selecting n channel MOS transistor connected between a third bit line of a corresponding pair of bit lines and the first amplification node of the corresponding sense amplifier means with a gate electrode thereof connected to the first output node of another corresponding decoder, and (b) a fourth bit line selecting n channel MOS transistor connected between a fourth bit line, which constitutes a pair with said third bit line, and the second amplification node of the corresponding sense amplifier means, with a gate thereof connected to the first output node of said another corresponding decoder, said plurality of decoders provided corresponding to said first and second bit line gate means.

19. A semiconductor device, comprising:

reset signal generating means including
  (i) signal level converting means for converting a signal changing between binary levels of a supply potential and a ground potential to a signal changing between binary levels of a first potential higher than the supply potential and the ground potential,
  (ii) master reset signal generating means for providing a master reset signal changing between binary levels of the first potential and the ground potential in accordance with a row address strobe signal changing between binary levels of the supply potential and the ground potential, and
  a plurality of local reset signal generating means provided corresponding to said master reset signal generating means, each receiving a predecode signal which attains to an H level or a L level between the supply potential and the ground potential in accordance with an address signal, and receiving said master reset signal, and providing a local reset signal which changes between said first potential and said ground potential based on the predecode signal and the master reset signal; and a plurality of decoders provided corresponding to said plurality of local reset signal generating means, each including
  (i) a first p channel MOS transistor connected between a first potential node to which said first potential is applied and a first node, and receiving at a gate electrode thereof a corresponding local reset signal,
  (ii) an n channel MOS transistor connected between said first node and the ground potential node and receiving at a gate electrode thereof an input signal changing between binary levels of the supply potential and the ground potential in accordance with an address signal,
  (iii) a second p channel MOS transistor connected between said first potential node and said first node with a gate electrode thereof connected to a first output node,
  (iv) a p channel MOS transistor connected between said first potential node and said first output node with a gate electrode thereof connected to said first node, and
  (v) an n channel MOS transistor connected between said first output node and said ground potential node with a gate thereof connected to said first node.

20. The semiconductor device according to claim 2, further comprising:

a plurality of memory cells arranged in rows and columns, a plurality of word lines provided corresponding to the rows and connecting memory cells on corresponding rows;

means for generating said input signal in response to a row address signal designating a row in said rows;

a word line of said plurality of word line being connected to the first output node.

* * * * *